(12) United States Patent
Kamimura et al.

(10) Patent No.: US 11,833,475 B2
(45) Date of Patent: Dec. 5, 2023

(54) FILTERING DEVICE, PURIFICATION DEVICE, AND METHOD FOR MANUFACTURING CHEMICAL LIQUID

(71) Applicant: FUJIFILM Corporation, Tokyo (JP)

(72) Inventors: Tetsuya Kamimura, Shizuoka (JP); Satomi Takahashi, Shizuoka (JP); Tadashi Omatsu, Shizuoka (JP); Tetsuya Shimizu, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 48 days.

(21) Appl. No.: 16/991,158

(22) Filed: Aug. 12, 2020

(65) Prior Publication Data

US 2020/0368691 A1      Nov. 26, 2020

Related U.S. Application Data

(63) Continuation of application No. PCT/JP2019/008146, filed on Mar. 1, 2019.

(30) Foreign Application Priority Data

Mar. 22, 2018   (JP) ................................ 2018-055045
Aug. 16, 2018   (JP) ................................ 2018-153253

(51) Int. Cl.
   *B01D 61/58*      (2006.01)
   *B01D 69/02*      (2006.01)
   (Continued)

(52) U.S. Cl.
   CPC ............. *B01D 61/58* (2013.01); *B01D 3/145* (2013.01); *B01D 65/02* (2013.01); *B01D 69/02* (2013.01);
   (Continued)

(58) Field of Classification Search
   CPC .... B01D 61/145; B01D 61/147; B01D 61/58; B01D 65/02; B01D 71/36; B01D 2311/2623; G03F 7/26
   See application file for complete search history.

(56) References Cited

U.S. PATENT DOCUMENTS 4,788,043 A * 11/1988 Kagiyama ................ B01D 3/36
                                                  422/292
5,242,468 A *  9/1993 Clark ................. H01L 21/67023
                                                   95/12
(Continued)

FOREIGN PATENT DOCUMENTS

CN         1726435 A        1/2006
CN       101247880 A        8/2008
(Continued)

OTHER PUBLICATIONS

Ogiwara, Tsutomu et al.—JP 2016-037922 Machine Translation—May 12, 2016 (Year: 2016).*

(Continued)

*Primary Examiner* — Bradley R Spies
(74) *Attorney, Agent, or Firm* — Sughrue Mion, PLLC

(57) ABSTRACT

A filtering device is used for obtaining a chemical liquid by purifying a liquid to be purified and includes an inlet portion, an outlet portion, a filter A, at least one filter B different from the filter A, and a flow path that includes the filter A and the filter B arranged in series and extends from the inlet portion to the outlet portion. The filter A has a porous membrane made of ultra-high-molecular-weight polyethylene and a resin layer disposed to cover at least a portion of the surface of the porous membrane, and the resin layer includes a resin having a neutral group or an ion exchange group.

19 Claims, 22 Drawing Sheets

(51) Int. Cl.

| | | |
|---|---|---|
| *B01D 71/26* | (2006.01) | |
| *B01D 71/56* | (2006.01) | |
| *B01D 71/68* | (2006.01) | |
| *B01D 3/14* | (2006.01) | |
| *B01D 65/02* | (2006.01) | |
| *B01D 71/28* | (2006.01) | |
| *B01D 71/32* | (2006.01) | |
| *H01L 21/67* | (2006.01) | |

(52) U.S. Cl.
CPC ............ *B01D 71/26* (2013.01); *B01D 71/28* (2013.01); *B01D 71/32* (2013.01); *B01D 71/56* (2013.01); *B01D 71/68* (2013.01); *H01L 21/67017* (2013.01); *B01D 2311/25* (2013.01); *B01D 2311/2623* (2013.01); *B01D 2311/2669* (2013.01); *B01D 2317/02* (2013.01); *B01D 2325/022* (2013.01); *B01D 2325/42* (2013.01)

(56) References Cited

U.S. PATENT DOCUMENTS

| | | | |
|---|---|---|---|
| 2006/0014098 A1 | 1/2006 | Hada et al. | |
| 2007/0265478 A1* | 11/2007 | Ji | C07C 17/208 570/161 |
| 2009/0039019 A1 | 2/2009 | Raman | |
| 2010/0230351 A1* | 9/2010 | Hoving | B01D 69/02 427/532 |
| 2014/0131278 A1* | 5/2014 | Sakamoto | B01D 41/04 210/257.2 |
| 2015/0144557 A1* | 5/2015 | Ly | B01D 69/12 210/260 |
| 2015/0329386 A1* | 11/2015 | Lin | C08J 7/043 204/632 |
| 2016/0089622 A1 | 3/2016 | Takashima et al. | |
| 2018/0290109 A1 | 10/2018 | Jaber et al. | |
| 2019/0033718 A1 | 1/2019 | Kamimura | |

FOREIGN PATENT DOCUMENTS

| | | | |
|---|---|---|---|
| CN | 102423637 A | | 4/2012 |
| CN | 102988989 A | | 3/2013 |
| CN | 103894066 A | | 7/2014 |
| CN | 107106997 A | | 8/2017 |
| JP | 4-334531 A | | 11/1992 |
| JP | 2004-212975 A | | 7/2004 |
| JP | 2009-505821 A | | 2/2009 |
| JP | 2016-071020 A | | 5/2016 |
| JP | 2016073922 A | * | 5/2016 |
| JP | 2017-119828 A | | 7/2017 |
| JP | 2017-536232 A | | 12/2017 |
| KR | 10-2008-0037050 A | | 4/2008 |
| TW | 200424763 A | | 11/2004 |
| TW | 200714645 A | | 4/2007 |
| TW | 201625357 A | | 7/2016 |
| TW | 201807506 A | | 3/2018 |
| WO | 2017/175856 A1 | | 10/2017 |

OTHER PUBLICATIONS

Notice of Reasons for Refusal dated Sep. 14, 2021 by the Japanese Patent Office in Japanese Application No. 2020-508129.
International Search Report dated Jun. 4, 2019 in International Application No. PCT/JP2019/008146.
Written Opinion of the International Searching Authority dated Jun. 4, 2019 in International Application No. PCT/JP2019/008146.
International Preliminary Report on Patentability dated Sep. 22, 2020 in International Application No. PCT/JP2019/008146.
Office Action dated Dec. 15, 2021 in Chinese Application No. 201980016119.9.
Notification of Reason for Refusal dated Nov. 22, 2021 from the Korean Intellectual Property Office in KR Application No. 10-2020-7024595.
Office Action dated Apr. 6, 2022 in Taiwanese Application No. 108108115.

\* cited by examiner

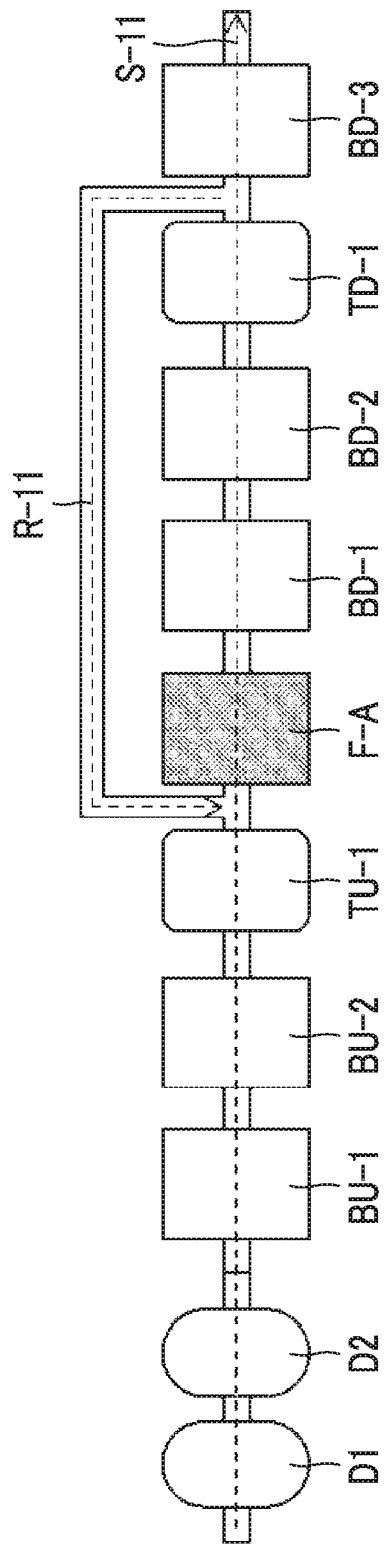
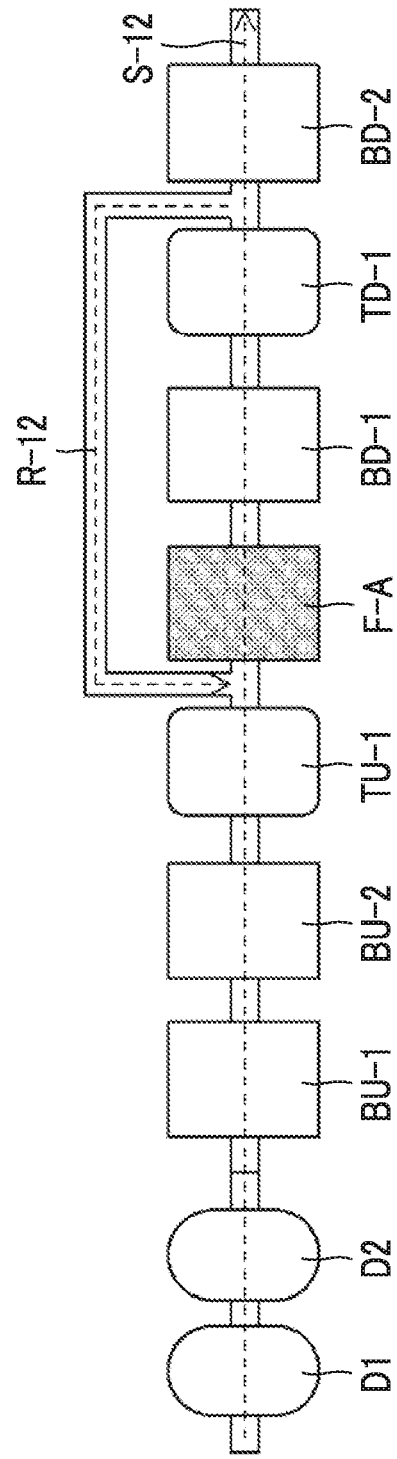

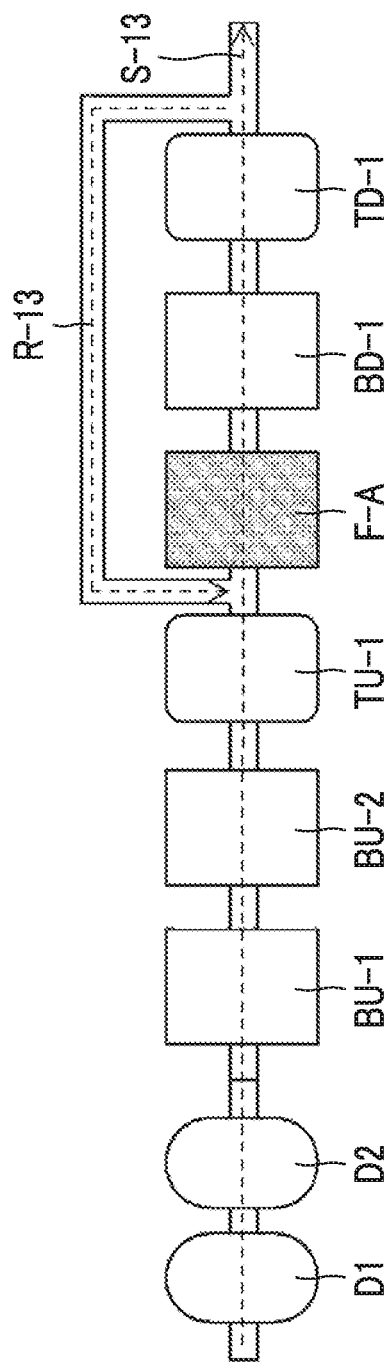
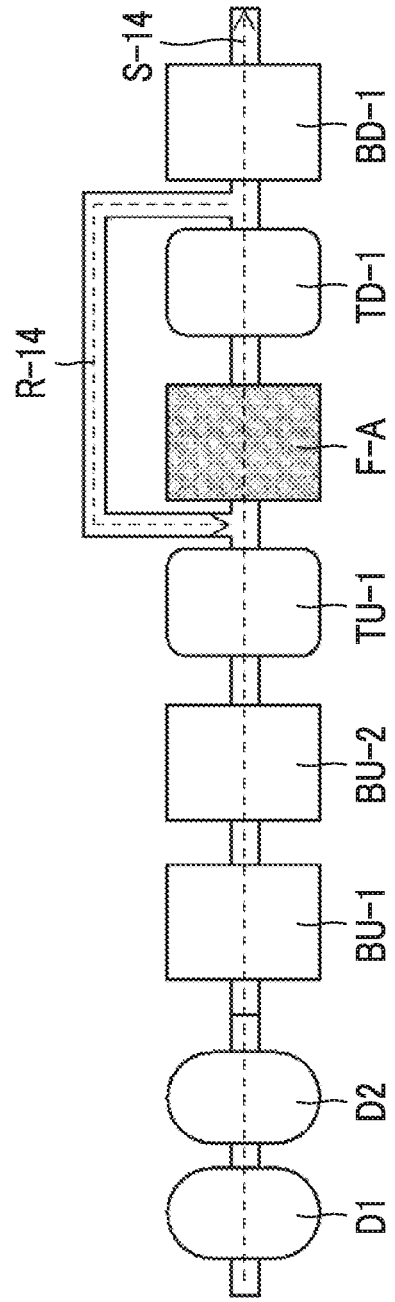

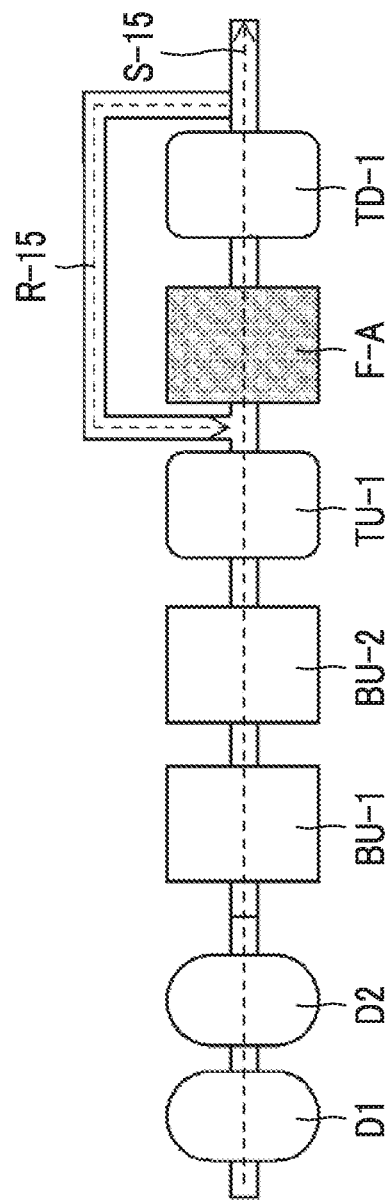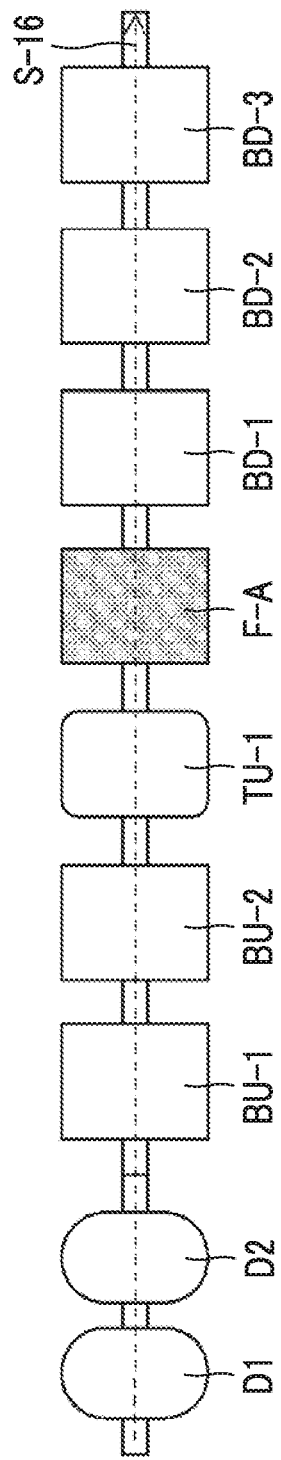

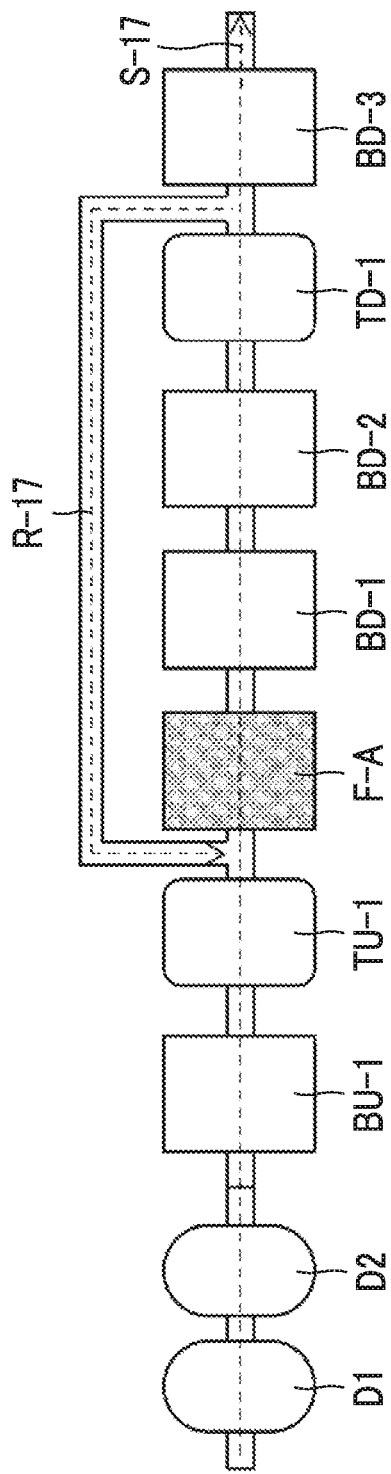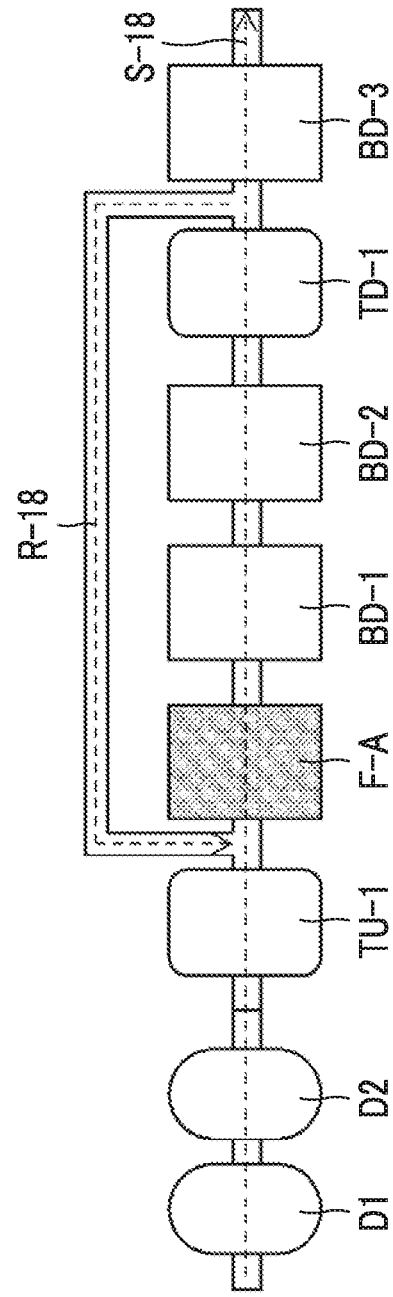

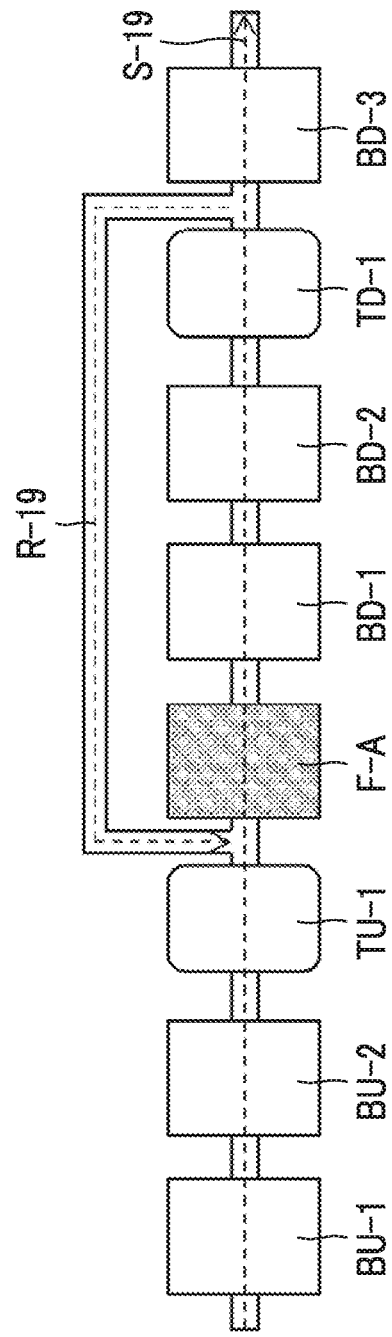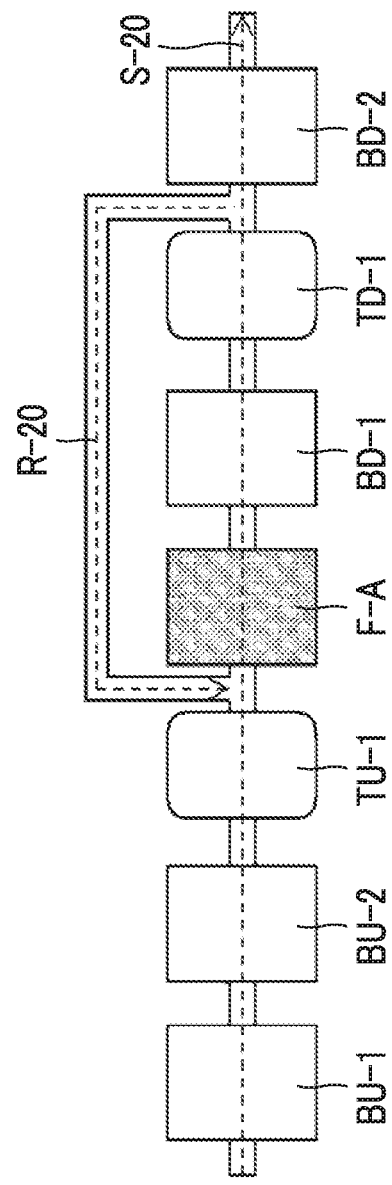

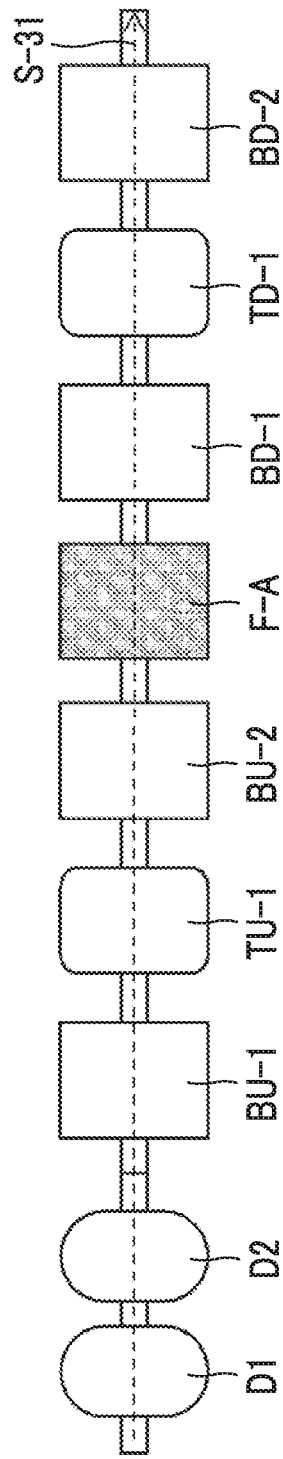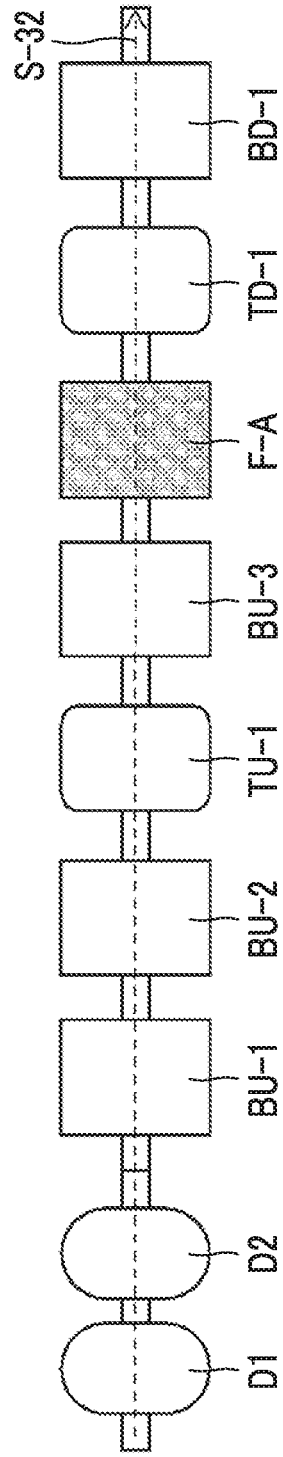

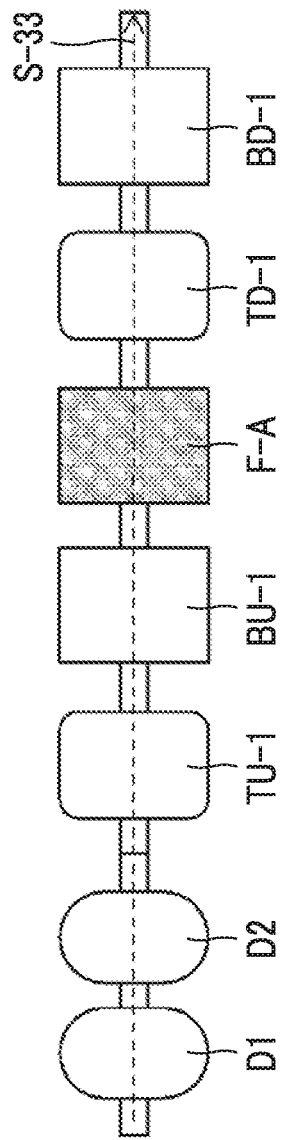
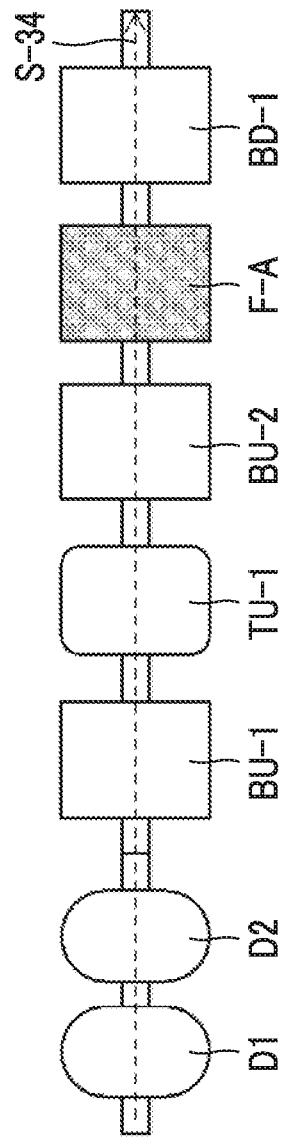
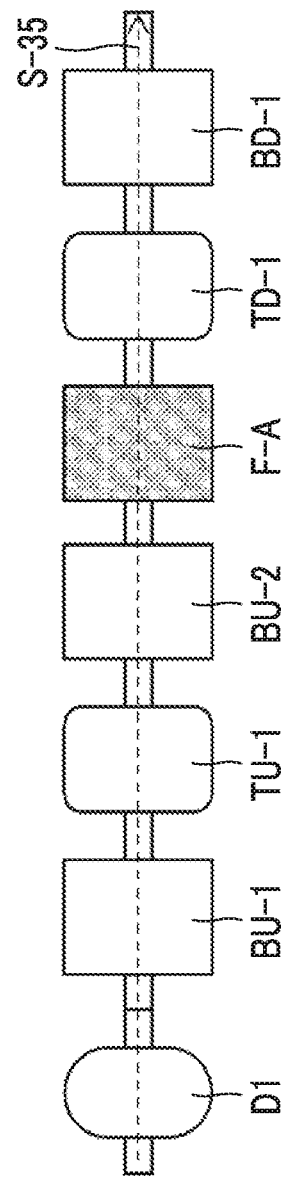

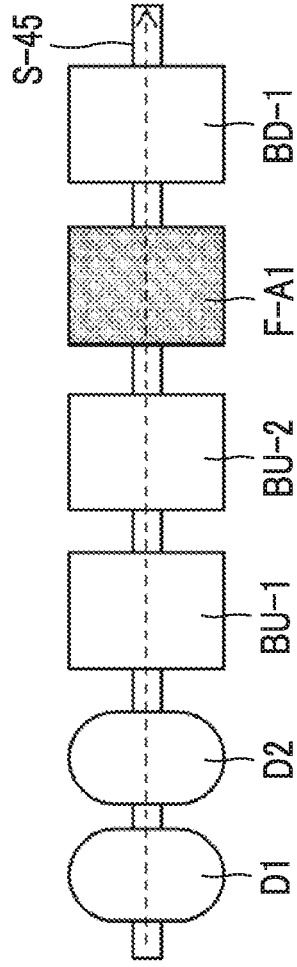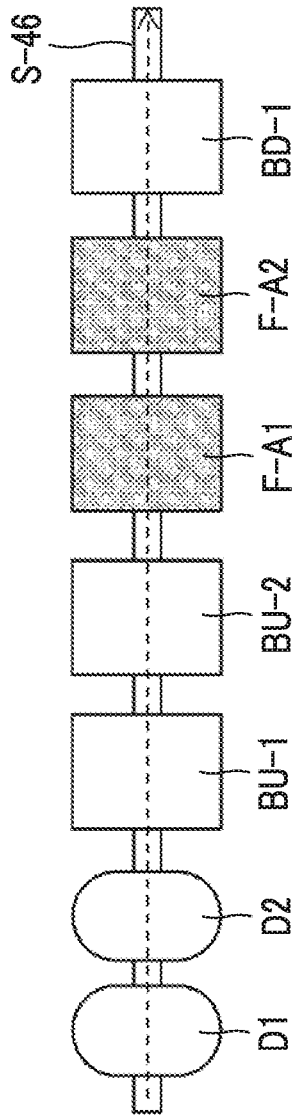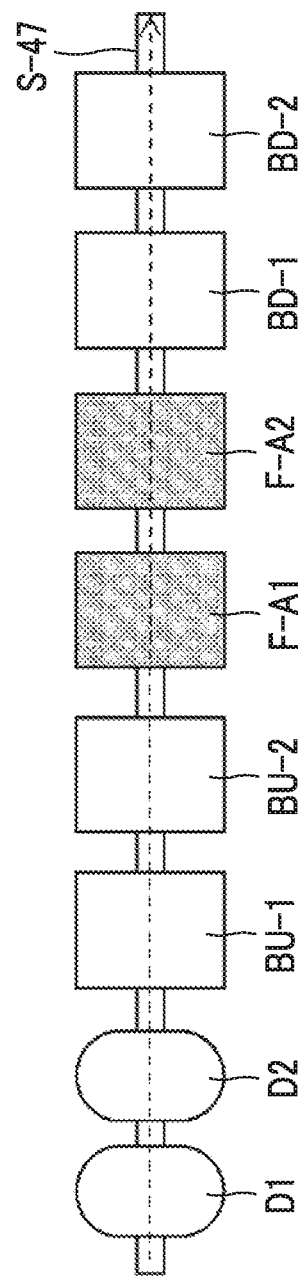

FILTERING DEVICE, PURIFICATION DEVICE, AND METHOD FOR MANUFACTURING CHEMICAL LIQUID

CROSS-REFERENCE TO RELATED APPLICATIONS

This application is a Continuation of PCT International Application No. PCT/JP2019/008146 filed on Mar. 1, 2019, which claims priority under 35 U.S.C § 119(a) to Japanese Patent Application No. 2018-055045 filed on Mar. 22, 2018, and Japanese Patent Application No. 2018-153253 filed on Aug. 16, 2018. Each of the above application(s) is hereby expressly incorporated by reference, in its entirety, into the present application.

BACKGROUND OF THE INVENTION

1. Field of the Invention

The present invention relates to a filtering device, a purification device, and a method for manufacturing a chemical liquid.

2. Description of the Related Art

In a case where semiconductor devices are manufactured by a wiring forming process including photolithography, as a prewet solution, a resist solution (resist resin composition), a developer, a rinsing solution, a peeling solution, a chemical mechanical polishing (CMP) slurry, a post-CMP washing solution or the like or as a diluted solution of these, a chemical liquid containing water and/or an organic solvent is used.

In recent years, as photolithography techniques have become advanced, patterns have been further miniaturized.

The chemical liquid used in such a wiring forming process is required to have further improved defect inhibition performance. Generally, such a chemical liquid is considered to be obtained by purifying a liquid to be purified, which contains requisite components for the chemical liquid as main components, by using a filter or the like so as to remove impurities and the like.

As a filter that can be used for purifying such a chemical liquid, JP2017-536232A describes "grafted asymmetric porous ultra-high-molecular-weight polyethylene membrane having a bubble point of about 78 psi to 160 psi determined by an ethoxy-nonafluorobutane bubble point test and having one or plural neutral groups or ion exchange groups grafted to one or plural surfaces of the membrane".

SUMMARY OF THE INVENTION

The inventors of the present invention obtained a chemical liquid by purifying a liquid to be purified by using the aforementioned filter and evaluated the defect inhibition performance of the chemical liquid. As a result, the inventors have found that sometimes a sufficient defect inhibition performance is not obtained. Therefore, an object of the present invention is to provide a filtering device capable of manufacturing a chemical liquid having excellent defect inhibition performance. Another object of the present invention is to provide a purification device and a method for manufacturing a chemical liquid.

In order to achieve the aforementioned objects, the inventors of the present invention carried out intensive examinations. As a result, the inventors have found that the objects are achieved by the following constitution.

(1) A filtering device for obtaining a chemical liquid by purifying a liquid to be purified, the filtering device having an inlet portion, an outlet portion, a filter A, at least one filter B different from the filter A, and a flow path which includes the filter A and the filter B arranged in series and extends from the inlet portion to the outlet portion, in which the filter A has a porous membrane made of ultra-high-molecular-weight polyethylene and a resin layer disposed to cover at least a portion of a surface of the porous membrane, and the resin layer includes a resin having a neutral group or an ion exchange group.

(2) The filtering device described in (1), in which the filter B includes at least one filter BU disposed on an upstream side of the filter A on the flow path.

(3) The filtering device described in (2), in which at least one filter BU includes a filter having a pore size equal to or greater than 1 nm.

(4) The filtering device described in (2) or (3), in which at least one filter BU contains a resin having a second ion exchange group.

(5) The filtering device described in any one of (1) to (4), in which the resin having a neutral group or an ion exchange group has a neutral group, and the filter A is disposed on a downmost stream side in the flow path.

(6) The filtering device described in any one of (1) to (5), in which the resin having a neutral group or an ion exchange group has a group selected from the group consisting of an amide group, an imide group, a carboxamide group, a sulfonamide group, a sulfenamide group, a thioamide group, an amidine group, a carboxamidine group, and a sulfinamidine group.

(7) The filtering device described in any one of (1) to (6), further having a return flow path capable of returning the liquid to be purified to an upstream side of the filter A from a downstream side of the filter A on the flow path.

(8) The filtering device described in any one of (1) to (4), in which the filter B includes at least one filter BD disposed on a downstream side of the filter A on the flow path.

(9) The filtering device described in (8), in which at least one filter BD includes a filter having a pore size equal to or smaller than 20 nm.

(10) The filtering device described in (8) or (9), in which the filter BD contains at least one selected from the group consisting of polyolefin, polyamide, polyfluorocarbon, polystyrene, polysulfone, and polyethersulfone.

(11) The filtering device described in any one of (8) to (10), further having a return flow path capable of returning the liquid to be purified to an upstream side of a reference filter from a downstream side of the reference filter, in which the reference filter consists of any of the at least one of the filters BD.

(12) The filtering device described in any one of (8) to (11), which is for purifying the liquid to be purified satisfying a condition 1 that will be described later.

(13) The filtering device described in (12), in which the at least one filter BD has a pore size less than 10 nm.

(14) The filtering device described in any one of (2) to (4), which is for purifying the liquid to be purified satisfying a condition 2 that will be described later.

(15) The filtering device described in any one of (1) to (14), which is for purifying the liquid to be purified having a Hansen solubility parameter equal to or higher than 10 $(MPa)^{1/2}$ for a hydrogen bond element or for purifying the liquid to be purified having a Hansen solubility parameter less than 10 $(MPa)^{1/2}$ for a hydrogen bond element and a C log P value equal to or greater than 1.0, in which the ion exchange group is a cation exchange group.

(16) The filtering device described in any one of (1) to (14), which is for purifying the liquid to be purified having a Hansen solubility parameter less than 10 $(MPa)^{1/2}$ for a hydrogen bond element and a C log P value less than 1.0, in which the ion exchange group is an anion exchange group.

(17) The filtering device described in any one of (1) to (16), further having a tank arranged in series with the filter A on the flow path.

(18) The filtering device described in (17), further having a filter C which is arranged in series with the tank on an upstream side of the tank in the flow path and has a pore size equal to or greater than 20 nm.

(19) The filtering device described in any one of (1) to (18), in which the chemical liquid is at least one selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat.

(20) A filtering device for manufacturing a chemical liquid for manufacturing a semiconductor substrate by purifying a liquid to be purified, the filtering device having an inlet portion, an outlet portion, a filter A, at least one filter B different from the filter A, and a flow path which includes the filter A and the filter B arranged in series and extends from the inlet portion to the outlet portion, in which the filter A has a porous membrane made of ultra-high-molecular-weight polyethylene and a resin layer disposed to cover at least a portion of a surface of the porous membrane, and the resin layer includes a resin having a neutral group or an ion exchange group.

(21) A purification device having the filtering device described in any one of (1) to (20), and at least one distiller connected to the inlet portion of the filtering device.

(22) The purification device described in (21), in which at least one distiller includes a plurality of distillers connected in series.

(23) A method for manufacturing a chemical liquid that is for obtaining a chemical liquid by purifying a liquid to be purified, the method having a filtration step of purifying the liquid to be purified by using the filtering device described in any one of (1) to (20) so as to obtain a chemical liquid.

(24) The method for manufacturing a chemical liquid described in (23), further having a filter washing step of washing the filter A and the filter B before the filtration step.

(25) The method for manufacturing a chemical liquid described in (23) or (24), further having a device washing step of washing a liquid contact portion of the filtering device before the filtration step.

According to the present invention, it is possible to provide a filtering device capable of manufacturing a chemical liquid having excellent defect inhibition performance.

Furthermore, the present invention can also provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, for a chemical liquid such as a prewet solution, a developer, or a rinsing solution used for forming a resist film, the residue defect inhibition performance described in [Test Example 1] in Examples, which will be described later, is regarded as "defect inhibition performance". Furthermore, for a resist resin composition which contains a resin and is used for forming a resist film, the bridge defect inhibition performance described in [Test Example 2] in Examples, which will be described later, is regarded as "defect inhibition performance".

Hereinafter, in a case where a characteristic is simply referred to as "defect inhibition performance", this means the defect inhibition performance (residue defect inhibition performance, bridge defect inhibition performance, or particle defect inhibition performance) corresponding to the type of the chemical liquid.

BRIEF DESCRIPTION OF THE DRAWINGS

FIG. 11 shows a purification device according to an embodiment of the present invention.

FIG. 12 shows a purification device according to an embodiment of the present invention.

FIG. 13 shows a purification device according to an embodiment of the present invention.

FIG. 14 shows a purification device according to an embodiment of the present invention.

FIG. 15 shows a purification device according to an embodiment of the present invention.

FIG. 16 shows a purification device according to an embodiment of the present invention.

FIG. 17 shows a purification device according to an embodiment of the present invention.

FIG. 18 shows a purification device according to an embodiment of the present invention.

FIG. 19 shows a filtering device according to an embodiment of the present invention.

FIG. 20 shows a filtering device according to an embodiment of the present invention.

FIG. 31 shows a purification device according to an embodiment of the present invention.

FIG. 32 shows a purification device according to an embodiment of the present invention.

FIG. 33 shows a purification device according to an embodiment of the present invention.

FIG. 34 shows a purification device according to an embodiment of the present invention.

FIG. 35 shows a purification device according to an embodiment of the present invention.

FIG. 45 shows a purification device according to an embodiment of the present invention.

FIG. 46 shows a purification device according to an embodiment of the present invention.

FIG. 47 shows a purification device according to an embodiment of the present invention.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values described before and after "to" as a lower limit and an upper limit respectively.

[Filtering Device]

In the filtering device according to an embodiment of the present invention, an inlet portion, an outlet portion, a filter A, at least one filter B different from the filter A, and a flow path which includes the filter A and the filter B are arranged in series and which extends from the inlet portion to the outlet portion (path through which a liquid to be purified flows) are formed (in other words, the filtering device has a flow path, in which the filter A and at least one filter B different from the filter A are arranged in series between the inlet portion and the outlet portion and which extends from the inlet portion to the outlet portion), and the filter A is a porous membrane that will be described later. In the present specification, "different from the filter A" means that a filter is different from the filter A in terms of at least one kind of item selected from the group consisting of pore size, material, and pore structure.

Hereinafter, the filtering device will be described using drawings. In the filtering device according to the embodiment of the present invention, because the filter A and the filter B are arranged in series on the flow path, the liquid to be purified is sequentially filtered through the filter A and the filter B (or the filter B and the filter A). Hereinafter, the filtering device according to the embodiment of the present invention will be described. In the following section, a filtering device for a dead-end filtration method that filters the entirety of a liquid to be purified introduced into a filter by using the filter will be described for example. However, the filtering device according to the embodiment of the present invention is not limited thereto, and may be a filtering device for a cross-flow method that divides the introduced liquid to be purified into a liquid to be purified having undergone purification and a concentrate (sometimes the concentrate is introduced again into a filter as a liquid to be purified) or may be a filtering device for a method as a combination of the dead-end filtration method and the cross-flow method.

First Embodiment

Figure 1:
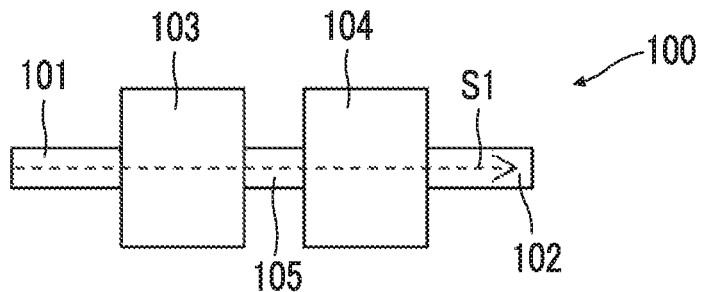
FIG. 1 is a schematic view illustrating a filtering device according to a first embodiment of the present invention.

FIG. 1 is a schematic view illustrating a filtering device according to a first embodiment of the present invention.

A filtering device 100 is a filtering device in which a filter 104 as a filter A and a filter 103 (filter BU) different from the filter 104 are arranged in series through a piping 105 between an inlet portion 101 and an outlet portion 102. In the present specification, "filters different from each other" means that the filters are different from each other in terms of at least one kind of item selected from the group consisting of pore size, material, and pore structure. Particularly, in view of obtaining a filtering device having further improved effects of the present invention, the filter BU is preferably different from the filter A at least in terms of pore size, and more preferably different from the filter A in terms of pore size and material.

The inlet portion 101, the filter 103, the piping 105, the filter 104, and the outlet portion 102 are constituted such that a liquid to be purified can flow in the interior of each of these members. These members are connected to one another and form a flow path S (path through which the liquid to be purified flows).

FIG. 1 shows only one filter 104 as the filter A. However, the present invention is not limited to this aspect, and a plurality of filters A may be used.

The shape of the inlet portion 101 and the outlet portion 102 is not particularly limited as long as the liquid to be purified can be introduced into and discharged from the filtering device. Typically, examples thereof include a hollow cylindrical piping (inlet piping and outlet piping) having an inlet port and an outlet port. Hereinafter, an embodiment in which each of the outlet portion and the inlet portion is a piping will be described for example.

The shapes of the inlet portion 101, the piping 105, and the outlet portion 102 are not particularly limited. Typically, examples thereof include a hollow cylinder shape in which the liquid to be purified can flow in these members. Although the material of these is not particularly limited, it is preferable that a liquid contact portion (a portion that is likely to contact the liquid to be purified in a case where the liquid to be purified is filtered) thereof is formed of an anticorrosive material which will be described later.

The liquid to be purified introduced from the inlet portion 101 of the filtering device 100 flows in the filtering device 100 along the flow path S1. In the meantime, the liquid to be purified is sequentially filtered through the filter 103 (filter BU) and the filter 104 (filter A) and then discharged out of the filtering device 100 from the outlet portion 102. The form of the liquid to be purified will be described later.

In the filtering device 100, in order that the liquid to be purified flows, a pump, a damper, a valve, and the like not shown in the drawing may be arranged on the flow path S1.

The shapes of the filters 103 and 104 are not particularly limited. For example, the filter A and the filter B have a flat shape, a pleated shape, a spiral shape, a hollow cylindrical shape, and the like. Particularly, in view of further improving handleability, typically, the filter A and the filter B are preferably in the form of a cartridge filter having a core, which is formed of a material permeable to the liquid to be purified and/or has a structure permeable to the liquid to be purified, and a filter which is disposed on the core in a state of being wound around the core. In this case, although the material of the core is not particularly limited, it is preferable that the core is formed of the anticorrosive material which will be described later.

The method of arranging the filters is not particularly limited. Typically, it is preferable to arrange the filters in a housing not shown in the drawing that has at least one entrance, at least one exit, and at least one internal flow path formed between the entrance and the exit. In this case, the filters are arranged to cross the internal flow path of the housing. The internal flow path formed in the housing forms a portion of the flow path S1. While flowing through the flow path S1, the liquid to be purified is filtered through the filters that are arranged to cross the flow path S1.

The material of the housing is not particularly limited. Examples thereof include any appropriate hard and impermeable materials including impermeable thermoplastic materials compatible with the liquid to be purified. For example, the housing can be prepared from a metal such as stainless steel or a polymer. In an embodiment, the housing is a polymer such as polyacrylate, polypropylene, polystyrene, or polycarbonate.

Furthermore, in view of obtaining a filtering device having further improved effects of the present invention, at least a portion of a liquid contact portion of the housing, which is preferably 90% and more preferably 99% of the surface area of the liquid contact portion, is preferably formed of the anticorrosive material which will be described later. In the present specification, the liquid contact portion means a portion which is likely to contact the liquid to be purified, and means the inner wall of a unit such as the housing and the like.

First Embodiment of Filter A: Filter A1

The filtering device according to the present embodiment has a filter A. The filter A has a porous membrane made of ultra-high-molecular-weight polyethylene and a resin layer disposed to cover at least a portion of the surface of the porous membrane. The resin included in the resin layer has a neutral group or an ion exchange group.

The filter A according to the first embodiment is a filter A1 including a resin having an ion exchange group.

The filter A1 has a porous membrane made of ultra-high-molecular-weight polyethylene. The porous membrane may be an asymmetric porous membrane or a symmetric porous membrane.

"Porous membrane" means a membrane which retains components in a liquid to be purified, such as gel, particles, colloids, cells, and polyoligomers, but allows the components substantially smaller than the pores of the membrane to pass through the membrane.

In the present specification, "asymmetric (membrane)" means that the size of pores in the membrane changes along a thickness direction of the membrane from one surface of the membrane to the other surface thereof. In the asymmetric membrane, for example, the size of pores on one surface and region of the asymmetric membrane is larger than the size of pores on the opposite surface and region. Furthermore, for another example, sometimes there is an asymmetric structure (for instance, in the form of an hourglass) in which the opposite surfaces (and regions) of a membrane have pores with a larger size and the central region of the membrane has pores smaller than the pores on any of the surfaces.

In addition, in the present specification, "symmetric (membrane)" means that the size of pores in the membrane substantially does not change along a thickness direction of the membrane from one surface of the membrane to the other surface thereof.

In the present specification, the shape of pores, the position of pores in a membrane, and the size distribution are called pore structure.

The form of the porous membrane of the filter A1 is not particularly limited. For example, the porous membrane is in the form of a flat sheet, nonwoven cloth, hollow fiber membrane, or the like. Furthermore, the filter A1 may be formed on another porous support.

In addition, the porous membrane may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The filter may be put in a housing or a cartridge which has an end cap suited for an entrance and an exit for a fluid and is formed in a filter cartridge or a device optionally with a core and a cage for support.

That is, in a case where the filter is disposed in the filtering device, typically, it is preferable to dispose the filter in a housing (not shown in FIG. 1) that has at least one entrance, at least one exit, and at least one flow path formed between the entrance and the exit. In this case, the filter is disposed to cross the flow path of the housing. The flow path formed in the housing forms a portion of the flow path S1. While flowing through the flow path S1, the liquid to be purified is filtered through the filters that are arranged to cross the flow path S1.

Furthermore, the filter A1 may be formed on a membrane supporting material such as woven cloth and a net, and may be pleated together with a membrane. The filter A1 can be pleated or used as a disk or hollow fiber. At least a portion of the surface of the filter A1 contains a resin layer (the resin layer preferably takes up 90% or more of the surface, more preferably takes up 99% or more of the surface, and even more preferably takes up 100% of the surface).

One of the advantages of the filter A1 is that this filter can be used for an aqueous liquid to be purified (the form of the liquid to be purified will be described later) such as tetramethylammonium hydroxide without being subjected to a step of wetting the filter in advance with, for example, isopropanol or the like.

The filter A1 can be used for removing particles in a liquid to be purified by a sieving effect. Furthermore, the filter A1 can be used for adsorbing and removing positively or negatively charged substances from a liquid to be purified passing through the filter A1. Specifically, the filter A1 can be used for removing charged impurities including particles and ions from an organic solvent-based liquid to be purified (the form of the organic solvent-based liquid to be purified will be described later).

As the ultra-high-molecular-weight polyethylene used in the filter A1, known ultra-high-molecular-weight polyethylene can be used without particular limitation. In the present specification, "ultra-high-molecular-weight" means a weight-average molecular weight equal to or greater than $1.0 \times 10^6$. The molecular weight of the ultra-high-molecular-weight polyethylene is not particularly limited. Generally, the molecular weight thereof is preferably $1.0 \times 10^6$ to $7.0 \times 10^7$, and more preferably $1.0 \times 10^6$ to $7.0 \times 10^6$. In the present specification, the molecular weight of the ultra-high-molecular-weight polyethylene means a value measured by a gel permeation chromatography (GPC) method.

The intrinsic viscosity is not particularly limited, but is preferably 15 to 60 dg in general. The intrinsic viscosity can be measured at 135° C. by using, for example, the Ubbelohde viscometer in a solution containing orthodichlorobenzene as a solvent and having a polymer concentration of 0.0005% to 0.01% by mass.

The filter A1 has a resin layer disposed to cover at least a part of the surface of the porous membrane. In other words, the filter A1 is a porous membrane made of ultra-high-molecular-weight polyethylene with a resin layer.

The resin layer contains a resin. Specifically, examples of the resin include polyamide such as 6-nylon and 6,6-nylon; polyolefin such as polyethylene and polypropylene; polystyrene; polyimide; polyamidoimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate; polystyrene; polysulfone; polyether sulfone; and the like.

Furthermore, the resin in the resin layer may be bonded to the porous membrane. In other words, the resin in the resin layer may be chemically bonded to the porous membrane, and the resin layer may have a graft chain.

It is preferable that the resin layer is disposed to cover at least more than 50% of the surface (preferably 70% or more of the surface, and more preferably 100% of the surface) of the porous membrane.

In the present specification, "having a graft chain" (or "grafted") means that a molecule different from the ultra-high-molecular-weight polyethylene as a backbone chain polymer is chemically bonded to at least a portion of the surface (preferably more than 50% of the surface and more preferably 70% or more of the surface) of the porous membrane. The surface of the porous membrane also includes pore surfaces.

The grafting method is not particularly limited. Typical examples thereof include a method of irradiating the porous membrane made of ultra-high-molecular-weight polyethylene with ionizing radiation or the like such that radicals occur on at least the surface of the ultra-high-molecular-weight polyethylene and contact a radically polymerizable monomer and thus a graft chain is introduced into the resin layer.

In a case where the resin layer in the filter A1 has a graft chain, it is preferable that at least a portion of the graft chain has an ion exchange group. As the radically polymerizable monomer, it is preferable to use a monomer having an ion exchange group capable of forming such a graft chain.

The ion exchange group is not particularly limited, and examples thereof include a carboxylic acid group, a sulfonic acid group, an ammonium halide group, and the like. Examples of the ion exchange group also include an acrylamide group, a N,N-dimethylacrylamide group, a vinylbenzyltrimethylammonium chloride group, a vinyl sulfonic acid (including a salt) group, an acrylic acid group, a styrene sulfonic acid group, and the like. Examples of monomers having these ion exchange groups include the following cationic monomers and anionic monomers.

Examples of the cation exchange group include a boronic acid group, a phosphonic acid group, a sulfonic acid group, a carboxylic acid group, and the like. Examples of the anion exchange group include an amino group, a quaternary ammonium group, an imidazolium group, a pyridinyl group, and the like.

Cationic monomers include acrylate, methacrylate, acrylamide, methallyl amide, quaternary ammonium, imidazolium, phosphonium, guanidinium, sulfonium, and vinyl monomers having pyridinium functional groups.

Specifically, examples thereof include 2-(dimethylamino) ethyl acrylate hydrochloride, [2-(acryloyloxy)ethyl] trimethylammonium chloride, 2-aminoethyl methacrylate hydrochloride, N-(3-aminopropyl) methacrylate hydrochloride, 2-(dimethylamino)ethyl methacrylate hydrochloride, a [3-(methacryloylamino)propyl] trimethylammonium chloride solution, [2-(methacryloyloxy)ethyl] trimethylammonium chloride, acrylamidopropyltrimethylammonium chloride, 2-aminoethyl methacrylamide hydrochloride, N-(2-aminoethyl)methacrylamide hydrochloride, N-(3-aminopropyl)-methacrylamide hydrochloride, diallyldimethylammonium chloride, allylamine hydrochloride, vinylimidazolium hydrochloride, vinyl pyridinium hydrochloride, vinylbenzyl trimethylammonium hydrochloride, and the like.

Examples of anionic monomers include acrylate, methacrylate, acrylamide, methacrylamide, and vinyl monomers having sulfonic acid, carboxylic acid, phosphonic acid, vinyl monomers having phosphoric acid functional groups, and the like.

Specifically, examples thereof include 2-ethyl acrylate, acrylic acid, 2-carboxyethyl acrylate, a 3-sulfopropyl acrylate potassium salt, 2-propyl acrylate, 2-(trifluoromethyl)

acrylate, methacrylic acid, a 2-methyl-2-propene-1-sulfonic acid sodium salt, mono-2-(methacryloyloxy)ethyl maleate, a 3-sulfopropyl methacrylate potassium salt, 2-acrylamido-2-methyl-1-propanesulfonic acid, 3-methacrylamidophenylboronic acid, vinyl sulfonic acid, acrylamidopropyl sulfonic acid, vinyl phosphonic acid, and the like. The above monomers may be in the form of a salt. For example, vinyl sulfonic acid may be sodium vinyl sulfonate.

In addition, N-(hydroxymethyl) acrylamide (HMAD), (3-acrylamidopropyl)trimethylammonium chloride (APTAC), and (vinylbenzyl)trimethylammonium chloride (VBTAC) are suitable monomers, and the structures of these are as below.

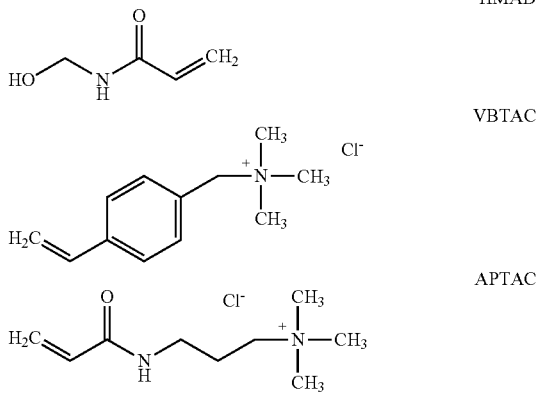

The pore size of the filter A1 is not particularly limited. Generally, the pore size of the filter A1 is preferably 5 to 500 nm, and more preferably 10 to 300 nm.

In the present specification, "pore size" means a pore size determined by the bubble point of isopropanol (IPA) or HFE-7200 ("NOVEC 7200", manufactured by 3M, hydrofluoroether, $C_4F_9OC_2H_5$).

The critical wetting surface tension of the filter A1 (for example, critical wetting surface tension (CWST) defined in U.S. Pat. No. 4,925,572A) is not particularly limited. CWST can be measured using a set of solutions of having a certain composition. Each solution has a specific surface tension. The surface tension of these solutions is in a range of $25 \times 10^{-5}$ to $92 \times 10^{-5}$ N/cm with small unequal increments. In order to measure the surface tension of the filter A1, the porous membrane is placed on a white light table, a drop of solution having a certain surface tension is applied to the surface of the membrane, and the time taken for the solution droplet to penetrate and pass through the porous membrane and then turns bright white showing that light has passed through the membrane is recorded. In a case where the time taken for the solution droplet to pass through the membrane is equal to or shorter than 10 seconds, it is considered that the solution instantaneously wets the membrane. In a case where the time is longer than 10 seconds, it is considered that the solution partially wets the porous membrane. CWST can be selected by the methods known in the related art or selected as disclosed in U.S. Pat. Nos. 5,152,905A, 5,443,743A, 5,472,621A, and 6,074,869A.

Generally, the critical wetting surface tension of the filter A1 is preferably $30 \times 10^{-5}$ to $90 \times 10^{-5}$ N/cm, and more preferably $45 \times 10^{-5}$ to $75 \times 10^{-5}$ N/cm. In a case where the critical wetting surface tension is in a range of $30 \times 10^{-5}$ to $90 \times 10^{-5}$ N/cm, the filter A1 can better remove metals.

The filtering device 100 has the filter 104 and the filter 103 (filter BU). However, the filtering device according to the embodiment of the present invention having the filter A1 as the filter A is not limited thereto, and may have the filter 104 and a filter BD which will be described later. According to the examination of the inventors of the present invention, it has been found that in a case where a liquid to be purified is passed through the filter A1, sometimes fine impurity particles are mixed into the liquid to be purified. In a case where a device having the filter A1 and the filter BD is used, a chemical liquid having further improved defect inhibition performance is obtained.

Second Embodiment of Filter A: Filter A2

The filter A according to a second embodiment is a filter A2 including a resin layer in which the resin has a neutral group. The filter A2 may be disposed on the downmost stream side in the flow path. Herein, "filter A2 is disposed on the downmost stream side in the flow path" means that among all the filters arranged in the flow path, the filter A2 is disposed on the downmost stream side. Hereinafter, the filter A2 will be described. The matters that will not be described below are the same as those described above regarding "filter A1".

The resin in the resin layer of the filter A2 has a neutral group. As described above, the resin layer may contain a graft chain.

Examples of methods of forming the graft chain typically include a method of irradiating the porous membrane containing ultra-high-molecular-weight polyethylene with ionizing radiation or the like such that radicals occur on at least the surface of the ultra-high-molecular-weight polyethylene and contact a radically polymerizable monomer and thus a graft chain is introduced into the resin layer.

In a case where the resin layer in the filter A2 has a graft chain, it is preferable that at least a portion of the graft chain in the filter A2 has a neutral group. As a radically polymerizable monomer, it is preferable to use a monomer having a neutral group (hereinafter, also called "neutral monomer") capable of forming such a graft chain.

The neutral group is not particularly limited, but is preferably, for example, an amide group, a hydroxy group, a carbonyl group, or a group obtained by combining these.

In addition, examples of the neutral group include a group selected from the group consisting of an imide group, a carboxamide group, a sulfonamide group, a sulfenamide group, a thioamide group, an amidine group, a carboxamidine group, and a sulfinamidine group.

It is preferable that the resin in the resin layer has a group selected from the group consisting of an amide group, an imide group, a carboxamide group, a sulfonamide group, a sulfenamide group, a thioamide group, an amidine group, a carboxamidine group, and a sulfinamidine group among the above.

Examples of the neutral monomer include N-(hydroxymethyl)acrylamide, 2-hydroxyethyl acrylate, and the like. Furthermore, N,N-methylenebisacrylamide can also be used.

<Filter BU>

The filter BU is a filter different from the filter A, and is arranged in series with the filter A on the upstream side of the filter A on the flow path. "Upstream side" refers to the side of the inlet portion on the flow path. In view of obtaining a filtering device having further improved effects of the present invention, the filter BU is preferably different from the filter A at least in terms of material, and more preferably different from the filter A in terms of pore size and material.

The material of the filter BU is not particularly limited, and may be the same as or different from the material component of the filter A.

It is preferable that the component constituting the material (material component) of the filter BU includes a resin. The resin is not particularly limited, and resins known as materials of filters can be used. Specifically, examples thereof include polyamide such as 6-nylon and 6,6-nylon; polyolefin such as polyethylene and polypropylene; polystyrene; polyimide; polyamidoimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate; polystyrene; polysulfone; polyether sulfone, and the like. Particularly, in view of obtaining further improved solvent resistance and obtaining a chemical liquid having further improved defect inhibition performance, at least one kind of resin is preferable which is selected from the group consisting of polyamide (particularly preferably 6,6-nylon), polyolefin (particularly preferably polyethylene), polyfluorocarbon (particularly preferably polytetrafluoroethylene (PTFE) and perfluoroalkoxyalkane (PFA)), polystyrene, polysulfone, and polyethersulfone, and at least one kind of resin is more preferable which is selected from the group consisting of polyethylene (including ultra-high-molecular-weight polyethylene), nylon, and polytetrafluoroethylene. One kind of each of these polymers can be used singly, or two or more kinds of these polymers can be used in combination.

Furthermore, the filter BU may be subjected to a surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

The pore structure of the filter BU is not particularly limited, and may be appropriately selected according to the components of the liquid to be purified. In the present specification, the pore structure of the filter BU means a pore size distribution, a positional distribution of pores in the filter, a pore shape, and the like. Typically, the pore structure can be controlled by the manufacturing method of the filter.

For example, in a case where powder of a resin or the like is sintered to form a membrane, a porous membrane is obtained. Furthermore, in a case where a methods such as electrospinning, electroblowing, and melt blowing are used to form a membrane, a fiber membrane is obtained. These have different pore structures.

"Porous membrane" means a membrane which retains components in a liquid to be purified, such as gel, particles, colloids, cells, and polyoligomers, but allows the components substantially smaller than the pores of the membrane to pass through the membrane. The retention of components in the liquid to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

An ultra-high-molecular-weight polyethylene (UPE) filter is typically a sieving membrane. A sieving membrane means a membrane that traps particles mainly through a sieving retention mechanism or a membrane that is optimized for trapping particles through a sieving retention mechanism.

Typical examples of the sieving membrane include, but are not limited to, a polytetrafluoroethylene (PTFE) membrane and a UPE membrane.

"Sieving retention mechanism" refers to retention caused in a case where the particles to be removed are larger than the size of micropores of the porous membrane. Sieving retentivity can be improved by forming a filter cake (aggregate of particles to be removed on the surface of the membrane). The filter cake effectively functions as a secondary filter.

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pores size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the pores changes in the membrane. Typically, the pore size increases toward the other surface of the membrane from one surface of the membrane. In this case, the surface containing pores having a large pore size is called "open side", and the surface containing pores having a small pore size is also called "tight side".

Examples of the asymmetric porous membrane include a membrane in which the pore size is minimized at a position in the thickness direction of the membrane (this is also called "hourglass shape").

In a case where the asymmetric porous membrane is used such that large pores are on the primary side, in other words, in a case where the primary side is used as the open side, a pre-filtration effect can be exerted.

The porous membrane layer may include a thermoplastic polymer such as polyethersulfone (PESU), perfluoroalkoxyalkane (PFA, a copolymer of tetrafluoroethylene and perfluoroalkoxyalkane), polyamide, or a polyolefin, or may include polytetrafluoroethylene and the like.

For example, in a case where the liquid to be purified contains, as impurities, particles containing an organic compound, such particles are negatively charged in many cases. For removing such particles, a filter made of polyamide functions as a non-sieving membrane. Typical non-sieving membranes include, but are not limited to, nylon membranes such as a nylon-6 membrane and a nylon-6,6 membrane.

"Non-sieving" retention mechanism used in the present specification refers to retention resulting from the mechanism such as blocking, diffusion, and adsorption irrelevant to the pressure reduction of the filter or the pore size of the filter.

The non-sieving retention includes a retention mechanism such as blocking, diffusion, and adsorption for removing particles supposed to be removed from the liquid to be purified irrespective of the pressure reduction of the filter or the pore size of the filter. The adsorption of particles onto the filter surface can be mediated, for example, by the intermolecular van der Waals force and electrostatic force. In a case where the particles moving in the non-sieving membrane layer having a serpiginous path cannot sufficiently rapidly change direction so as not to contact the non-sieving membrane, a blocking effect is exerted. The transport of particles by diffusion is mainly caused by the random motion or the Brownian motion of small particles that results in a certain probability that the particles may collide with the filter medium. In a case where there is no repulsive force between the particles and the filter, the non-sieving retention mechanism can be activated.

The material of the fiber membrane is not particularly limited as long as it is a polymer capable of forming the fiber membrane. Examples of the polymer include polyamide and the like. Examples of the polyamide include nylon 6, nylon 6,6, and the like. The polymer forming the fiber membrane may be poly(ethersulfone). In a case where the fiber membrane is on the primary side of the porous membrane, it is preferable that the surface energy of the fiber membrane is higher than the surface energy of the polymer which is the material of the porous membrane on a secondary side. For example, in some cases, nylon as a material of the fiber membrane and polyethylene (UPE) as the porous membrane are combined.

As the method for manufacturing the fiber membrane, known methods can be used without particular limitation. Examples of the method for manufacturing the fiber membrane include electrospinning, electroblowing, melt blowing, and the like.

Particularly, in view of obtaining a filtering device having further improved effects of the present invention, it is preferable that the filtering device has at least one ion exchange filter, which contains a resin having a second ion exchange group as a material component, as the filter BU. As the second ion exchange group, it is possible to use known ion exchange groups without particular limitation. For example, it is possible to use the ion exchange group included in the graft chain of the filter A, and the like.

Furthermore, the resin is not particularly limited, and examples thereof include the resins described above as the resin of the filter A. Furthermore, the way the second ion exchange group is bonded to the aforementioned resin is not particularly limited. In a case where the filter A has a graft chain, the second ion exchange group may be bonded to the graft chain (the graft chain has the second ion exchange group) or may be directly bonded to the main chain of the resin.

In a case where the filter BU is the ion exchange filter described above, the pore size of the filter BU is not particularly limited. Generally, the pore size of the filter BU is preferably 1 to 100 nm, more preferably 3 to 50 nm, and even more preferably 5 to 30 nm.

The pore size of the filter BU is not particularly limited, and it is possible to use a filter having a pore size generally used for filtering a liquid to be purified. Especially, the pore size of the filter BU is preferably equal to or greater than 1 nm, more preferably equal to or greater than 3 nm, and even more preferably equal to or greater than 5 nm. The pore size of the filter BU is particularly preferably equal to or smaller than 50 nm.

The relationship between the pore size of the filter A and the pore size of the filter BU is not particularly limited, but it is preferable that the pore size of the filter BU is larger than the pore size of the filter A.

Although the filtering device in FIG. 1 has one filter BU, the filtering device according to the present embodiment may have a plurality of filters BU. In this case, the relationship between the pore sizes of the plurality of filters BU is not particularly limited. However, in view of easily obtaining a chemical liquid having further improved defect inhibition performance, it is preferable that a filter BU disposed on the uppermost stream side on the flow path has the largest pore size. In a case where the filter BU having the largest pore size is positioned as described above, the pot life of the filters (including the filter A) disposed on the downstream side of the filter BU in the uppermost stream can be further extended, and as a result, a filtering device capable of stably providing a chemical liquid having further improved defect inhibition performance is obtained. "Downstream side" refers to the side of the outlet portion on the flow path.

The filter BU may also be in the form of a filter (filter G) which has a pore size equal to or greater than 50 nm and equal to or smaller than 300 nm and does not have an ion exchange group.

The material of the filter G is not particularly limited and may be the same as or different from the material of the filter A. As the material of the filter G, it is possible to use the materials described above as the materials of the filter BU.

Particularly, as a resin, at least one kind of resin selected from the group consisting of polyolefin, polyamide, polyfluorocarbon, polystyrene, polysulfone, and polyethersulfone is preferably contained in the filter G. It is preferable that the filter G contains, as a material component, at least one kind of compound selected from the group consisting of ultra-high-molecular-weight polyethylene, polytetrafluoroethylene, and polyamide.

Particularly, the filter G preferably contains ultra-high-molecular-weight polyethylene or polytetrafluoroethylene as a material component, and more preferably consists of ultra-high-molecular-weight polyethylene or polytetrafluoroethylene (the same is applied to the filter C which will be described later). In a case where the filter G contains ultra-high-molecular-weight polyethylene or polytetrafluoroethylene, the components unintentionally eluted into a liquid to be purified from the filter (presumably, the compound used in steps of synthesizing and molding the material component of the filter, and the like) are reduced. As a result, a chemical liquid having further improved defect inhibition performance is obtained, and thus the pot life of the filter is further extended.

The pore size of the filter G is not particularly limited. Generally, the pore size of the filter G is preferably 10 to 30 nm, and more preferably 50 to 100 nm.

According to the examination of the inventors of the present invention, it has been found that in a case where a filtering device is used in which the filter G is disposed on the upstream side of the filter A on the flow path S, it is more difficult for the filter A to be clogged, and the pot life of the filter A1 can be further extended. As a result, a filtering device capable of stably providing a chemical liquid having further improved defect inhibition performance can be obtained.

First Modification Example of Filtering Device According to First Embodiment

Figure 2:
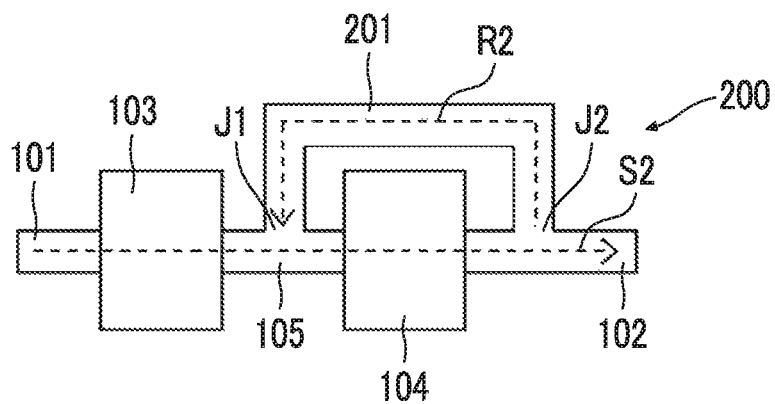
FIG. 2 is a schematic view illustrating a first modification example of the filtering device according to the first embodiment of the present invention.

FIG. 2 is a schematic view of a first modification example of the filtering device according to the first embodiment of the present invention. A filtering device 200 includes an inlet portion 101, an outlet portion 102, a filter 104 as a filter A, a filter 103 as a filter BU, and a flow path S2 which includes the filter 104 and the filter 103 arranged in series between the inlet portion 101 and the outlet portion 102 and extends from the inlet portion 101 to the outlet portion 102.

In the filtering device 200, the inlet portion 101, the filter 103, a piping 105, the filter 104, and the outlet portion 102 form the flow path S2.

In the filtering device 200, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 200, a return flow path R2 is formed which is capable of returning the liquid to be purified to a position, which is the downstream of the filter 103 and the upstream of the filter 104 (reference filter) in the flow path S2, from the downstream of the filter 104 (reference filter) in the flow path S2. Specifically, the filtering device 200 has a piping 201 for return, and the piping 201 forms the return flow path R2. One end of the piping 201 is connected to the flow path S2 on the downstream side of the filter 104 and the other end thereof is connected to the flow path S2 on the upstream side of the filter 104. On the return flow path R2, a pump, a damper, a valve, and the like not shown in the drawing may be arranged. Particularly, it is preferable to dispose a valve or the like at the sites indicated by J1 and J2 in FIG. 2 so as to prevent the liquid to be purified from unintentionally flowing through the return flow path R2 (the same is applied to a filtering device according to another embodiment which will be described later).

The liquid to be purified that has been returned to a position, which is on the downstream side of the filter 103 on the flow path S2 and on the upstream side of the filter 104 on the flow path S2, through the return flow path R2 is filtered through the filter 104 in the process of flowing again through the flow path S2. The filtering device 200 can perform circulation filtration. As a result, a chemical liquid having further improved defect inhibition performance can be easily obtained.

Second Modification Example of Filtering Device According to First Embodiment

Figure 3:
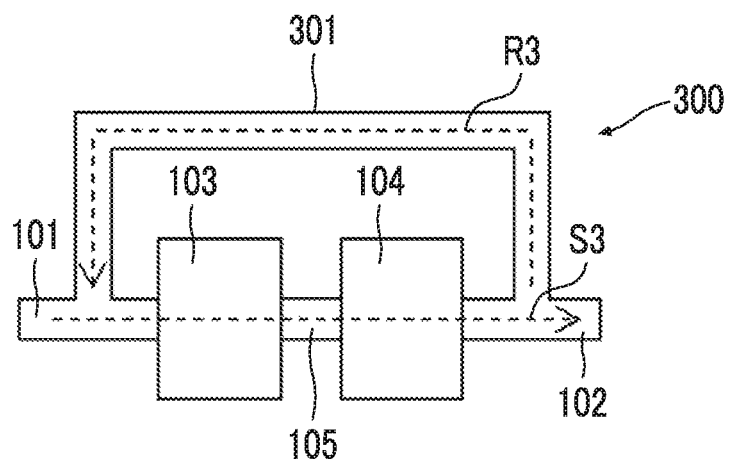
FIG. 3 is a schematic view illustrating a second modification example of the filtering device according to the first embodiment of the present invention.

FIG. 3 is a schematic view illustrating a filtering device as a second modification example according to the first embodiment of the present invention. A filtering device 300 includes an inlet portion 101, an outlet portion 102, a filter 103 (filter BU), a filter 104 (filter A), and a flow path S3 which includes the filter 103 and the filter 104 connected in series between the inlet portion 101 and the outlet portion 102 and extends from the inlet portion 101 to the outlet portion 102.

In the filtering device 300, the inlet portion 101, the filter 103, a piping 105, the filter 104, and the outlet portion 102 form the flow path S3.

In the filtering device 300, a return flow path R3 is formed which is capable of returning the liquid to be purified to the upstream side of the filter 103 on the flow path S3 (and the upstream side of a reference filter) from the downstream side of the filter 104 (reference filter) on the flow path S3. Specifically, the filtering device 300 has a piping 301 for return, and the piping 301 forms the return flow path R3. One end of the piping 301 is connected to the flow path S3 on the downstream side of the filter 104 and the other end thereof is connected to the flow path S3 on the upstream side of the filter 104. On the return flow path R3, a pump, a damper, a valve, and the like not shown in the drawing may be arranged.

The liquid to be purified that has been returned to the upstream side of the filter 103 by the return flow path R3 is filtered through the filter 103 and the filter 104 in the process of flowing again through the flow path S3. This process is called circulation filtration. The filtering device 300 can perform the circulation filtration, and as a result, a chemical liquid having further improved defect inhibition performance is easily obtained.

In FIG. 3, the return flow path R3 is formed only of piping. However, the return flow path R3 may be formed of piping and one or two or more tanks (the form of the tank will be described later).

Third Modification Example of Filtering Device According to First Embodiment

Figure 4:
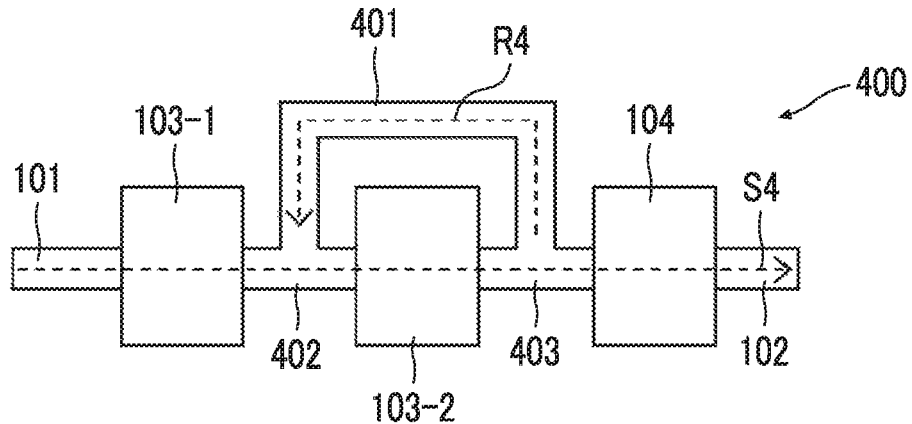
FIG. 4 is a schematic view illustrating a third modification example of the filtering device according to the first embodiment of the present invention.

FIG. 4 is a schematic view illustrating a third modification example of the filtering device according to the first embodiment of the present invention. A filtering device 400 includes an inlet portion 101, an outlet portion 102, a filter 103-1 as a filter BU, a filter 103-2 (reference filter) as the filter BU, a filter 104 as a filter A, and a flow path S4 which includes the filter 103-1, the filter 103-2, and the filter 104 arranged in series between the inlet portion 101 and the outlet portion 102 and extends from the inlet portion 101 to the outlet portion 102.

In the filtering device 400, the inlet portion 101, the filter 103-1, a piping 402, the filter 103-2, a piping 403, the filter 104, and the outlet portion 102 form the flow path S4.

In the filtering device 400, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device 400 has a return flow path R4 capable of returning the liquid to be purified to a position, which is on the downstream side of the filter 103-1 and on the upstream of the filter 103-2 (reference filter) on the flow path S4, from the downstream side of the filter 103-2 (reference filter) on the flow path S4. Specifically, the filtering device 400 has a piping 401 for return, and the piping 401 forms a return flow path R4. One end of the piping 401 is connected to the flow path S4 on the downstream side of the filter 103-2 and the other end thereof is connected to the flow path S2 on the upstream side of the filter 103-2. On the return flow path R4, a pump, a damper, a valve, and the like not shown in the drawing may be arranged.

The liquid to be purified that has been returned to a position, which is the downstream side of the filter 103-1 in the flow path S4 and the upstream side of the filter 103-2 in the flow path S4, through the return flow path R4 is filtered through the filter 103-2 in the process of flowing again through the flow path S4. The filtering device 400 can perform circulation filtration. As a result, a chemical liquid having further improved defect inhibition performance can be easily obtained.

In the filtering device shown in FIG. 4, the return flow path R4 is formed which is capable of returning the liquid to be purified to the upstream side of the filter 103-2 from the downstream side of the filter 103-2, that is, the upstream side of the filter 104 in the flow path S4. The liquid to be purified is returned as described above in a case where the filter 103-2 is used as a reference filter among the filter 103-1, the filter 103-2, and the filter 104. However, the filtering device according to the present embodiment is not limited thereto, and may be used other filters as a reference filter. That is, for example, in a case where the filter 104 is used as a reference filter, in the filtering device, a return flow path may be formed which is capable of returning the liquid to be purified to the upstream side of the filter 104 in the flow path S4 (the liquid may be returned to the downstream side of the filter 103-2 or the downstream side of the filter 103-1) from the downstream side of the filter 104 in the flow path S4; and in a case where the filter 103-1 is used as a reference filter, in the filtering device, a return flow path may be formed which is capable of returning the liquid to be purified to the upstream side of the filter 103-1 from the downstream side of the filter 103-1.

In a case where the filtering device has at least one filter BU, the form of the filter A is not particularly limited. However, the filter A is preferably the filter A2 (having a graft chain including a neutral group) according to the second embodiment described above. In other words, in a case where the filtering device has the filter A2, it is preferable that the filtering device has the filter BU.

Second Embodiment

Figure 5:
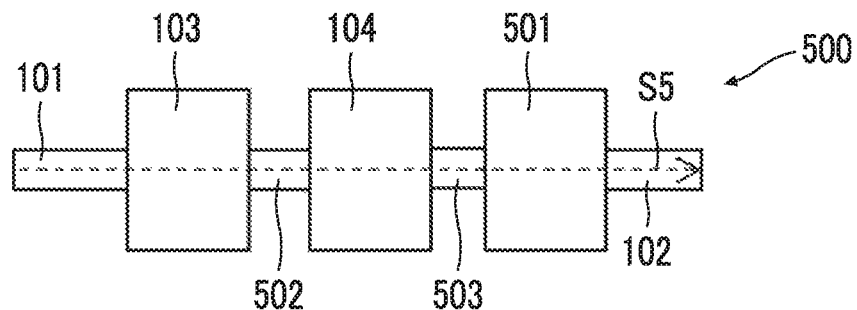
FIG. 5 is a schematic view illustrating a filtering device according to a second embodiment of the present invention.

FIG. 5 is a schematic view illustrating a filtering device according to a second embodiment of the present invention. A filtering device 500 includes the filter 103 as the filter BU, a filter 501 (filter BD), which is a filter different from the filter A and disposed on the downstream side of the filter A on the flow path, and the filter 104 as the filter A between the inlet portion 101 and the outlet portion 102, in which the filter 501, the filter 103, and the filter 104 are connected in series through a piping 502 and a piping 503.

In the filtering device 500, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

<Filter BD>

The filtering device according to the present embodiment has at least one filter BD which is a filter different from the filter A and arranged in series with the filter A on the downstream side of the filter A on the flow path.

The pore size of the filter BD is not particularly limited, and it is possible to use a filter having a pore size generally used for filtering a liquid to be purified. Particularly, the pore size of the filter is preferably equal to or smaller than 200 nm, more preferably equal to or smaller than 20 nm, even more preferably equal to or smaller than 10 nm, particularly preferably equal to or smaller than 5 nm, and most preferably equal to or smaller than 3 nm. The lower limit thereof is not particularly limited, but is generally preferably equal to or greater than 1 nm from the viewpoint of productivity.

The inventors of the present invention have found that in a case where a liquid to be purified is filtered using the filter A, sometimes fine particles are generated due to the filter A and mixed into the liquid to be purified. This tendency is particularly marked in a case where the resin contained in the resin layer has the ion exchange group described above. The filtering device according to the present embodiment has the filter BD on the downstream side of the filter A on the flow path. Therefore, the fine particles resulting from the filter A can be separated from the liquid to be purified by filtration, and a chemical liquid having further improved defect inhibition performance is easily obtained.

Although the filtering device in FIG. 5 has one filter BD, the filtering device according to the present embodiment may have a plurality of filters BD. In this case, the relationship between the pore sizes of the plurality of filters BD is not particularly limited. However, in view of easily obtaining a chemical liquid having further improved defect inhibition performance, it is preferable that a filter BD disposed on the downmost stream side on the flow path has the smallest pore size. Furthermore, although the filtering device in FIG. 5 has the filter BU (filter 103), the filtering device according to the embodiment of the present invention is not limited thereto and may not have the filter 103. Particularly, in a case where the resin contained in the resin layer has an ion exchange group (in a case where the filter A is the filter A1), the filtering device may not have the filter BU. Although the filtering device in FIG. 5 has a return flow path capable of returning a liquid to be purified, the filtering device according to the present embodiment may have a return flow path capable of returning a liquid to be purified to a position, which is the upstream side of a reference filter and the upstream side or downstream side of the filter A, from the downstream side of the reference filter, in which the reference filter consists of any of the filters BD each described above as "at least one filter BD".

The relationship between the pore size of the filter A and the pore size of the filter BD is not particularly limited, but it is preferable that the pore size of the filter BD is smaller than the pore size of the filter A. As described above, according to the examination of the inventors of the present invention, it has been found that in a case where a liquid to be purified is allowed to flow through the filter A, sometimes fine particles resulting from the material of the filter A are mixed into the liquid to be purified. In a case where the pore size of the filter BD is smaller than the pore size of the filter A, the fine particles mixed into the liquid to be purified can be more efficiently removed from the liquid.

The material of the filter BD is not particularly limited, and may be the same as or different from the material of the filter A. Particularly, in view of obtaining a filtering device having further improved effects of the present invention, it is preferable that the filter BD contains a material component different from the component (material component) constituting the material of the filter A.

Especially, in view of obtaining a filtering device having further improved effects of the present invention, the filter BD preferably contains, as a material component, at least one kind of compound selected from the group consisting of polyolefin, polyamide, polyfluorocarbon, polystyrene, polysulfone, and polyethersulfone, more preferably consists of at least one kind of compound selected from the group consisting of polyolefin, polyamide, and polyfluorocarbon, and even more preferably contains at least one kind of compound selected from the group consisting of ultra-high-molecular-weight polyethylene (UPE), nylon, and PTFE.

Furthermore, the filtering device may have a plurality of filters BD arranged in series on the flow path. The material component of the filter BD disposed on the downmost stream side is not particularly limited. However, the filter BD preferably contains PTFE and more preferably consists of PTFE. In a case where the filter BD consisting of PTFE is disposed in the downmost stream, the filter that is disposed between the downstream side of the filter A and the filter BD disposed in the downmost stream is not particularly limited. However, it is preferable that the filter disposed at such a position contains, as a material component, at least one kind of compound selected from the group consisting of nylon and ultra-high-molecular-weight polyethylene.

In a case where the filtering device has at least one filter BD, the form of the filter A is not particularly limited. However, the filter A is preferably the filter A1 (having a graft chain including an ion exchange group) according to the second embodiment described above. In other words, in a case where the filtering device has the filter A1, it is preferable that the filtering device has the filter BD.

Third Embodiment

Figure 6:
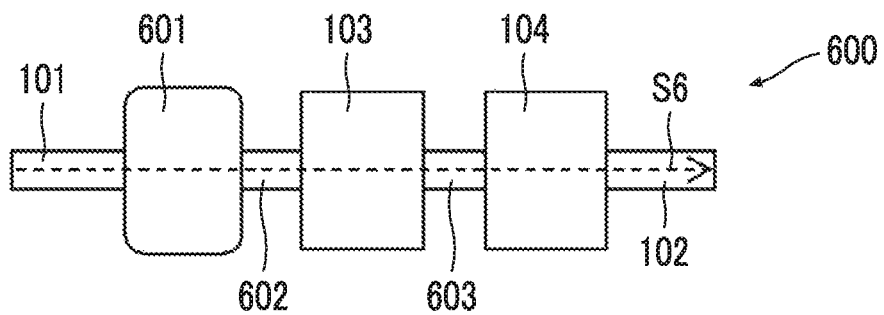
FIG. 6 is a schematic view illustrating a filtering device according to a third embodiment of the present invention.

FIG. 6 is a schematic view illustrating a filtering device according to a third embodiment of the present invention.

A filtering device 600 further includes a tank 601 arranged in series with a filter A on the upstream side of the filter 103 (filter BU) on a flow path S6 between the inlet portion 101 and the outlet portion 102. The tank 601, the filter 103 (filter BU), and the filter 104 (filter A) are arranged in series through a piping 602 and a piping 603. The tank 601 constitutes a flow path S6 together with the filters, pipings, and the like described above.

In the filtering device 600, the form of each filter, piping, and the like are the same as those of the filtering device according to the first embodiment described above. In the following section, only the parts different from the first embodiment will be described. Therefore, the matters that are not described below are the same as those of the filtering device according to the first embodiment. The filter 104 as the filter A is disposed on the downstream side of the filter 103 as the filter BU on the flow path S6. However, in the filtering device according to the present embodiment, the filter 104 as the filter A may be arranged in series with other filters by being disposed on the upstream side of the filter B on the flow path S6. That is, the filtering device having the filter A and the filter BD may have a tank arranged in series with other filters by being disposed on the upstream side of the filter A.

The filtering device according to the present embodiment has a tank on the upstream side of the filter 103 on the flow path S6. Therefore, the liquid to be purified that will flow through the filter 103 can be temporarily retained in the flow path and can be homogenized. As a result, a chemical liquid having further improved defect inhibition performance is obtained. Particularly, in a case where circulation filtration described above is performed, the filter 103 (filter BU) or the filter 104 (filter A) on the flow path S6 is used as a reference filter, and the liquid to be purified is returned to the upstream side of the reference filter on the flow path S6 from the downstream side of the reference filter, the tank 601 can be used to receive the returned liquid to be purified. In a case where the tank 601 is used as described above, the returned liquid to be purified can be temporarily retained in the tank, homogenized, and passed again through the filter 103. Therefore, a chemical liquid having further improved defect inhibition performance is obtained.

The material of the tank 601 is not particularly limited, and the same material as the material of the housing described above can be used. It is preferable that at least a portion of the liquid contact portion of the tank 601 (preferably 90% or more of the surface area of the liquid contact portion, and more preferably 99% or more of the surface area of the liquid contact portion) consists of the anticorrosive material which will be described later.

Fourth Embodiment

Figure 7:
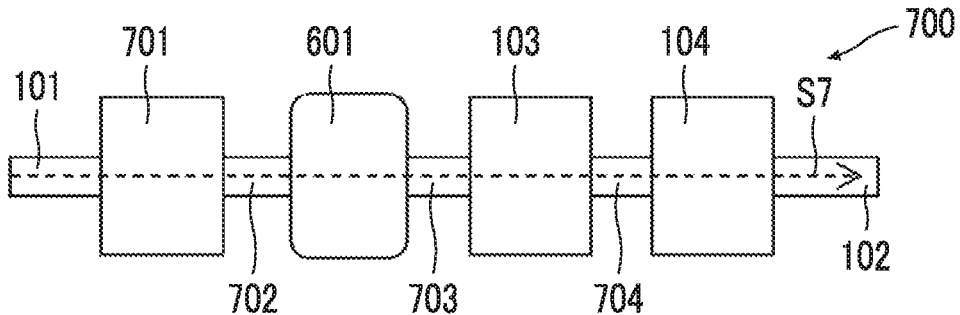
FIG. 7 is a schematic view illustrating a filtering device according to a fourth embodiment of the present invention.

FIG. 7 is a schematic view illustrating a filtering device according to a fourth embodiment of the present invention.

The filtering device 700 has a filter 103 as a filter BU, a tank 601, and a filter 701 disposed on the upstream side of the tank 601, between an inlet portion 101 and an outlet portion 102.

In the filtering device 700, the inlet portion 101, the filter 701, a piping 702, the tank 601, a piping 703, the filter 103 (filter BU), a piping 704, the filter 104 (filter A), and the outlet portion 102 form a flow path S7.

In the filtering device 700, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filter 701 is a filter which is disposed on the upstream side of the tank 601 on the flow path S7 and has a pore size equal to or greater than 20 nm. In the filtering device according to the present embodiment, a filter having a predetermined pore size is disposed on the upstream side of the tank 601 on the flow path S7. Therefore, impurities and the like contained in the liquid to be purified flowing into the filtering device from the inlet portion 101 can be removed in advance by using the filter 701. Accordingly, it is possible to further reduce the amount of impurities mixed into the flow path S7 after the piping 702. As a result, it is possible to further extend the pot life of the subsequent filter A and filter B. Consequently, with the filtering device described above, it is possible to stably manufacture a chemical liquid having further improved defect inhibition performance.

The form of the filter 701 (filter C) is not particularly limited, and the filter 701 may be the same filter as the filter A described above or a different filter (filter BU). Particularly, in view of easily obtaining a chemical liquid having further improved defect inhibition performance, the filter C is preferably a filter different from the filter A. Especially, as the material and pore structure of the filter C, those described as the material and pore structure of the filter BU or filter BD are preferable.

Particularly, in view of obtaining a filtering device having further improved effects of the present invention, the filter C is preferably the filter G described above.

[Method for Manufacturing Chemical Liquid]

The method for manufacturing a chemical liquid according to an embodiment of the present invention is a chemical liquid manufacturing method for obtaining a chemical liquid by purifying a liquid to be purified. The method has a filtration step of filtering a liquid to be purified by using the filtering device described above so as to obtain a chemical liquid.

[Liquid to be Purified]

The liquid to be purified to which the method for manufacturing a chemical liquid according to the embodiment of the present invention can be applied is not particularly limited. However, it is preferable that the liquid to be purified contains a solvent. Examples of the solvent include an organic solvent, and water, and the like. It is preferable that the liquid to be purified contains an organic solvent. In the following description, the liquid to be purified will be divided into an organic solvent-based liquid to be purified in which the content of an organic solvent (total content in a case where the liquid to be purified contains a plurality of organic solvents) with respect to the total mass of solvents contained in the liquid to be purified is greater than 50% by mass, and an aqueous liquid to be purified in which the content of water with respect to the total mass of solvents contained in the liquid to be purified is greater than 50% by mass.

<Organic Solvent-Based Liquid to be Purified>

(Organic Solvent)

The organic solvent-based liquid to be purified contains a solvent, in which the content of the organic solvent is equal to or greater than 50% by mass with respect to the total mass of solvents contained in the liquid to be purified.

The organic solvent-based liquid to be purified contains an organic solvent. The content of the organic solvent in the liquid to be purified is not particularly limited, but is preferably equal to or greater than 99.0% by mass with respect to the total mass of the liquid to be purified in general. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the liquid to be purified in an amount greater than 10,000 ppm by mass with respect to the total mass of the liquid to be purified. That is, in the present specification, a liquid organic compound contained in the liquid to be purified in an amount greater than 10,000 ppm by mass with respect to the total mass of the liquid to be purified corresponds to an organic solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, for example, those described in JP2016-057614A, JP2014-219664A, JP2016-138219A, and JP2015-135379A may also be used.

As the organic solvent, at least one kind of compound is preferable which is selected from the group consisting of propylene glycol monomethyl ether (PGMM), propylene glycol monoethyl ether (PGME), propylene glycol monopropyl ether (PGMP), ropylene glycol monomethyl ether acetate (PGMEA), ethyl lactate (EL), methyl methoxypropionate (MPM), cyclopentanone (CyPn), cyclohexanone (CyHe), γ-butyrolactone (yBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, 1-hexanol, decane, and 2-heptanone (MAK).

The type and content of the organic solvent in the liquid to be purified can be measured using a gas chromatography mass spectrometer.

(Other Components)

The liquid to be purified may contain other components in addition to the above components. Examples of those other components include an inorganic substance (such as metal ions, metal particles, and metal oxide particles), a resin, an organic substance other than a resin, water, and the like.

Inorganic Substance

The liquid to be purified may contain an inorganic substance. The inorganic substance is not particularly limited, and examples thereof include metal ions, metal-containing particles, and the like.

The form of the metal-containing particles is not particularly limited as long as the particles contain metal atoms. For example, the metal-containing particles are in the form of simple metal atoms, compounds containing metal atoms (hereinafter, also referred to as "metal compound"), a complex of these, and the like. Furthermore, the metal-containing particles may contain a plurality of metal atoms.

The complex is not particularly limited, and examples thereof include a so-called core-shell type particle having a simple metal atom and a metal compound covering at least a portion of the simple metal atom, a solid solution particle including a metal atom and another atom, a eutectic particle including a metal atom and another atom, an aggregate particle of a simple metal atom and a metal compound, an aggregate particle of different kinds of metal compounds, a metal compound in which the composition thereof continuously or intermittently changes toward the center of the particle from the surface of the particle, and the like.

The atom other than the metal atom contained in the metal compound is not particularly limited, and examples thereof include a carbon atom, an oxygen atom, a nitrogen atom, a hydrogen atom, a sulfur atom, a phosphorus atom, and the like.

The metal atom is not particularly limited, and examples thereof include a Fe atom, an Al atom, a Cr atom, a Ni atom, a Pb atom, a Zn atom, a Ti atom, and the like.

The metal-containing particles may contain one kind of each of the aforementioned metal atoms singly or may contain two or more kinds of the aforementioned metal atoms in combination.

The particle size of the metal-containing particles is not particularly limited. Generally, the particle size thereof is about 1 to 500 nm in many cases. From the viewpoint of obtaining a chemical liquid having further improved defect inhibition performance, it is preferable to control the number of metal-containing particles having a particle size of 1 to 20 nm.

The inorganic substance may be added to the liquid to be purified, or may be unintentionally mixed into the liquid to be purified in the manufacturing process. Examples of the case where the inorganic substance is unintentionally mixed into the liquid to be purified in the manufacturing process of the chemical liquid include, but are not limited to, a case where the inorganic substance is contained in a raw material (for example, an organic solvent) used for manufacturing the chemical liquid, a case where the inorganic substance is mixed into the liquid to be purified in the manufacturing process of the chemical liquid (for example, contamination), and the like.

(Resin)

The liquid to be purified may contain a resin.

The chemical liquid may further contain a resin. As the resin, a resin P having a group which is decomposed by the action of an acid and generates a polar group is more preferable. As such a resin, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also referred to as an "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group leaving by an acid (acid leaving group). Examples of the acid leaving group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

(Formula (AI): Repeating Unit Having Acid-Decomposable Group)

It is preferable that the resin P contains a repeating unit represented by Formula (AI).

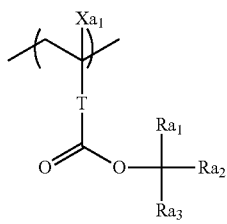

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —CH$_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a —CH$_2$— group, a —(CH$_2$)$_2$— group, or a —(CH$_2$)$_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group having a hetero atom such as a carbonyl group.

As the repeating unit represented by Formula (AI), for example, an embodiment is preferable in which $Ra_1$ is a methyl group or an ethyl group, and $Ra_2$ and $Ra_3$ are bonded to each other to form the cycloalkyl group described above.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

(Repeating Unit Having Lactone Structure)

Furthermore, it is preferable that the resin P contains a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. However, it is preferable to use one kind of repeating unit Q singly.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).

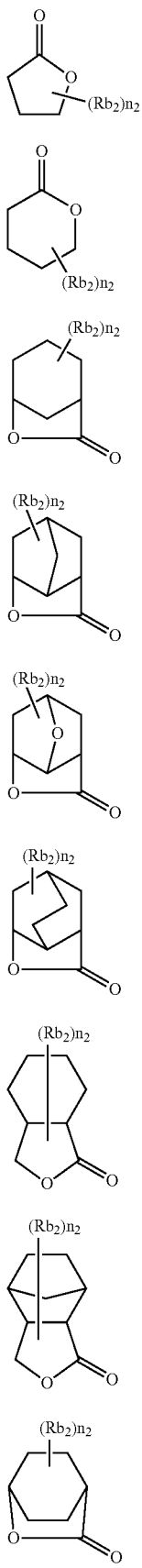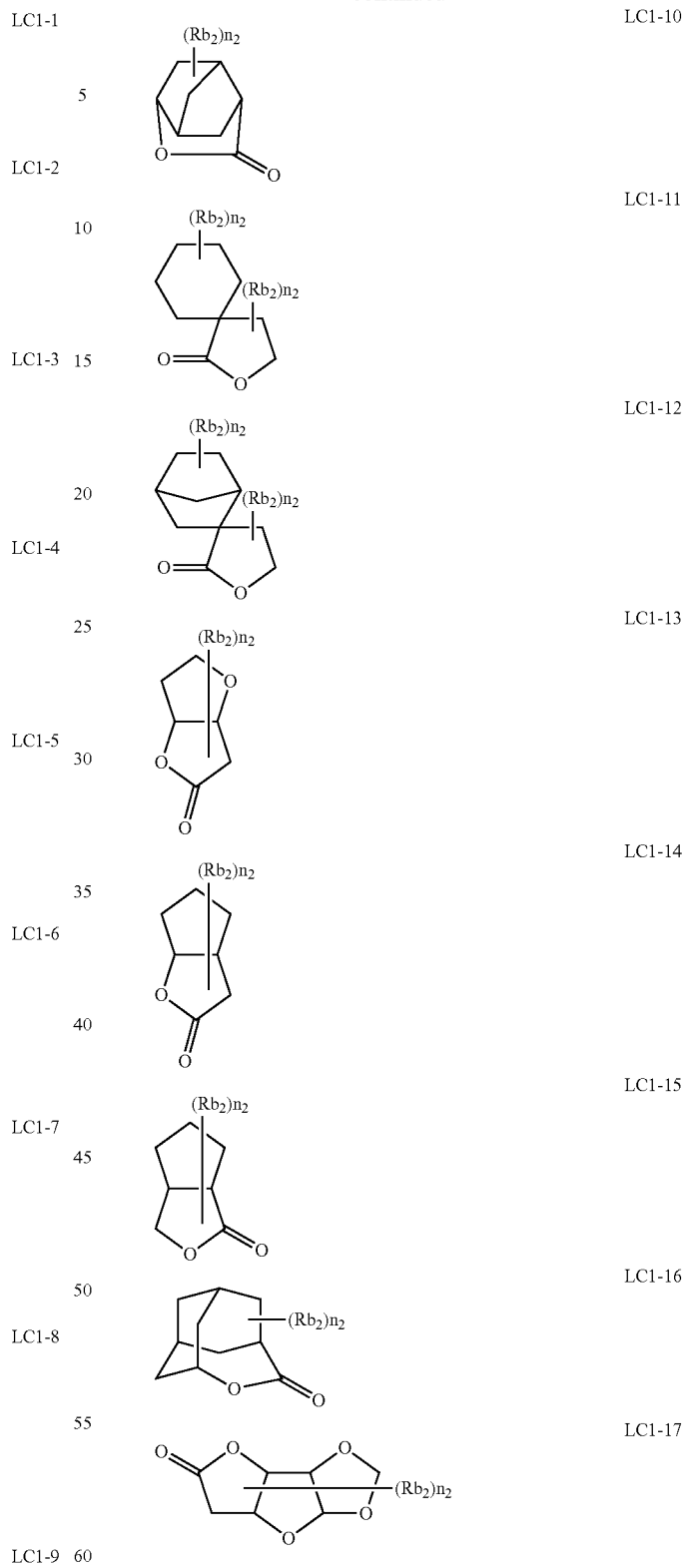
The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and the plurality of substituents ($Rb_2$) may be bonded to each other to form a ring.

(Repeating Unit Having Phenolic Hydroxyl Group)

The resin P may also contain a repeating unit having a phenolic hydroxyl group.

Examples of the repeating unit having a phenolic hydroxyl group include a repeating unit represented by General Formula (I).

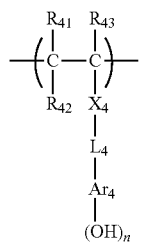

(I)

In the formula, $R_{41}$, $R_{42}$ and $R_{43}$ each independently represent a hydrogen atom, an alkyl group, a halogen atom, a cyano group, or an alkoxycarbonyl group. Here, $R_{42}$ may be bonded to $Ar_4$ to form a ring, and in this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (T) include a fluorine atom, a chlorine atom, a bromine atom, and an iodine atom. Among these, a fluorine atom is preferable.

As the alkyl group included in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. In a case where n is 1, the divalent aromatic ring group may have a substituent, and examples thereof include arylene groups having 6 to 18 carbon atoms, such as a phenylene group, a tolylene group, a naphthylene group, and an anthracenylene group, and aromatic ring groups having a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further have a substituent.

Examples of the substituent that the aforementioned alkyl group, cycloalkyl group, alkoxycarbonyl group, alkylene group, and (n+1)-valent aromatic ring group can have include the alkyl group exemplified above as $R_{41}$, $R_{42}$, and $R_{41}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by $R_4$ in —$CONR_{64}$—($R_{64}$ represents a hydrogen atom or an alkyl group) represented by $X_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may have a substituent. Among these, an alkyl group having 8 or less carbon atoms is more preferable.

$X_4$ is preferably a single bond, —COO— or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, and an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diamantyl group, or a norbornane group. As the polar group, a hydroxyl group or a cyano group is preferable.

In a case where the resin P contains a repeating unit containing an organic group having a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Represented by General Formula (VI))

The resin P may also contain a repeating unit represented by General Formula (VI).

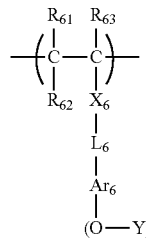

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$'s represents a group which leaves by the action of an acid.

n represents an integer of 1 to 4.

As the group $Y_2$ which leaves by the action of an acid, a structure represented by General Formula (VI-A) is preferable.

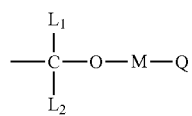

(VI-A)

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may have a hetero atom, an aryl group which may have a hetero atom, an amino group, an ammonium group, a mercapto group, a cyano group, or an aldehyde group.

At least two out of Q, M and L may be bonded to each other to form a ring (preferably a 5- or 6-membered ring).

The repeating unit represented by General Formula (VI) is preferably a repeating unit represented by General Formula (3).

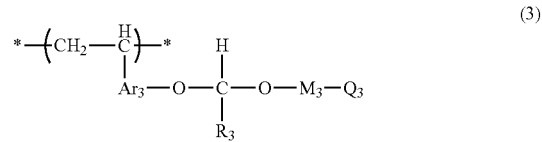

(3)

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may be bonded to each other to form a ring.

The aromatic ring group represented by $Ar_3$ is the same as $Ar_6$ in General Formula (VI) in which n is 1. The aromatic ring group is preferably a phenylene group or a naphthylene group, and more preferably a phenylene group.

(Repeating Unit Having Silicon Atom on Side Chain)

The resin P may further contain a repeating unit having a silicon atom on a side chain. Examples of the repeating unit having a silicon atom on a side chain include a (meth) acrylate-based repeating unit having a silicon atom, a vinyl-based repeating unit having a silicon atom, and the like. The repeating unit having a silicon atom on a side chain is typically a repeating unit having a group, which has a silicon atom, on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and $R^1$ each independently represent a monovalent substituent. * represents a bond.

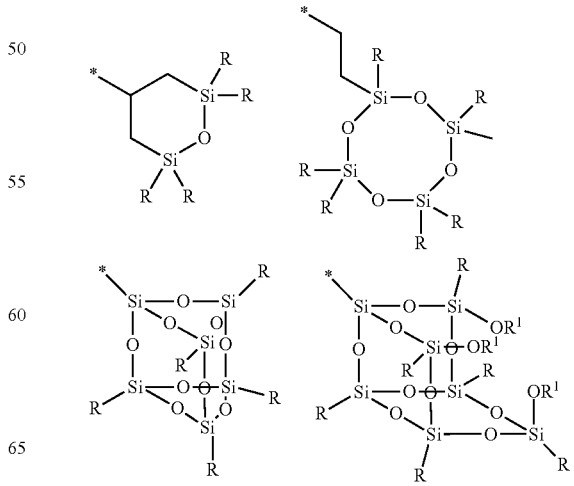

[Chemical structures of silsesquioxane cage compounds with R substituents shown]

As the repeating unit having the aforementioned group, for example, a repeating unit derived from an acrylate or methacrylate compound having the aforementioned group or a repeating unit derived from a compound having the aforementioned group and a vinyl group is preferable.

In a case where the resin P has the repeating unit having a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be contained in the chemical liquid, any known components can be used.

<Aqueous Liquid to be Purified>

The aqueous liquid to be purified contains water in an amount greater than 50% by mass with respect to the total mass of solvents contained in the liquid to be purified. The content of water is preferably 50% to 95% by mass.

The water is not particularly limited, but it is preferable to use ultrapure water used for manufacturing semiconductors. The ultrapure water is more preferably used after being further purified such that the inorganic anions, metal ions, and the like are reduced. The purification method is not particularly limited, but is preferably purification using a filtration membrane or an ion-exchange membrane and purification by distillation. Furthermore, for example, it is preferable to perform purification by the method described in JP2007-254168A.

(Oxidant)

The aqueous liquid to be purified may contain an oxidant. As the oxidant, known oxidants can be used without particular limitation. Examples of the oxidant include hydrogen peroxide, a peroxide, nitric acid, nitrate, iodate, periodate, hypochlorite, chlorite, chlorate, perchlorate, persulfate, dichromate, permanganate, aqueous ozone, a silver (II) salt, an iron (III) salt, and the like.

The content of the oxidant is not particularly limited, but is preferably equal to or greater than 0.1% by mass and equal to or smaller than 99.0% by mass with respect to the total mass of the aqueous liquid to be purified. One kind of oxidant may be used singly, or two or more kinds of oxidants may be used in combination. In a case where two or more kinds of oxidants are used in combination, the total content thereof is preferably within the above range.

(Inorganic Acid)

The aqueous liquid to be purified may contain an inorganic acid. As the inorganic acid, known inorganic acids can be used without particular limitation. Examples of the inorganic acid include sulfuric acid, phosphoric acid, hydrochloric acid, and the like. The inorganic acid is not included in the oxidant described above.

The content of the inorganic acid in the liquid to be purified is not particularly limited, but is preferably equal to or greater than 0.01% by mass and equal to or smaller than 99% by mass with respect to the total mass of the liquid to be purified.

One kind of inorganic acid may be used singly, or two or more kinds of inorganic acids may be used in combination. In a case where two or more kinds of inorganic acids are used in combination, the total content thereof is preferably within the above range.

(Anticorrosive)

The aqueous liquid to be purified may contain an anticorrosive. As the anticorrosive, known anticorrosives can be used without particular limitation. Examples of the anticorrosive include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyl triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyl tetrazole, bismuthiol I, 1,3-dimethyl-2-imidazolidinone, 1,5-pentamethylenetetrazole, 1-phenyl-5-mercaptotetrazole, diaminomethyltriazine, imidazolinethion, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, thiourea, 1,1,3,3-tetramethylurea, urea, urea derivatives, uric acid, potassium ethylxanthate, glycine, dodecyl phosphate, iminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced), cysteine, cystine, thiophene, mercaptopyridine N-oxide, thiamine HCl, tetraethylthiuram disulfide, 2,5-dimercapto-1,3-thiadiazole ascorbic acid, catechol, t-butyl catechol, phenol, and pyrogallol.

As the anticorrosive, it is also possible to use aliphatic carboxylic acids such as dodecanoic acid, palmitic acid, 2-ethylhexanoic acid, and cyclohexanoic acid; carboxylic acids having a chelating ability such as citric acid, malic acid, oxalic acid, malonic acid, succinic acid, itaconic acid, maleic acid, glycolic acid, mercaptoacetic acid, thioglycolic acid, salicylic acid, sulfosalicylic acid, anthranilic acid, N-methylanthranilic acid, 3-amino-2-naphthoic acid, 1-amino-2-naphthoic acid, 2-amino-1-naphthoic acid, 1-aminoanthraquinone-2-carboxylic acid, tannic acid, and gallic acid; and the like.

Examples of the anticorrosive also include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate salt, a polyoxyethylene alkyl ether phosphate salt, and a polyoxyethylene allyl phenyl ether phosphate salt; cationic surfactants such as oleylamine acetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; nonionic surfactants of a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyaikylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris (polyoxyalkylene) ether.

Examples of commercial products of the above anticorrosives include NEWCALGEN FS-3PG (manufactured by TAKEMOTO OIL & FAT Co., Ltd.), PHOSTEN HLP-1 (manufactured by Nikko Chemicals Co., Ltd.), and the like.

As the anticorrosive, a hydrophilic polymer can also be used.

Examples of the hydrophilic polymer include polyglycols such as polyethylene glycol, an alkyl ether of polyglycols, polyvinyl alcohol, polyvinyl pyrrolidone, polysaccharides such as alginic acid, carboxylic acid-containing polymers such as polymethacrylic acid and polyacrylic acid, polyacrylamide, polymethacrylamide, polyethyleneimine, and the like. Specific examples of these hydrophilic polymers include the water-soluble polymers described in paragraphs "0042" to "0044" in JP2009-088243A and paragraph "0026" in JP2007-194261A.

As the anticorrosive, a cerium salt can also be used.

As the cerium salt, known cerium salts can be used without particular limitation. Examples of the cerium salt include trivalent cerium salts such as cerium acetate, cerium nitrate, cerium chloride, cerium carbonate, cerium oxalate, and cerium sulfate and tetravalent cerium salts such as cerium sulfate, cerium ammonium sulfate, cerium ammonium nitrate, diammonium cerium nitrate, cerium hydroxide, and the like.

The anticorrosive may include substituted or unsubstituted benzotriazole. Suitable substituted benzotriazole includes, but is not limited to, benzotriazole substituted with an alkyl group, an aryl group, a halogen group, an amino group, a nitro group, an alkoxy group, or a hydroxyl group. The substituted benzotriazole also includes compounds fused by one or more aryl (for example, phenyl) or heteroaryl groups.

The content of the anticorrosive in the liquid to be purified with respect to the total mass of the chemical liquid is preferably adjusted to 0.01% to 5% by mass, more preferably adjusted to 0.05% to 5% by mass, and even more preferably adjusted to 0.1% to 3% by mass.

One kind of anticorrosive may be used singly, or two or more kinds of anticorrosives may be used in combination. In a case where two or more kinds of anticorrosives are used in combination, the total content thereof is preferably within the above range.

(Organic Solvent)

The aqueous liquid to be purified may contain an organic solvent. The organic solvent is not particularly limited, and is the same as the aforementioned organic solvent contained in the organic solvent-based liquid to be purified. In a case where the liquid to be purified contains an organic solvent, the content of the organic solvent is preferably 5% to 35% by mass with respect to the total mass of solvents contained in the liquid to be purified.

It is preferable that the filtering device according to the embodiment of the present invention satisfies at least one relationship selected from the group consisting of the following (1) to (4) with a liquid to be purified.

<Relationship 1 with Liquid to be Purified>

In view of obtaining a chemical liquid having further improved defect inhibition performance, it is preferable that the filtering device according to the embodiment of the present invention is used for purifying a liquid to be purified satisfying the following condition 1. Particularly, in a case where the filtering device has the filter BD on the downstream side of the filter A in the flow path, it is clearly preferable that the filtering device is used for purifying the liquid to be purified described above.

In other words, in a case where the filtering device has the filter BD on the downstream side of the filter A in the flow path, it is more preferable that the filtering device is used for purifying a liquid to be purified satisfying the following condition 1.

Condition 1: in a case where a contribution rate of the polarization element in the Hansen solubility parameters of an eluate eluted from the filter A by reflux extraction using methanol as an extraction solvent is $\Delta Pe$, and a contribution rate of the polarization element in the Hansen solubility parameters of a liquid to be purified is $\Delta Ps$, the liquid to be purified satisfies Expression;

$$|\Delta Ps - \Delta Pe| \le 10.$$

In the present specification, the Hansen solubility parameters mean those described in "Hansen Solubility Parameters: A Users Handbook" (Second Edition, pp. 1-310, CRC Press, 2007), and the like.

That is, the Hansen solubility parameters describe solubility by using multi-dimensional vectors (a dispersion element ($\delta d$), a (dipole-dipole) polarization element ($\delta p$), and a hydrogen bond element ($\delta h$)). These three parameters can be considered as the coordinates of a point in a three-dimensional space called Hansen solubility parameter space.

In order to determine the Hansen solubility parameters of a certain substance, the target substance is dissolved in a plurality of solvents having known Hansen solubility parameters, and the Hansen solubility parameters of the solvent in which the target substance dissolves and the Hansen solubility parameters of the solvent in which the target substance does not dissolve are plotted in the Hansen space. At this time, a sphere constituted with a set of plots of the Hansen solubility parameters of the solvent in which the target substance dissolves is called Hansen solubility sphere, and the radius thereof is defined as an interaction radius. In addition, the center of the Hansen solubility sphere is the Hansen solubility parameters of the target substance. The interaction radius and the Hansen solubility parameters can be calculated using, for example, Hansen Solubility Parameters in Practice (HSPiP; computer software).

The contribution rate $\Delta P$ of the polarization element as a Hansen solubility parameter is a value defined by the following equation.

$$\Delta P = \{\delta p / (\delta d + \delta p + \delta h)\} \times 100 \quad \text{(Equation)}$$

That is, $\Delta Ps$ in Expression; $|\Delta Ps - \Delta Pe| \leq 10$ is represented by the following equation using the dispersion element $ds$, the polarization element $\delta ps$, and the hydrogen bond element $\delta hs$ of the Hansen solubility parameters of the liquid to be purified.

$$\Delta Ps = \{\delta ps / (\delta ds + \delta ps + \delta hs)\} \times 100$$

$\Delta Pe$ is represented by the following equation using the dispersion element $\delta de$, the polarization element $\delta pe$, and the hydrogen bond element $\delta he$ of the Hansen solubility parameters of the eluate.

$$\Delta Pe = \{\delta pe / (\delta de + \delta pe + \delta he)\} \times 100$$

As a result of intensive examinations, the inventors of the present invention have found that in a case where a liquid to be purified is filtered using the filter A, sometimes an organic compound is unintentionally mixed into the liquid to be purified from the filter A. In a case where the organic compound mixed into the liquid to be purified easily dissolves in the liquid to be purified, that is, in a case where the difference in the contribution rate of the polarization element as a Hansen solubility parameter between the liquid to be purified and the eluate is smaller ($|\Delta Ps - \Delta Pe| \leq 10$), it is preferable that the organic compound in the liquid to be purified is separated and removed again by using the filter BD disposed on the downstream side of the filter A.

In a case where the liquid to be purified is a mixture of two or more kinds of solvents, $\delta h$ of the liquid to be purified is determined by the sum of the products of $\delta h$ of each solvent and the volume fraction of each solvent. That is, $\delta h$ is represented by the following equation.

($\delta h$ of liquid to be purified)=$\Sigma\{(\delta h$ of each solvent)$\times$ (volume fraction of each solvent)$\}$ For example, in a case where the solvent contained in the liquid to be purified is a 3:7 (based on mass) mixed solution of PGMEA and PGME, $\delta h$ of the liquid to be purified is calculated by determining the volume ratio of each solvent in the mixed solvent from the density of PGMEA and PGME.

The same is applied to $\Delta Ps$.

At this time, the pore size of the filter BD is not particularly limited, but it is preferable that the pore size of at least one filter BD is smaller than the pore size of the filter A. More specifically, the pore size of at least one filter BD is preferably equal to or smaller than 20 nm, more preferably equal to or smaller than 10 nm, and even more preferably less than 10 nm.

The material of the filter BD is as described above and is not particularly limited. However, in view of obtaining a filtering device having further improved effects of the present invention, the filter BD preferably contains, as a material component, at least one kind of compound selected from the group consisting of polyolefin, polyamide, polyimide, polyamideimide, and polyfluorocarbon, more preferably contains at least one kind of compound selected from the group consisting of UPE, nylon, and PTFE, and particularly preferably contains PTFE.

The aforementioned eluate means a compound eluted from the filter A by reflux extract using methanol as an extraction solvent. More specifically, the eluate means a compound detected by extraction and measurement performed by the following method.

First, the filter is shredded to obtain a sample for extraction. Then, methanol is added to the sample such that the ratio of the mass of the samples to the volume of the methanol at 25° C. is 1/30 (w: mass/v: volume). Specifically, in a case where the sample weigh 1 g, 30 mL (volume at 25° C.) of methanol is added thereto.

Thereafter, an extract is obtained by performing reflux for 3 hours at 75° C. Subsequently, the obtained extract is concentrated to dryness and redissolved in 1 mL of methanol, thereby obtaining a sample for measurement. The compound contained in this sample for measurement is measured by gas chromatography mass spectrometry, and the eluate is identified by the comparison with blank.

<Relationship 2 with Liquid to be Purified>

In view of obtaining a chemical liquid having further improved defect inhibition performance, it is preferable that the filtering device according to the embodiment of the present invention is used for purifying a liquid to be purified satisfying the following condition 2. Particularly, in a case where the filtering device has the filter BU on the upstream side of the filter A in the flow path, it is clearly preferable that the filtering device is used for purifying the liquid to be purified described above.

In other words, in a case where the filtering device has the filter BU on the upstream side of the filter A in the flow path, it is more preferable that the filtering device is used for purifying a liquid to be purified satisfying the following condition 2.

Condition 2: in a case where a contribution rate of the polarization element in the Hansen solubility parameters of an eluate detected by the testing method described above is $\Delta Pe$, and a contribution rate of the polarization element in the Hansen solubility parameters of a liquid to be purified is $\Delta Ps$, the liquid to be purified satisfies Expression;

$$|\Delta Ps - \Delta Pe| > 10.$$

As a result of intensive examinations, the inventors of the present invention have found that in a case where the organic compound mixed into the liquid to be purified hardly dissolves in the liquid to be purified, that is, in a case where the difference in the contribution rate of the polarization element as a Hansen solubility parameter between the liquid to be purified and the eluate is larger ($|\Delta Ps - \Delta Pe| > 10$), by disposing the filter BU having characteristics different from the characteristics of the filter A on the upstream side of the filter A, a chemical liquid having further improved defect inhibition performance is obtained.

At this time, the filter BU to be used is not particularly limited. However, the filter BU more preferably contains, as a material component, at least one kind of compound selected from the group consisting of polyolefin (particularly preferably ultra-high-molecular-weight polyethylene), polyfluorocarbon (particularly preferably PTFE), and polyamide (particularly preferably nylon). In a case where the filter BU contains the material component described above, ionic impurities and particle-like impurities that can exist in the liquid to be purified can be more efficiently removed using each of the filters, and it is more difficult for the components derived from the filter A to be mixed into the chemical liquid to be obtained. As a result, the obtained chemical liquid has further improved defect inhibition performance.

<Relationship 3 with Liquid to be Purified>

In a case where the filter A of the filtering device according to the embodiment of the present invention includes a resin layer having a resin which has an ion exchange group, and the ion exchange group is a cation exchange group, the filtering device is preferably used for purifying a liquid to be purified having a Hansen solubility parameter equal to or higher than 10 $(MPa)^{1/2}$ for the hydrogen bond element or used for purifying a liquid to be purified having a Hansen solubility parameter less than 10 $(MPa)^{1/2}$ for the hydrogen bond element and having a C log P value equal to or greater than 1.0.

The C log P value means a value calculated by a program "CLOGP" available from Daylight Chemical Information System, Inc. This program provides a value of "calculated log P" calculated by the fragment approach (see the following documents) of Hansch and Leo. The fragment approach is based on the chemical structure of a compound. In this method, the chemical structure is divided into partial structures (fragments), and degrees of contribution to log P that are assigned to the fragments are summed up, thereby estimating the log P value of the compound. Details of the method are described in the following documents. In the present invention, a C log P value calculated by a program C LOG P v 4.82 is used.

A. J. Leo, Comprehensive Medicinal Chemistry, Vol. 4, C. Hansch, P. G Sammnens, J. B. Taylor and C. A. Ramsden, Eds., p. 295, Pergamon press, 1990, C. Hansch & A. J. Leo. Substituent Constants For Correlation Analysis in Chemistry and Biology. John Wiley & Sons. A. J. Leo. Calculating log Poct from structure. Chem. Rev., 93, 1281-1306, 1993.

log P means a common logarithm of a partition coefficient P. log P is a value of physical properties that shows how a certain organic compound is partitioned in an equilibrium of two-phase system consisting of oil (generally, 1-octanol) and water by using a quantitative numerical value. log P is represented by the following equation.

$$\log P = \log(C\text{oil}/C\text{water})$$

In the formula, Coil represents a molar concentration of a compound in an oil phase, and Cwater represents a molar concentration of the compound in a water phase. The greater the positive log P value based on 0, the higher the oil solubility. The greater the absolute value of negative log P, the higher the water solubility. The value of log P is negatively correlated with the water solubility of an organic compound, and widely used as a parameter for estimating the hydrophilicity and hydrophobicity of an organic compound.

Generally, it has been considered that the metal impurities regarded as causing defects of a chemical liquid exist in a liquid to be purified (or a chemical liquid) not in the form of simple cations but in various forms, and thus the metal impurities are difficult to separate and remove.

However, the inventors of the present invention have found that in a case where the filter A in the filtering device according to the embodiment of the present invention includes a resin layer having a resin which has a cation exchange group, and the filtering device is used for purifying a liquid to be purified having a Hansen solubility parameter equal to or higher than 10 $(MPa)^{1/2}$ for the hydrogen bond element, metal impurities are easily removed, and a chemical liquid having further improved defect inhibition performance is obtained.

Although the mechanism is not always clear, the inventors of the present invention assume that in a liquid to be purified having a Hansen solubility parameter equal to or higher than 10 $(MPa)^{1/2}$ for the hydrogen bond element (for example, propylene glycol monomethyl ether; δh=11.6 $(MPa)^{1/2}$), metal impurities may exist in a state where hydrophilic groups (for example, hydroxyl groups) in the liquid to be purified and metal cations are directly coordinated to each other in many cases. Presumably, in this case, provided that the resin in the resin layer has a cation exchange group, the metal impurities could be efficiently removed by adsorption. The above mechanism is speculative, and in a case where the effects are obtained by other mechanisms, the mechanisms are also included in the scope of the present invention.

Furthermore, the inventors of the present invention also have found that in a case where the filter A in the filtering device according to the embodiment of the present invention includes a resin layer having a resin which has a cation exchange group, and the filtering device is used for purifying a liquid to be purified having a Hansen solubility parameter less than 10 $(MPa)^{1/2}$ for the hydrogen bond element and having a C log P value equal to or greater than 1.0, metal impurities are easily removed, and a chemical liquid having further improved defect inhibition performance is obtained.

Although the mechanism is not always clear, the present inventors assume that in a liquid to be purified having a Hansen solubility parameter less than 10 $(MPa)^{1/2}$ for the hydrogen bond element and having a C log P value equal to or greater than 1.0 (for example, butyl acetate; δh=6.3 $(MPa)^{1/2}$; C log P=1.77), the solvation of metal impurities substantially may not occur, and water molecules may hardly exist in the liquid to be purified. The inventors assume that in this case, provided that the resin in the resin layer has a cation exchange group, the metal impurities could be efficiently removed by adsorption. The above mechanism is speculative, and in a case where the effects are obtained by other mechanisms, the mechanisms are also included in the scope of the present invention.

In a case where the liquid to be purified is a mixture of two or more kinds of solvents, C log P of the liquid to be purified is determined by the sum of the products of C log P of each solvent and the mass fraction of each solvent. That is, CloP of the liquid to be purified is represented by the following equation.

$$(C \log P \text{ of liquid to be purified}) = \Sigma\{(C \log P \text{ of each solvent}) \times (\text{mass fraction of each solvent})\}$$

<Relationship 4 with Liquid to be Purified>

In a case where the filter A of the filtering device according to the embodiment of the present invention includes a resin layer having a resin which has an ion exchange group, and the ion exchange group is an anion exchange group, the filtering device is preferably used for purifying a liquid to be purified having a Hansen solubility parameter less than 10 $(MPa)^{1/2}$ for the hydrogen bond element and having a C log P value less than 1.0.

Although the mechanism is not always clear, the inventors of the present invention assume that in a liquid to be purified having a Hansen solubility parameters less than 10 $(MPa)^{1/2}$ for the hydrogen bond element and having a C log P value less than 1.0 (for example, cyclohexanone; $\delta h=5.1$ $(MPa)^{1/2}$; C log P=0.87, PGMEA; $\delta h=6.7$ $(MPa)^{1/2}$; C log P=0.69), the solvation of metal impurities may substantially do not occur, but water molecules may be unintentionally mixed into the liquid to be purified and tend to be coordinated to surround metal ions. By the intensive examinations of the inventors of the present invention, it has been more clearly revealed that in this case, provided that the resin in the resin layer has an anion exchange group, the metal impurities can be efficiently removed from the liquid to be purified by adsorption, although the mechanism is unclear. The above mechanism is speculative, and in a case where the effects are obtained by other mechanisms, the mechanisms are also included in the scope of the present invention.

[Filtration Step]

The method for manufacturing a chemical liquid according to the present embodiment includes a filtration step of filtering the liquid to be purified by using the filtering device described above so as to obtain a chemical liquid.

The filtering device has a flow path formed by arranging the filter A and the filter B in series. The feed pressure of the liquid to be purified supplied to each filter is not particularly limited, but is preferably 0.00010 to 1.0 MPa in general.

Particularly, in view of obtaining a chemical liquid having further improved defect inhibition performance, a feed pressure is preferably 0.00050 to 0.090 MPa, more preferably 0.0010 to 0.050 MPa, and even more preferably 0.0050 to 0.040 MPa.

The filtration pressure affects the filtration accuracy. Therefore, it is preferable that the pulsation of pressure during filtration is as low as possible.

The filtration speed is not particularly limited. However, in view of easily obtaining a chemical liquid having further improved defect inhibition performance, the filtration speed is preferably equal to or higher than 1.0 $L/min/m^2$, more preferably equal to or higher than 0.75 $L/min/m^2$, and even more preferably equal to or higher than 0.6 $L/min/m^2$.

For the filter, an endurable differential pressure for assuring the filter performance (assuring that the filter will not be broken) is set. In a case where the endurable differential pressure is high, by increasing the filtration pressure, the filtration speed can be increased. That is, it is preferable that the upper limit of the filtration speed is generally equal to or lower than 10.0 $L/min/m^2$ although the upper limit usually depends on the endurable differential pressure of the filter.

The temperature at which the liquid to be purified passes through the filter is not particularly limited, but is preferably less than room temperature in general.

The filtration step is preferably performed in a clean environment. Specifically, the filtration step is preferably performed in a clean room that satisfies Class 1000 (Class 6 in ISO14644-1:2015) of Federal Standard (Fed. Std. 209E), more preferably performed in a clean room that satisfies Class 100 (Class 5 in ISO14644-1:2015), even more preferably performed in a clean room that satisfies Class 10 (Class 4 in ISO14644-1: 2015), and particularly preferably performed in a clean room that has a cleanliness (Class 2 or Class 1) equal to or higher than Class 1 (Class 3 in ISO14644-1: 2015).

It is preferable that each step which will be described later is also performed in the clean environment described above.

in a case where the filtering device has a return flow path, the filtration step may be a circulation filtration step. The circulation filtration step is a step of filtering the liquid to be purified by at least the filter A, returning the liquid to be purified having been filtered through the filter A to the upstream of the filter A in the flow path, and filtering again the liquid to be purified through the filter A.

The number of times of the circulation filtration is not particularly limited, but is preferably 1 to 4 in general. By the circulation filtration, the liquid to be purified may be returned to the upstream side of the filter A so as to repeat the filtration by the filter A or may be returned to the upstream side of the filter B (the filter B may be the filter BD or the filter BU) so as to repeat the filtration by the filter B. Furthermore, the return flow path may be adjusted such that the filtration by the filter A and the filtration by the filter B are repeated in combination.

[Other Steps]

The method for manufacturing a chemical liquid according to the present embodiment may include steps other than the above step. Examples of the steps other than the above step include a filter washing step, a device washing step, an electricity removing step, a step of preparing a liquid to be purified, and the like. Hereinafter, each of the steps will be specifically described.

<Filter Washing Step>

The filter washing step is a step of washing the filter A and the filter B before the filtration step. The method of washing the filter is not particularly limited, and examples thereof include a method of immersing the filter in an immersion solution, a method of washing the filter by passing a washing solution through the filter, a combination of these, and the like.

(Method of Immersing Filter in Immersion Solution)

Examples of the method of immersing the filter in the immersion solution include a method of filling a container for immersion with the immersion solution and immersing the filter in the immersion solution.

Immersion Solution

As the immersion solution, known immersion solutions can be used without particular limitation. Particularly, in view of obtaining further improved effects of the present invention, the immersion solution preferably contains water or an organic solvent as a main component, and more preferably contains an organic solvent as a main component. In the present specification, the main component means a component of which the content is equal to or greater than 99.9% by mass with respect to the total mass of the immersion solution. The content of the main component is more preferably equal to or greater than 99.99% by mass.

The organic solvent is not particularly limited, and it is possible to use the organic solvent described above as the organic solvent contained in the liquid to be purified. Particularly, in view of obtaining further improved effects of the present invention, it is preferable that the immersion solution contains at least one kind of organic solvent selected from the group consisting of an ester-based solvent and a ketone-based solvent. Furthermore, these may be used in combination.

Examples of the ester-based solvent include, but are not limited to, ethyl acetate, methyl acetate, butyl acetate, sec-butyl acetate, methoxybutyl acetate, amyl acetate, normal propyl acetate, isopropyl acetate, ethyl lactate, methyl lactate, butyl lactate, and the like.

Examples of the ketone-based solvent include, but are not limited to, acetone, 2-heptanone (MAK), methyl ethyl ketone (MEK), methyl isobutyl ketone, diisobutyl ketone, cyclohexanone, diacetone alcohol, and the like.

The time for which the filter is immersed in the immersion solution is not particularly limited. However, in view of obtaining further improved effects of the present invention, it is preferable that the filter is immersed in the immersion solution for 7 days to 1 year.

The temperature of the immersion solution is not particularly limited. However, in view of obtaining further improved effects of the present invention, the temperature of the immersion solution is preferably equal to or higher than 20° C.

Examples of the method of immersing the filter in the immersion solution include a method of filling a container for immersion with the immersion solution and immersing the filter in the immersion solution.

As the container for immersion, it is possible to use the housing that the filter unit in the aforementioned filtering device has. That is, for example, it is possible to use a method of filling the housing with the immersion solution in a state where the filter (typically, a filter cartridge) is stored in the housing that the filtering device has and leaving the filter to stand still as it is.

In addition to the above method, for example, it is possible to use a method of preparing a container for immersion in addition to the housing that the purification device has (that is, preparing a container for immersion on the outside of the purification device), filling the additionally prepared container for immersion with the immersion solution, and immersing the filter in the immersion solution.

Particularly, it is preferable to use a method of filling the container for immersion prepared on the outside of the filtering device with the immersion solution and immersing the filter in the immersion solution, because then the impurities eluted from the filter are not mixed into the filtering device.

The shape and size of the container for immersion are not particularly limited and can be appropriately selected according to the number and size of the filters to be immersed, and the like.

The material of the container for immersion is not particularly limited, and it is preferable that at least a liquid contact portion of the container is formed of the anticorrosive material which will be described later.

The material of the container for immersion preferably contains at least one kind of material selected from the group consisting of polyfluorocarbon (such as PTFE, PFA: perfluoroalkoxyalkane and PCTFE: polychlorotrifluoroethylene), PPS (polyphenylene sulfide), POM (polyoxymethylene), and polyolefin (PP, PE, and the like), more preferably contains at least one kind of material selected from the group consisting of polyfluorocarbon, PPS, and POM, even more preferably contains polyfluorocarbon, particularly preferably contains at least one kind of material selected from the group consisting of PTFE, PFA, and PCTFE, and most preferably contains PTFE.

Furthermore, it is preferable that the container for immersion is washed before use. During washing, it is preferable to perform washing (so-called pre-washing) by using the immersion solution.

(Method of Washing by Passing Washing Solution Through Filter)

The method of washing the filter by passing the washing solution through the filter is not particularly limited. For example, by storing the filter (typically, a filter cartridge) in the filter housing of the filter unit of the filtering device described above and introducing the washing solution into the filter housing, the washing solution is passed through the filter.

During washing, the impurities having adhered to the filter migrate to (typically, dissolve in) the washing solution, and thus the content of impurities in the washing solution increases. Therefore, it is preferable that the washing solution once passed through the filter is discharged out of the filtering device without being reused for washing. In other words, it is preferable not to perform circulation washing.

As another form of the method of washing the filter by passing the washing solution through the filter, for example, there is a method of washing the filter by using a washing device. In the present specification, the washing device means a device different from the filtering device that is provided on the outside of the filtering device. Although the form of the washing device is not particularly limited, it is possible to use a device having the same constitution as that of the filtering device.

Washing Solution

As the washing solution which is used in a case where the filter is washed by passing the washing solution through the filter, known washing solutions can be used without particular limitation. Particularly, in view of obtaining further improved effects of the present invention, the form of the washing solution is preferably the same as that of the immersion solution described above.

<Device Washing Step>

The device washing step is a step of washing the liquid contact portion of the filtering device before the filtration step. The method of washing the liquid contact portion of the filtering device before the filtration step is not particularly limited. Hereinafter, the method will be described by taking a filtering device, in which the filter is a cartridge filter that is stored in a housing disposed on a flow path, as an example.

It is preferable that the device washing step includes a step A of washing the liquid contact portion of the filtering device by using a washing solution in a state where the cartridge filter is detached from the housing, and a step B of storing the cartridge filter in the housing after the step A and washing the liquid contact portion of the filtering device by using a washing solution.

Step A

The step A is a step of washing the liquid contact portion of the filtering device by using a washing solution in a state where the cartridge filter is detached from the housing. "In a state where the filter is detached from the housing" means that the liquid contact portion of the filtering device is washed using a washing solution after the filter cartridge is detached from the housing or before the filter cartridge is stored in the housing.

There is no particular limitation on the method of washing the liquid contact portion of the filtering device by using a washing solution in a state where the filter is detached from the housing (hereinafter, also described as "filtering device not storing the filter"). Examples thereof include a method of introducing the washing solution from the inlet portion and collecting the washing solution from the outlet portion.

Particularly, in view of obtaining further improved effects of the present invention, examples of the method of washing the liquid contact portion of the filtering device not storing the filter by using a washing solution include a method of filling the filtering device not storing the filter with a washing solution. In a case where the filtering device not storing the filter is filled with a washing solution, the liquid contact portion of the filtering device not storing a filter contacts the washing solution. As a result, impurities having adhered to the liquid contact portion of the filtering device migrate to (typically, eluted in) the washing solution. After washing, the washing solution may be discharged out of the filtering device (typically, the washing solution may be discharged from the outlet portion).

Washing Solution

As the washing solution, known washing solutions can be used without particular limitation. Particularly, in view of obtaining further improved effects of the present invention, the washing solution preferably contains water or an organic solvent as a main component, and more preferably contains an organic solvent as a main component. In the present specification, the main component means a component of which the content is equal to or greater than 99.9% by mass with respect to the total mass of the washing solution. The content of the main component is more preferably equal to or greater than 99.99% by mass.

The organic solvent is not particularly limited, and it is possible to use water and the organic solvent described above as a solvent that the chemical liquid contains. As the organic solvent, in view of obtaining further improved effects of the present invention, at least one kind of compound is preferable which is selected from the group consisting of PGMEA, cyclohexanone, ethyl lactate, butyl acetate, MIBC, MMP (3-methylmethoxypropionate), MAK, n-pentyl acetate, ethylene glycol, isopentyl acetate, PGME, methyl ethyl ketone (MEK), 1-hexanol, and decane.

Moreover, for example, the washing solution is in the form of the solvent of the same type as the solvent contained in a liquid to be purified. In a case where the liquid to be purified contains two or more kinds of solvents, the washing solution may be one of the two or more kinds of solvents contained in the liquid to be purified or the two or more kinds of solvents, or may have the same composition as that of the solvents contained in the substance to be purified.

For example, in a case where the liquid to be purified is a 9:1 (based on mass) mixture of PGMEA:PC, the washing solution may be PGMEA, PC, or a mixture of PGMEA and PC, and the composition thereof may be PGMEA: PC=9:1.

Step B

The step B is a method of washing the filtering device by using a washing solution in a state where a filter is stored in the housing.

As the method of washing the filtering device by using a washing solution, in addition to the washing method in the step A described above, a method of passing a washing solution through the filtering device can also be used. The method of passing the washing solution through the filtering device is not particularly limited. The washing solution may be introduced from the inlet portion and discharged from the outlet portion. As the washing solution usable in this step, the washing solution used in the step A can be used without particular limitation.

<Electricity Removing Step>

The electricity removing step is a step of removing electricity from the liquid to be purified such that the charge potential of the liquid to be purified is reduced. As the electricity removing method, known electricity removing methods can be used without particular limitation. Examples of the electricity removing method include a method of bringing the liquid to be purified into contact with a conductive material.

The contact time for which the liquid to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the liquid to be purified into contact with a conductive material include a method of disposing a grounded mesh consisting of a conductive material such that the mesh crosses the flow path and passing the liquid to be purified through the mesh.

<Step of Preparing Liquid to be Purified>

The step of preparing a liquid to be purified is a step of preparing a liquid to be purified that will be caused to flow into the filtering device from the inlet portion of the filtering device. The method of preparing the liquid to be purified is not particularly limited. Typically, examples thereof include a method of purchasing commercial products (for example, those called "high-purity grade products"), a method of reacting one kind or two or more kinds of raw materials so as to obtain a liquid to be purified, a method of dissolving components in a solvent, and the like.

As the method of obtaining a liquid to be purified (typically, a liquid to be purified containing an organic solvent) by reacting the raw materials, known methods can be used without particular limitation. For example, it is possible to use a method of reacting one or two or more raw materials in the presence of a catalyst so as to obtain a liquid to be purified containing an organic solvent.

More specifically, examples thereof include a method of obtaining butyl acetate by reacting acetic acid and n-butanol in the presence of sulfuric acid; a method of obtaining 1-hexanol by reacting ethylene, oxygen, and water in the presence of $Al(C_2H_5)_3$; a method of obtaining 4-methyl-2-pentanol by reacting cis-4-methyl-2-pentene in the presence of Diisopinocamphenyl borane ($Ipc_2BH$); a method for obtaining propylene glycol monomethyl ether acetate (PGMEA) by reacting propylene oxide, methanol and acetic acid in the presence of sulfuric acid; a method of obtaining isopropyl alcohol (IPA) by reacting acetone and hydrogen in the presence of copper oxide-zinc oxide-aluminum oxide; a method of obtaining ethyl lactate by reacting lactic acid and ethanol; and the like.

In addition, this step may have a pre-purification step of purifying the liquid to be purified in advance before the liquid is caused to flow into the filtering device. The pre-purification step is not particularly limited, and examples thereof include a method of purifying the liquid to be purified by using a distillation device.

In the pre-purification step, the method of purifying the liquid to be purified by using a distillation device is not particularly limited. Examples thereof include a method of purifying the liquid to be purified in advance by using a distillation device prepared separately from the filtering device so as to obtain a distilled liquid to be purified, storing the liquid in a portable tank, and transporting the tank to the filtering device so as to introduce the liquid into the filtering device, and a method of using a purification device which will be described later.

First, by using FIG. 8, a method (pre-purification step) of purifying the liquid to be purified in advance by using a distillation device prepared separately from the filtering device will be described.

Figure 8:
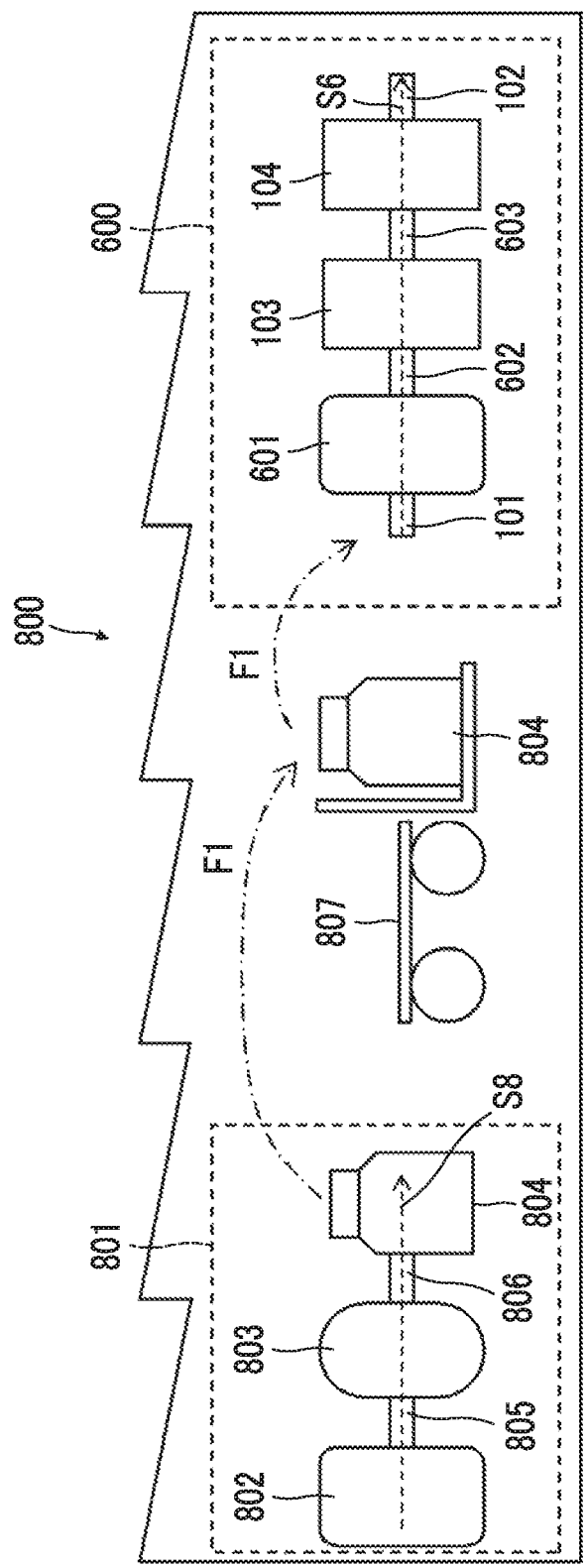
FIG. 8 is a schematic view showing the relationship between the devices in a case where a chemical liquid is manufactured using a distilled liquid to be purified that is purified in advance by a distiller.

FIG. 8 is a schematic view showing the relationship between the devices in a case where a chemical liquid is manufactured using a distilled liquid to be purified that is purified in advance by a distiller.

In FIG. 8, the form of a filtering device 600 is the same as that of the filtering device according to the third embodiment of the present invention described above. Therefore, the filtering device 600 will not be described.

In a chemical liquid manufacturing plant 800, a filtering device 600 and a distillation device 801 are arranged. The distillation device 801 has a tank 802, a distiller 803, and a portable tank 804, which are connected to one another through a piping 805 and a piping 806. The tank 802, the piping 805, the distiller 803, the piping 806, and the portable tank 804 form a flow path S8.

The form of the tank 802 and each piping is not particularly limited, and it is possible to use the tank and piping of the same form as described above as the tank and the piping included in the filtering device according to an embodiment of the present invention. As the distiller 803, it is possible to use the same distiller as the distiller included in the purification device according to an embodiment of the present invention. The form of the distiller 803 will be described later.

In the distillation device 801, a liquid to be purified introduced into the tank 802 is distilled by the distiller 803, and the obtained distilled liquid to be purified is stored in the portable tank 804. Although the form of the portable tank is not particularly limited, it is preferable that at least a portion of the liquid contact portion of the tank (preferably 90% or more of the surface area of the liquid contact portion and more preferably 99% or more of the surface area of the liquid contact portion) consists of the anticorrosive material which will be described later.

The distilled liquid to be purified stored in the portable tank 804 is transported by a transporting unit 807 (the flow of F1 in FIG. 8). Then, the distilled liquid to be purified is introduced into the filtering device 600 from the inlet portion 101 of the filtering device.

In FIG. 8, an embodiment is described in which a distillation device and a filtering device are arranged in the same manufacturing plant. However, the distillation device and the filtering device may be arranged in different manufacturing plants.

Next, a pre-purification step using a purification device having a distiller and a filtering device will be described. First, the purification device used in this step will be described.

(Purification Device)

The purification device used in this step has the filtering device described above. The purification device according to an embodiment of the present invention has the filtering device described above, a second inlet portion, a second outlet portion, and at least one distiller disposed between the second inlet portion and the second outlet portion. In the purification device, a flow path is formed which includes the second outlet portion connected to the inlet portion of the filtering device described above, begins at the second inlet portion, passes through the distiller, the second outlet portion, the inlet portion of the filtering device, and the filtering device in this order, and ends at the outlet portion of the filtering device. Hereinafter, the purification device will be described with reference to drawings.

In the following section, the details relating to the constitution of the filtering device will not be described because they are the same as those described above.

First Embodiment of Purification Device

Figure 9:
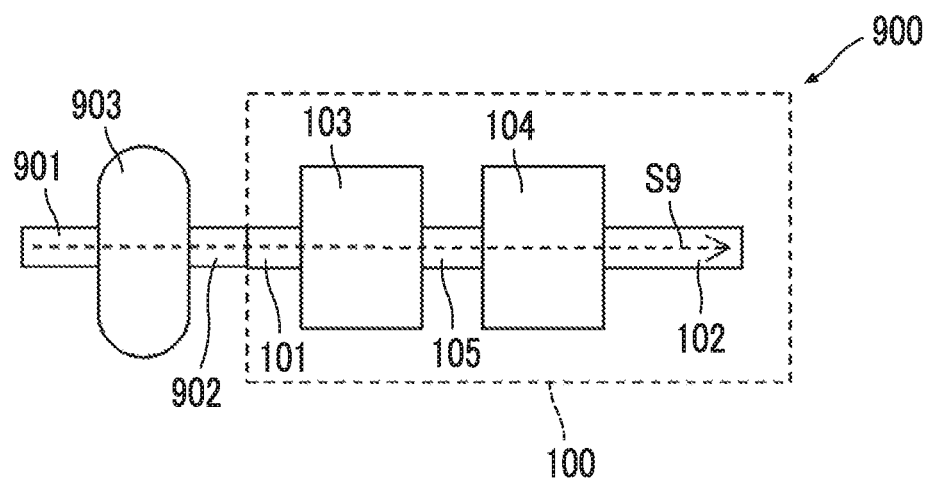
FIG. 9 is a schematic view illustrating a purification device according to the first embodiment of the present invention.

FIG. 9 is a schematic view illustrating a purification device according to a first embodiment of the present invention. A purification device 900 has a second inlet portion 901, a second outlet portion 902, and a distiller 903 disposed between the second inlet portion 901 and the second outlet portion 902, in which the second outlet portion 902 is connected to the inlet portion 101 of the filtering device 100. Therefore, in the purification device 900, by the second inlet portion 901, the distiller 903, the second outlet portion 902, the inlet portion 101, the filter 103 (filter BU), a piping 105, the filter 104 (filter A), and the outlet portion 102, a flow path S9 is formed.

The liquid to be purified having flowed into the purification device 900 from the second inlet portion 901 is distilled in the distiller 903, and then is introduced into the filtering device 100 from the inlet portion 101 through the second outlet portion 902. In a case where the pre-purification step is performed using the present purification device, the next step (filtration step) can be performed without discharging the distilled liquid to be purified outside the device. Therefore, a chemical liquid having further improved defect inhibition performance can be obtained.

The form of the distiller 903 is not particularly limited, and known distillers (for example, a distillation column) can be used. As the material of the distiller 903, it is possible to use the same material as that of the housing described above. Particularly, it is preferable that at least a portion of the liquid contact portion of the distiller 903 consists of the anticorrosive material which will be described later. It is more preferable that 90% or more of the area of the liquid contact portion consists of the anticorrosive material. It is even more preferable that 99% of the area of the liquid contact portion consists of the anticorrosive material.

As the distiller, known distillers can be used without particular limitation. The distiller may be a batch type or a continuous type, but is preferably a continuous type. Furthermore, the distiller may be filled with a filler. Although the form of the filler is not particularly limited, it is preferable that at least a part of the liquid contact portion of the distiller consists of the anticorrosive material which will be described later. It is more preferable that 90% or more of the area of the liquid contact portion consists of the anticorrosive material. It is even more preferable that 99% of the area of the liquid contact portion consists of the anticorrosive material.

In FIG. 9, the purification device 900 has a filtering device of an embodiment (for example, the first embodiment of the filtering device) in which the filter BU and the filter A are arranged in series in this order between the inlet portion and the outlet portion. However, instead of this, the purification device may have a filtering device of an embodiment (for example, the second embodiment) in which the filter A and the filter BD are arranged in series in this order between the inlet portion and the outlet portion, and a filtering device of an embodiment in which the filter BU, the filter A, and the filter BD are arranged in series in this order between the inlet portion and the outlet portion.

Furthermore, in the purification device, on the flow path S9 formed of the second inlet portion 901, the distiller 903, the second outlet portion 902, the inlet portion 101, the filter 103, the piping 105, the filter 104, and the outlet portion 102, a return flow path may be formed which is capable of returning the liquid to be purified to the upstream side of a reference filter in the flow path S9 from the downstream side of the reference filter which is selected from the group consisting of the filter 103 (filter BU) and the filter 104 (filter A). The form of the return flow path is not particularly limited, but is the same as that described in the second embodiment of the filtering device.

Furthermore, the purification device according to the present embodiment may have a tank on the upstream side and/or the downstream side of the filter 103 in the flow path S9. The form of the tank is not particularly limited, and the same tank as that described above can be used.

Second Embodiment of Purification Device

Figure 10:
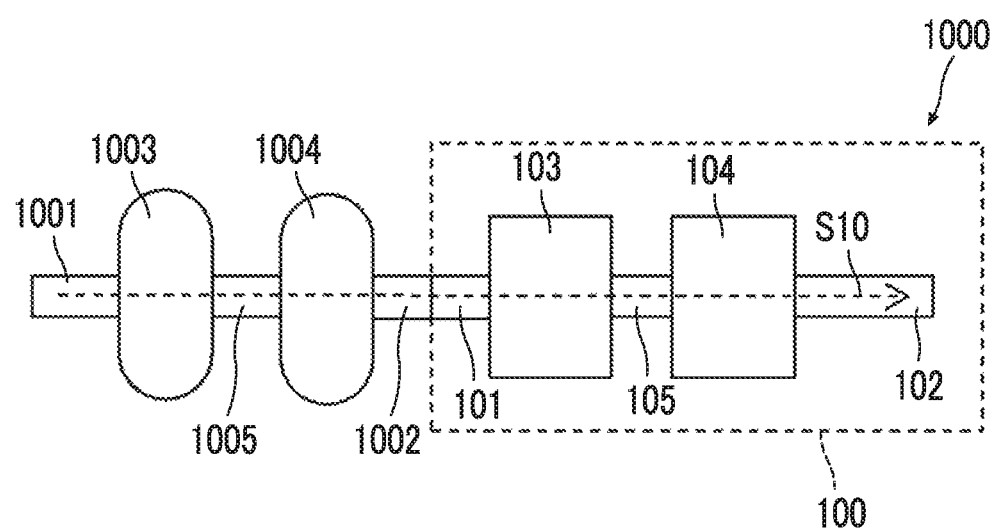
FIG. 10 is a schematic view illustrating a purification device according to the second embodiment of the present invention.

FIG. 10 is a schematic view illustrating a second embodiment of the purification device. A purification device 1000 has a second inlet portion 1001, a second outlet portion 1002, and a distiller 1003 and a distiller 1004 arranged in series between the second inlet portion 1001 and the second outlet portion 1002, in which the second outlet portion 1002 is connected to the inlet portion 101 of the filtering device 100. Therefore, in the purification device 1000, by the second inlet portion 1001, the distiller 1003, a piping 1005, the distiller 1004, the second outlet portion 1002, the inlet portion 101, the filter 103 (filter BU), the piping 105, the filter 104 (filter A), and the outlet portion 102, a flow path S10 is formed.

In the purification device 1000, the liquid to be purified flowing from the second inlet portion 1001 is distilled by the distiller 1003, flows through the piping 1005, and is introduced into the distiller 1004. FIG. 10 shows an embodiment in which the distiller 1003 and the distiller 1004 are connected to each other through the piping 1005. However, the purification device according to the present embodiment is not limited thereto, and may additionally have a piping capable of returning the condensate in the distiller 1004 to the distiller 1003.

The purification device according to the present embodiment has two distillers arranged in series in the flow path. Therefore, in a case where the operating conditions of the two distillers and the like are appropriately controlled, even though the liquid to be purified contains two or more kinds of compounds having different boiling points, the target compound (chemical liquid) can be purified to higher purity.

[Anticorrosive Material]

Next, an anticorrosive material will be described. In the filtering device and the purification device according to the embodiment of the present invention described so far, it is preferable that at least a portion of the liquid contact portion of the devices is formed of an anticorrosive material. It is preferable that 90% or more of the liquid contact portion is formed of an anticorrosive material. It is more preferable that 99% or more of the liquid contact portion is formed of an anticorrosive material.

The state where the liquid contact portion is formed of an anticorrosive material is not particularly limited. Typically, for example, each member (for example, the tank described so far or the like) is formed of an anticorrosive material, or each member has a base material and a coating layer which is disposed on the base material and formed of an anticorrosive material.

The anticorrosive material is a nonmetallic material or an elecltropolished metallic material. Examples of the nonmetallic material include, but are not particularly limited to, a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, a vinyl fluoride resin, and the like.

The metallic material is not particularly limited, and examples thereof include a metallic material in which the total content of Cr and Ni is greater than 25% by mass with respect to the total mass of the metallic material. The total content of Cr and Ni is particularly preferably equal to or greater than 30% by mass. The upper limit of the total content of Cr and Ni in the metallic material is not particularly limited, but is preferably equal to or smaller than 90% by mass in general.

Examples of the metallic material include stainless steel, a Ni—Cr alloy, and the like.

As the stainless steel, known stainless steel can be used without particular limitation. Particularly, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the Ni—Cr alloy, known Ni—Cr alloys can be used without particular limitation. Particularly, a Ni—Cr alloy with a Ni content of 40% to 75% by mass and a Cr content of 1% to 30% by mass is preferable.

Examples of the Ni—Cr alloy include HASTELLOY (trade name, the same will be applied hereinafter), MONEL (trade name, the same will be applied hereinafter), INCONEL (trade name, the same will be applied hereinafter), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, optionally, the Ni—Cr alloy may further contain B, Si, W, Mo, Cu, Co, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the Cr content in a passive layer on the surface thereof may become higher than the Cr content in the parent phase. Therefore, presumably, in a case where a purification device having a liquid contact portion formed of the elecltropolished metallic material is used, metal impurities containing metal atoms may be hardly eluted into the liquid to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

[Chemical Liquid]

It is preferable that the chemical liquid manufactured using the aforementioned filtering device is used for manufacturing a semiconductor substrate. Particularly, it is more preferable to use the chemical liquid for forming a fine pattern at a node equal to or smaller than 10 nm (for example, a step including pattern formation using EUV).

In other words, the filtering device is preferably used for manufacturing a chemical liquid for manufacturing a semiconductor substrate. Specifically, the filtering device is used for treating an inorganic substance and/or an organic substance after each step is finished or before the next step is started in a semiconductor device manufacturing process including a lithography step, an etching step, an ion implantation step, a peeling step, and the like. To be concrete, the filtering device is more preferably used for manufacturing a washing solution, an etching solution, a rinsing solution, a pre-treatment solution, a resist solution, a prewet solution, a developer, and the like, and even more preferably used for manufacturing at least one kind of solution selected from the group consisting of a washing solution, an etching solution, a rinsing solution, a pre-treatment solution, and a resist solution.

In addition, the aforementioned filtering device can also be used for manufacturing a chemical liquid used for rinsing the edge line of a semiconductor substrate before and after the coating with resist.

Furthermore, the aforementioned filtering device can also be used for manufacturing a diluted solution of a resin contained in a resist solution and for manufacturing a solvent contained in a resist solution.

In addition, the aforementioned filtering device can be used for manufacturing a chemical liquid used for purposes other than the manufacturing of a semiconductor substrate. The filtering device can also be used for manufacturing a developer for polyimide, a resist for sensor, and a resist for lens, a rinsing solution, and the like.

Moreover, the filtering device can be used for manufacturing a solvent for medical uses or for washing. Particularly, the filtering device can be used for manufacturing a chemical liquid used for washing containers, piping, base substrates (for example, a wafer and glass), and the like.

Especially, the filtering device is preferably used for manufacturing at least one kind of chemical liquid selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat.

[Chemical Liquid Storage Body]

The chemical liquid manufactured by the filtering device may be stored in a container and preserved until the chemical liquid is used. The container and the chemical liquid stored in the container are collectively referred to as chemical liquid storage body. The preserved chemical liquid is used after being taken out of the chemical liquid storage body.

As a container for preserving the chemical liquid, it is preferable to use a container for semiconductor substrate manufacturing, which has a high internal cleanliness and hardly causes the eluate of impurities into the chemical liquid during the preservation of the chemical liquid.

Examples of usable containers include, but are not limited to, a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that at least a portion of the liquid contact portion of the container consists of the anticorrosive material described above. In view of obtaining further improved effects of the present invention, it is preferable that 90% or more of the area of the liquid contact portion consists of the material described above.

EXAMPLES

Hereinafter, the present invention will be more specifically described based on examples. The materials, the amount and proportion thereof used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation of chemical liquids, filling, preservation, and analytical measurement were all performed in a clean room of a level satisfying ISO class 2 or 1. In order to improve the measurement accuracy, in the process of measuring the content of the organic impurities and the content of metal atoms, in a case where the content of the organic impurities or metal atoms was found to be equal to or smaller than a detection limit by general measurement, the chemical liquid was concentrated by 1/100 in terms of volume for performing the measurement, and the content was calculated by converting the concentration into the concentration of the chemical liquid not yet being concentrated. The tools such as a device or a filter used for purification and a container were used after the surface contacting the chemical liquid was thoroughly washed with a chemical liquid purified in advance by the same method.

Test Example 1: Purification of Organic Solvent-Based Liquid to be Purified and Performance Evaluation of Chemical Liquid

[Manufacture of Chemical Liquid 1]

A chemical liquid 1 was manufactured using the purification device shown in FIG. 11. The purification device in FIG. 11 has, between an inlet portion and an outlet portion, a filtering device including a filter BU-1, a filter BU-2, a tank TU-1, a filter F-A, a filter BD-1, a filter BD-2, a tank TD-1, and a filter BD-3 that are connected in series and a distiller connected to the front portion of the filtering device (duplex distiller consisting of D1 and D2, described as "duplex" in Table 1). Each of the units forms a flow path S-11 together with the piping. In the flow path S-11, a return flow path R-11 is formed which is capable of returning the liquid to be purified to the upstream side of the filter F-A from the downstream side (downstream side of the tank TD-1) of the filter F-A in the flow path S-11 (the filter F-A corresponds to the filter A described above). One end of the return flow path R-11 is connected to a flow path S12 on the downstream side of the tank TD-1 (the filter BD-1 and the filter BD-2), and the other end thereof is connected to the flow path S4 on the upstream side of the filter F-A. Tables 1 and 2 show the material components contained in the filters used for manufacturing the chemical liquid 1 and the pore size of the filters. In the table, "-" means that the filter was not used. The same is true of other tables in the present specification.

In the column of "Pre-washing of filter", "(solvent name) (number) day immersion" means that the filter was used after being immersed in a washing solution described in "(solvent name)" for "(number)" of days. For example, "CHN 1 day immersion" means that the filter was used after being immersed in cyclohexanone for 1 day, and "PGMEA 7 day immersion" means that the filter was used after being immersed in PGMEA for 7 days. In addition, "-" in the same column shows that the filter was not pre-washed.

Abbreviations for the material components of each filter in Tables 1 and 2 are as follows.

[Anion exchange group]

The grafted ultra-high-molecular-weight polyethylene membrane (having a quaternary ammonium group as an anion exchange group) described in paragraph "0099" of JP2017-536232A was used.

[Cation exchange group]

The grafted ultra-high-molecular-weight polyethylene membrane (having a sulfonic acid group as a cation exchange group) described in paragraphs "0130" to "0132" of JP2017-536232A was used.

[Neutral group-grafted UPE1]

With reference to the description in paragraphs "0058" and "0059" of JP2017-536232A, a grafted ultra-high-molecular-weight polyethylene membrane (having a hydroxy group derived from hydroxymethyl acrylamide as a neutral group) was prepared and used.

[Neutral group-grafted UPE2]

An ultra-high-molecular-weight polyethylene membrane (having a hydroxy group derived from hydroxymethyl acrylamide as a neutral group) was prepared in the same manner as that described in paragraphs "0058" and "0059" of JP2017-536232A, except that a vinylbenzyltrimethylammonium chloride monomer was not used. The prepared membrane was used.

PP: polypropylene

Nylon: nylon

UPE: ultra-high-molecular-weight polyethylene

PTFE: polytetrafluoroethylene

"PFSA/PTFE"

A commercially available product Fluorogard AT (pore size: 20 nm or 200 nm) manufactured by Entegris. was immersed in a polymer solution prepared by dissolving a 0.25% PFSA solution (AQUIVION PFSA 24: D83-24B Solvay Plastics) in an aqueous methanol solvent, until the filter was thoroughly wetted. Thereafter, the filter was drained, then dried, and washed for 24 hours with ultrapure water, and the obtained material was used.

IEX: sulfonic acid-type ion exchange resin

A commercial high-purity grade "cyclohexanone" was purchased as the liquid to be purified, and purified using the purification device described above. For purification, circulation filtration was performed three times by using the return flow path R-11, thereby obtaining a chemical liquid 1.

Abbreviations relating to the liquid to be purified in Tables 1 and 2 are as follows.

CHN: cyclohexanone

PGMEA/PGME (3:7): a 3:7 (based on mass) mixture of PGMEA and PGME.

The contribution rates of the hydrogen bond element and the polarization element in the Hansen solubility parameters were calculated using the density of PGMEA: 0.969 g/cm$^3$ and the density of PGME: 0.923 g/cm$^3$.

nBA: butyl acetate

PGMEA/PC (9:1): a 9:1 (based on mass) mixture of PGMEA and PC.

The contribution rates of the hydrogen bond element and the polarization element in the Hansen solubility parameters were calculated using the density of PGMEA: 0.969 g/cm$^3$ and the density of PC: 1.205 g/cm$^3$.

EL: ethyl lactate

MIBC: 4-methyl-2-pentanol

PGME: propylene glycol monoethyl ether

PGMEA: propylene glycol monomethyl ether acetate

[Manufacturing of chemical liquids 2 to 49, chemical liquids 200 to 227, chemical liquids 255 to 271, and chemical liquids 274 to 282]

Each of the liquids to be purified described in Table 1 or 2 was purified using the purification device (or the filtering device) described in Table 1 or 2, thereby obtaining chemical liquids. The purification devices (or filtering devices) are shown in FIGS. 11 to 44. The material components contained in the filter F-A, the filters BU-1 and BU-2, and the filters BD-1 to BD-3, and the pore sizes of the filters are as shown in Table 1.

During the purification of the liquid to be purified described in Table 1, a liquid that was filtered using a filtering device, in which a return flow path represented by R-(number) was formed, was subjected to circulation filtration three times through each return flow path.

Furthermore, regarding the purification of the liquid to be purified described in Table 2, the number of times of circulation is described in the column of "Circulation" in the table. "-" in this column means that the circulation filtration was not performed.

In addition, for each of the liquids to be purified, the hydrogen bond element (hydrogen bond energy) in the Hansen solubility parameters and the C log P value are also described in Table 1.

Furthermore, in Table 2, a contribution rate ΔPs of the polarization element in the Hansen solubility parameters of each of the liquids to be purified, a contribution rate ΔPe of the polarization element in the Hansen parameters of an eluate detected by the following method (bis(2-ethylhexyl phthalate was detected from all the filters), and a result of calculating |ΔPs−ΔPe| are described.

(Method of Measuring Eluate)

The filters described in "Filter F-A" in Tables 1 and 2 were shredded to prepare a sample weighing 1 g in total, and the sample was used as an extraction sample. Then, 30 ml (volume at 25° C.) of high-purity grade methanol was added to the extraction sample, and the sample was subjected to reflux extraction for 3 hours at 75° C., thereby obtaining an extract. Subsequently, the obtained extract was concentrated to dryness and then redissolved in 1 ml of methanol, thereby obtaining a sample for measurement. Thereafter, the sample for measurement was analyzed using a gas chromatography mass spectrometer (GC-MS) to identify the eluate.

The measurement conditions of GC-MS and the like are as follows.

Manufacturer Agilent Technologies, Inc.

Model number GC (gas chromatography portion): 7890B

Model number MS (mass spectrometry portion): 5977B EI/CI MSD (Measurement condition)

Column: Agilent J & W DB-5 ms 0.25 mm ID×30 m×0.25 μm

Oven: 50° C. (2 min)→10° C./min→280° C. (20 min)

Injection Splitless, Inj. Temp. 300° C. Inj. Vol. 1 μL AUX Temp. 300° C.

Ion source EI (scan range m/z=25-650)

[Evaluation 1: Evaluation of Residue Defect Inhibition Performance and Stain-Like Defect Inhibition Performance of Chemical Liquid]

A silicon wafer (Bare-Si) having a diameter of about 300 mm was coated with the chemical liquid 1, thereby obtaining a wafer coated with a chemical liquid. The used device was Lithius ProZ, and the coating conditions were as follows.

Amount of chemical liquid used for coating: 2 ml

Rotation speed of silicon wafer during coating: 2,200 rpm, 60 sec

Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 19 nm existing on the entire surface of the wafer and the composition of the defects were investigated.

The total number of defects measured using SP-5 was counted as the number of residue defects, and the shape of the defects was observed using G6. The (stain-like) defects that were not in the form of particles were counted as stain-like defects. The results were evaluated based on the following standard. The evaluation results are shown in Table 1.

The smaller the number of defects present on the wafer, the better the defect inhibition performance of the chemical liquid. In the following evaluation, "number of defects" means the total number of residue defects and stain-like defects. The chemical liquids 2 to 49, the chemical liquids 200 to 227, the chemical liquids 255 to 271, and the chemical liquids 274 to 282 were also evaluated by the same method as that described above. The results are shown in Tables 1 and 2.

AA The number of defects was equal to or smaller than 30/wafer.

A The number of defects was greater than 30/wafer and equal to or smaller than 50/wafer.

B The number of defects was greater than 50/wafer and equal to or smaller than 100/wafer.

C The number of defects was greater than 100/wafer and equal to or smaller than 200/wafer.

D The number of defects was greater than 200/wafer and equal to or smaller than 500/wafer.

E The number of defects was greater than 500/wafer and equal to or smaller than 1,000/wafer.

F The number of defects was greater than 1,000/wafer (detection limit was 50,000/wafer).

[Evaluation 2: Bridge Defect Inhibition Performance]

By using the chemical liquid 1 as a prewet solution, the bridge defect inhibition performance of the chemical liquid was evaluated. First, a resist resin composition used will be described.

Resist Resin Composition 1

The resist resin composition 1 was obtained by mixing together the following components.

Acid-decomposable resin (resin represented by the following formula (weight-average molecular weight (Mw) 7500): the numerical value described in each repeating unit means mol %): 100 parts by mass

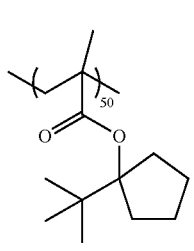
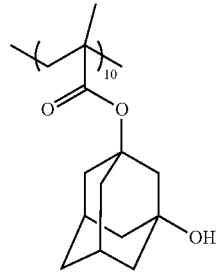

-continued

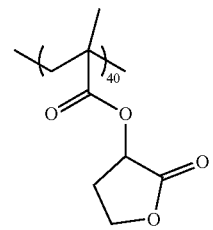

The following photoacid generator: 8 parts by mass

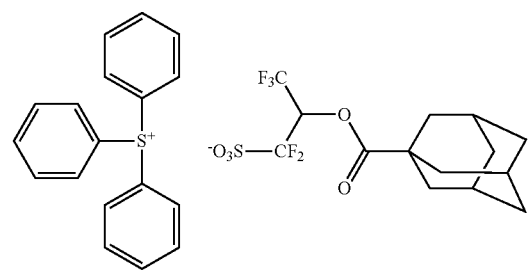

The following quencher: 5 parts by mass (the mass ratio was 0.1:0.3:0.3:0.2 in this order from the left). Among the following quenchers, a polymer-type quencher has a weight-average molecular weight (Mw) of 5,000. The numerical value described in each repeating unit means molar ratio.

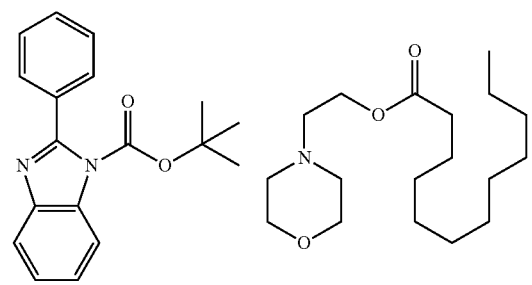

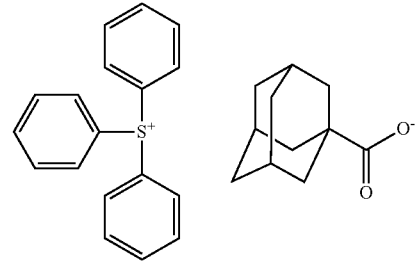

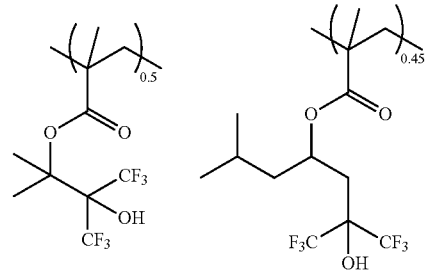

-continued

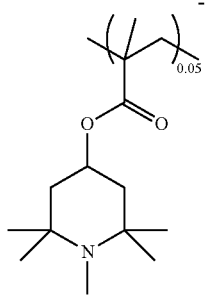

The following hydrophobic resin: 4 parts by mass (mass ratio was (1):(2)=0.5:0.5). Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

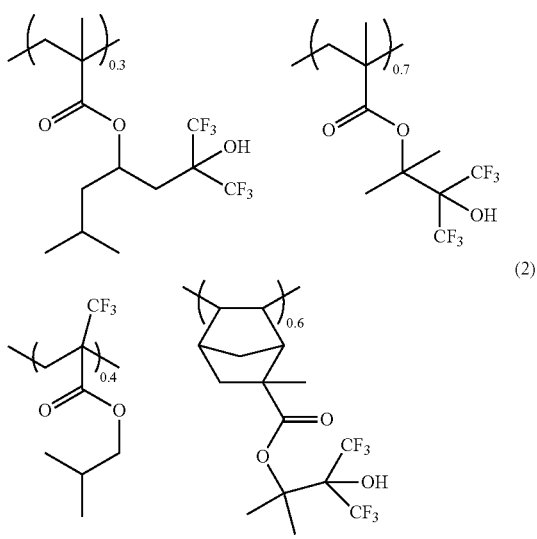

Solvent:
PGMEA (propylene glycol monomethyl ether acetate): 3 parts by mass
Cyclohexanone: 600 parts by mass
γ-BL (γ-butyrolactone): 100 parts by mass
Test Method Next, the test method will be described. First, a silicon wafer having a diameter of about 300 mm was pre-wet with the chemical liquid 1, and then the pre-wet silicon wafer was spin-coated with the resist resin composition 1 described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern.

After being irradiated, the resist film was baked for 60 seconds at 120° C. Subsequently, the resist film was developed, rinsed, and then baked for 60 seconds at 110° C., thereby forming a resist pattern having a line width of 30 nm and a space width of 30 nm.

By using a critical dimension SEM (CG4600, manufactured by Hitachi High-Technologies Corporation), 100 shots of the resist pattern were captured. The number of defects in the form of a crosslink between patterns (bridge defects) was counted, and the number of defects per unit area was determined. The results were evaluated based on the following standard. The evaluation results are shown in Table 1. Note that the smaller the number of defects in the form of a crosslink between patterns, the better the bridge defect inhibition performance of the chemical liquid.

For the chemical liquids 2 to 49, the chemical liquids 200 to 227, the chemical liquids 255 to 271, and the chemical liquids 274 to 282, those described as "Pre-wetting" in the column of "Evaluation method" in Table 1 or 2 were evaluated in terms of the bridge defect inhibition performance by the same method as that used for the chemical liquid 1. The chemical liquids described as "Developer" in the column of "Evaluation method" in Table 1 or 2 were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in Table 1 or 2 were used as a developer. The chemical liquids described as "Rinsing" in the column of "Evaluation method" in Table 1 or 2 were evaluated in terms of the bridge defect inhibition performance according to the same procedure as that used for evaluating the chemical liquid 1 in Table 1 or 2, except that the chemical liquids were not subjected to pre-wetting described in the procedure for evaluating the chemical liquid 1, and the chemical liquids described in Table 1 or 2 were used as a rinsing solution. The results are shown in Table 1 or 2.

AA The number of bridge defects was less than 1/cm$^2$.
A The number of bridge defects was equal to or greater than 1/cm$^2$ and less than 2/cm$^2$.
B The number of bridge defects was equal to or greater than 2/cm$^2$ and less than 5/cm$^2$.
C The number of bridge defects was equal to or greater than 5/cm$^2$ and less than 10/cm$^2$.
D The number of bridge defects was equal to or greater than 10/cm$^2$ and less than 15/cm$^2$.
E The number of bridge defects was equal to or greater than 15/cm$^2$.

[Evaluation 3: Uniformity of Pattern Width]

By using a critical dimension SEM (CG4600, manufactured by Hitachi High-Technologies Corporation), 100 shots of the resist pattern were captured, and the absolute value of a difference between an average Line Width Roughness (LWR) and a maximum (or minimum) line width was determined. The results were evaluated based on the following standard. The evaluation results are shown in Table 1. Note that the smaller the "absolute value of difference", the better the uniformity of the pattern width formed using the chemical liquid. "Difference from the maximum (or minimum) line width" means that between the difference between the average LWR and the maximum line width and the difference between the average LWR and the minimum line width, the larger one in terms of absolute value was used to evaluate the pattern width uniformity.

AA The absolute value of a difference between the average line width and the maximum (minimum) line width was less than 2% with respect to the average.

A The absolute value of a difference between the average line width and the maximum (minimum) line width was equal to or greater than 2% and less than 5% with respect to the average.

B The absolute value of a difference between the average line width and the maximum (minimum) line width was equal to or greater than 5% and less than 10% with respect to the average.

C The absolute value of a difference between the average line width and the maximum (minimum) line width was equal to or greater than 10% and less than 20% with respect to the average.

D The absolute value of a difference between the average line width and the maximum (minimum) line width was equal to or greater than 20% with respect to the average.

E The line width could not be measured in some of the shots.

[Evaluation 4: Evaluation of Pot Life of Filter]

The liquid to be purified was continuously purified using each of the purification devices (or filtering devices) described in Table 1. After the liquid to be purified was passed and the purification device (or filtering device) was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the residue defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the filtering device described in FIG. 24 was used (in the case of the chemical liquid 41 in Table 1 and in the case of the chemical liquid 276 in Table 2) was regarded as 1, and the pot life of the filter was evaluated based on the ratio of the pot life of the filter of each device to 1. The results were evaluated based on the following standard. The evaluation results are shown in Tables 1 and 2. For the device in FIG. 24 (in the case of the chemical liquid 41 in Table 1 and in the case of the chemical liquid 276 in Table 2), "Reference" is described as the evaluation result.

AA The pot life was equal to or longer than 10.

A The pot life was equal to or longer than 5 and less than 10.

B The pot life was equal to or longer than 2 and less than 5.

C The pot life was longer than 1 and less than 2.

D The pot life was equal to or shorter than 1.

Test Example 2: Manufacturing of Chemical Liquid as Resist Resin Composition and Evaluation of Performance of Chemical Liquid

[Manufacturing of chemical liquid 300]

A resist resin composition 2 containing the following components was prepared as a liquid to be purified.

Resin A-2 synthesized by the following method: 0.79 g
<Resin (A-2)>
Synthesis of Resin (A-2)

A 2 L flask was filled with 600 g of cyclohexanone and then subjected to nitrogen purging for 1 hour at a flow rate of 100 mL/min. Thereafter, 0.02 mol of a polymerization initiator V-601 (manufactured by Wako Pure Chemical Industries, Ltd.) was added thereto, and the flask was heated until the internal temperature became 80° C. Subsequently, the following monomers 1 to 3 and 0.02 mol of a polymerization initiator V-601 (manufactured by Wako Pure Chemical Industries, Ltd.) were dissolved in 200 g of cyclohexanone, thereby preparing a monomer solution. The monomer solution was added dropwise for 6 hours to the flask heated to 80° C. After the dropwise addition ended, the reaction was further performed at 80° C. for 2 hours.

Monomer 1: 0.3 mol

Monomer 2: 0.6 mol

Monomer 3: 0.1 mol

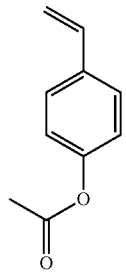

Monomer 1

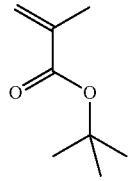

monomer 2

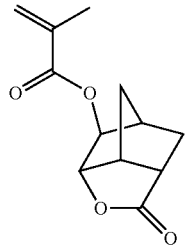

monomer 3

The reaction solution was cooled to room temperature and added dropwise to 3 L of hexane so as to precipitate a polymer. The filtered solids were dissolved in 500 mL of acetone, added dropwise again to 3 L of hexane, and the filtered solids were dried under reduced pressure, thereby obtaining a resin (A-2) as a copolymer of the monomers 1 to 3.

A reaction container was filled with 10 g of the copolymer obtained as above, 40 mL of methanol, 200 mL of 1-methoxy-2-propanol, and 1.5 mL of concentrated hydrochloric acid, and the mixture was heated to 80° C. and stirred for 5 hours. The reaction solution was left to cool to room temperature and added dropwise to 3 L of distilled water. The filtered solids were dissolved in 200 mL of acetone, added dropwise again to 3 L of distilled water, and the filtered solids were dried under reduced pressure, thereby obtaining a resin (A-2) (8.5 g). The weight-average molecular weight (Mw) of the resin measured by gel permeation chromatography (GPC) (solvent: THF (tetrahydrofuran))

and expressed in terms of standard polystyrene was 12,300, and the molecular weight dispersity (Mw/Mn) of the resin was 1.51.

The composition (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) spectroscopy.

(A-2)

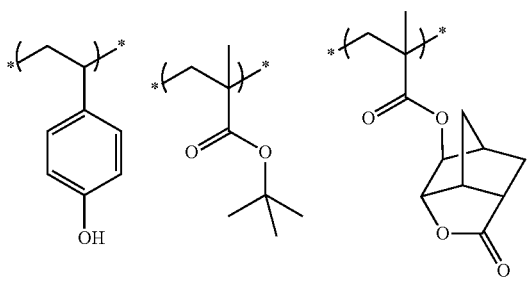

The composition of the resin A-2 was 30/60/10 (molar ratio) in this order from the constitutional unit at the very left. The resin A-2 had a weight-average molecular weight (Mw) of 12,300 and Mw/Mn of 1.51.

The following aid generator (B-2): 0.18 g (B-2)

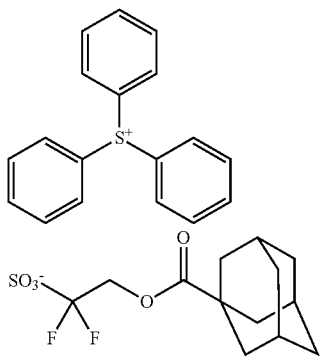

The following basic compound (E-1): 0.03 g (E-1)

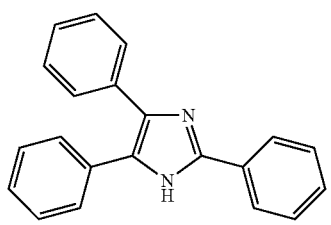

Propylene glycol monomethyl ether acetate: 45 g

Propylene glycol monomethyl ether: 30 g

Figure 38:
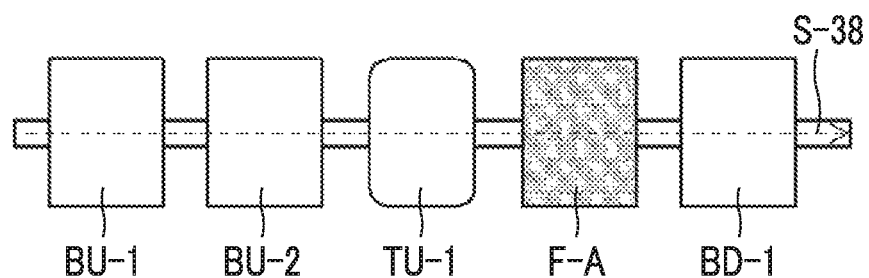
FIG. 38 shows a filtering device according to an embodiment of the present invention.

A chemical liquid 300 was manufactured using the filtering device illustrated in FIG. 38. In the filtering device in FIG. 38, a filter BU-1, a filter BU-2, a tank TU-1, a filter F-A, and a filter BD-1 are connected in series between an inlet portion and an outlet portion. The units form a flow path S-38 together with piping. Table 3 shows the material components contained in the filters used for purification and the pore sizes of the filters.

[Manufacturing of Chemical Liquid 301]

A chemical liquid 301 was manufactured by the same method as that used for manufacturing the chemical liquid 300, except that the filtering device described in Table 3 was used.

[Manufacturing of Chemical Liquid 302]

A resist resin composition 3 containing the following components was prepared as a liquid to be purified.

Resin A-14 synthesized by the following method: 0.785 g

<Resin (A-14)>

Synthesis of Resin (A-14)

A resin (A-14) having the following structure was obtained by the same method as that used for synthesizing the resin (A-2), except that the used monomer was changed.

(A-14)

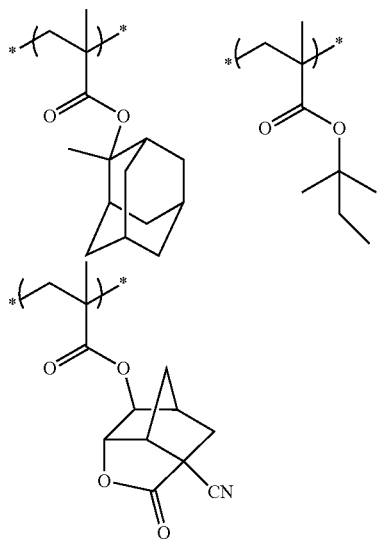

The composition of the resin A-14 was 20/40/40 (molar ratio) in this order from the constitutional unit at the very left. The resin A-14 had a weight-average molecular weight (Mw) of 11,000 and Mw/Mn of 1.45.

The following acid generator (B-9): 0.18 g (B-9)

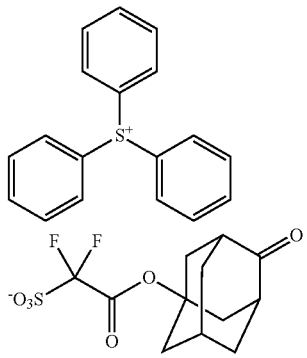

The following basic compound (E-2): 0.03 g (E-2)

Propylene glycol monomethyl ether acetate: 45 g

Cyclohexanone: 30 g

The following hydrophobic resin (3b) shown below: 0.005 g (3b)

A chemical liquid 302 was manufactured using the filtering device illustrated in FIG. 38. In the filtering device in FIG. 38, a filter BU-1, a filter BU-2, a tank TU-1, a filter F-A, and a filter BD-1 are connected in series between an inlet portion and an outlet portion.

Table 3 shows the material components contained in the filters used for purification and the pore sizes of the filters.

[Manufacture of Chemical Liquids 303 to 306]

Chemical liquids 303 to 306 were manufactured by the same method as that used for manufacturing the chemical liquid 302, except that the filtering device described in Table 3 was used.

[Manufacturing of Chemical Liquid 307]

A resist resin composition 4 containing the following components was prepared as a liquid to be purified.

Resin (A-1)-3 synthesized by the following method: 97% by mass

<Resin (A-1)-3>

The resin (A-1)-3 was synthesized with reference to the description in paragraphs "0131" to "0134" of JP2009-265609A. The repeating units of the resin (A-1)-3 are represented by the following formulas, and the composition (molar ratio) thereof is 50/40/10 from the left. The resin (A-1)-3 had a weight-average molecular weight of 20,000 and a dispersity represented by Mw/Mn of 1.57.

(A-1)-3

-continued

The following acid generator (B35): 2.5% by mass (B35)

C-1 dicyclohexylmethylamine: 0.4% by mass

D-1 fluorine-based surfactant, MEGAFACE F-176 (manufactured by DIC Corporation): 0.1% by mass Here, the content of (A-1)-3 to D-1 means the content in the solid contents of the resist resin composition 4 based on mass.

Solvent

Propylene glycol monomethyl ether acetate: 80% by mass

Propylene glycol monomethyl ether: 20% by mass

Here, the content of the solvent means the content of each solvent in the solvents contained in the resist resin composition 4 (content determined by regarding the total mass of the solvents as 100% by mass). The solid contents of the resist resin composition 4 were adjusted to 10% by mass.

A chemical liquid 307 was manufactured using the filtering device illustrated in FIG. 38. In the filtering device in FIG. 38, a filter BU-1, a filter BU-2, a tank TU-1, a filter F-A, and a filter BD-1 are connected in series between an inlet portion and an outlet portion. The units form a flow path S-38 together with piping.

Table 3 shows the material components contained in the filters used for purification and the pore sizes of the filters.

[Manufacturing of Chemical Liquid 308]

A chemical liquid 308 was manufactured by the same method as that used for manufacturing the chemical liquid 307, except that the filtering device described in Table 3 was used.

[Evaluation of Defect Inhibition Performance of Chemical Liquid: Defect Inhibition Performance During EUV Exposure]

By using the chemical liquids 300 to 308, the defect inhibition performance (post-development defect inhibition performance and bridge defect inhibition performance) of the chemical liquids was evaluated by the following operation. EUV exposure refers to a pattern forming method by exposure using EUV.

A 12-inch silicon wafer was coated with each of the chemical liquids 300 and 301 and baked for 60 seconds under the condition of 120° C., thereby forming a resist film thickness of 40 nm.

(Exposure Conditions for Evaluating Post-Development Defect Inhibition Performance)

The wafer prepared as above was subjected to EUV exposure using a dipole lighting (Dipole 60x, outer sigma 0.81, inner sigma 0.43) at a lens numerical aperture (NA) of 0.25. Specifically, the entire surface of the negative resist was exposed at an exposure amount of 1 mJ/cm$^2$ without using a mask.

(Exposure Conditions for Evaluating Bridge Defect Inhibition Performance)

The wafer prepared as above was subjected to EUV exposure using Quasar lighting (Quasar 45, outer sigma 0.81, inner sigma 0.51) at a lens numerical aperture (NA) of 0.25. Specifically, through a mask including a pattern (for evaluating C/H removability) for forming a contact hole pattern with dimensions of a pitch of 60 nm and a hole size of 30 nm on a wafer and a line-and-space (LS) pattern with a line width of 22 nm and a pitch of 50 nm, the exposure amount was adjusted, and then the entire surface of the wafer was subjected to EUV expose at an exposure amount yielding a line width of 22 nm.

(Development Conditions)

Immediately after the exposure was performed under the above conditions, the wafer was baked for 60 seconds under the condition of 100° C.

Thereafter, by using a shower-type developing machine (ADE3000S manufactured by ActesKyosan inc.), the developer (23° C.) was sprayed and jetted to the wafer, which was rotating at 50 rpm, for 30 seconds at a flow rate of 200 mL/min so as to perform development, thereby obtaining a sample for evaluation.

(Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

AA: The number of defects was equal to or smaller than 10 (number/visual field).

A: The number of defects was greater than 10 (number/visual field) and equal to or smaller than 30 (number/visual field).

B: The number of defects was greater than 30 (number/visual field) and equal to or smaller than 100 (number/visual field).

C: The number of defects was greater than 100 (number/visual field) and equal to or smaller than 300 (number/visual field).

D: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

AA: The number of defects was equal to or smaller than 200/wafer.

A: The number of defects was greater than 200/wafer and equal to or smaller than 500/wafer.

B: The number of defects was greater than 500/wafer and equal to or smaller than 1,000/wafer.

C: The number of defects was greater than 1,000/wafer and equal to or smaller than 1,500/wafer.

D: The number of defects was greater than 1,500/wafer.

[Evaluation of Defect Inhibition Performance of Chemical Liquid: Defect Inhibition Performance During ArF Expose]

By using the chemical liquids 302 to 306, the defect inhibition performance (post-development defect inhibition performance and bridge defect inhibition performance) of the chemical liquids was evaluated by the following operation. The ArF exposure means a pattern forming method by exposure using an ArF excimer laser.

A 12-inch silicon wafer was coated with each of the chemical liquids 302 to 306 and baked for 60 seconds under the condition of 90° C. to 120° C., thereby forming a resist film thickness of 40 nm.

Before being coated with the resist film, the silicon wafer was coated with an organic antireflection film ARC29SR (manufactured by Brewer Science Inc.) and baked for 60 seconds at 205° C. so as to form an antireflection film having a film thickness of 86 nm.

(Exposure Conditions for Evaluating Post-Development Defect Inhibition Performance)

The wafer prepared as above was subjected to ArF exposure using an ArF excimer laser immersion scanner (XT1700i manufactured by ASML, NA1.20, Dipole, outer sigma 0.900, inner sigma 0.700, Y polarization). Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using an ArF excimer laser immersion scanner (XT1700i manufactured by ASML, NA1.20, Dipole, outer sigma 0.900, inner sigma 0.700, Y polarization). As a reticle, a 6% halftone mask having a line size=50 nm and a line:space=1:1 was used. Ultrapure water was used as an immersion solution.

The conditions were adjusted so as to obtain a line-and-space pattern having a pitch of 100 nm, a space width of 35 nm, and a line width of 65 nm.

(Development Conditions)

The wafer was baked (Post Exposure Bake; PEB) at 100° C. and then subjected to puddle development in a developer for 30 seconds, thereby preparing a wafer in which a pattern was formed. In a case where a rinsing treatment was performed, the wafer was developed by puddling for 30 seconds in a developer, then rinsed by puddling in a rinsing solution before being dried, and then rotated for 30 seconds at a rotation speed of 4,000 rpm. In this way, a sample for evaluation was obtained.

(Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

AA: The number of defects was equal to or smaller than 10 (number/visual field).

A: The number of defects was greater than 10 (number/visual field) and equal to or smaller than 30 (number/visual field).

B: The number of defects was greater than 30 (number/visual field) and equal to or smaller than 100 (number/visual field).

C: The number of defects was greater than 100 (number/visual field) and equal to or smaller than 300 (number/visual field).

D: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

AA: The number of defects was equal to or smaller than 200/wafer.

A: The number of defects was greater than 200/wafer and equal to or smaller than 500/wafer.

B: The number of defects was greater than 500/wafer and equal to or smaller than 1,000/wafer.

C: The number of defects was greater than 1,000/wafer and equal to or smaller than 1,500/wafer.

D: The number of defects was greater than 1,500/wafer.

[Evaluation of Defect Inhibition Performance of Chemical Liquid: Defect Inhibition Performance During KRF Expose]

By using the chemical liquids 307 and 308, the defect inhibition performance (post-development defect inhibition performance and bridge defect inhibition performance) of the chemical liquids was evaluated by the following operation. KrF means a pattern forming method by exposure using a KrF excimer laser.

The silicon wafer was treated with hexamethyldisilazane (HMDS) (110° C. for 35 seconds), and by using the chemical liquids 307 and 308, a resist film having a thickness of 100 nm was formed on the wafer.

Before the coating with the chemical liquids, an oxide film having a thickness of 100 nm was formed on the silicon wafer.

(Exposure Conditions for Evaluating Post-Development Defect Inhibition Performance)

By using a KrF excimer laser scanner (PAS5500/850 manufactured by ASML) (NA 0.80), KrF expose was performed on the wafer prepared as above. Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using a KrF excimer laser scanner (PAS5500/850, manufactured by ASML) (NA 0.80). As a reticle, a binary mask was used which had a line-and-space pattern with a line size of 175 nm and a space size of 263 nm. The conditions were adjusted so as to obtain a line-and-space pattern having a pitch of 438 nm, a space width of 130 nm, and a line width of 308 nm.

(Development Conditions)

After baking (Post Exposure Bake; PEB) under the condition of 100° C. for 60 seconds, puddle development with a developer was performed for 30 seconds, puddle rinsing with a rinsing solution was performed in a case where a rinsing process was carried out, and then the wafer was rotated for 30 seconds at a rotation speed of 4000 rpm, thereby obtaining a sample for evaluation.

As the developer, FHD-5 manufactured by Fuji Film Electronics Materials Co., Ltd. was used.

(Evaluation of Bridge Defect Inhibition Performance)

The resolution of the exposed LS pattern was observed using a scanning electron microscope (CG4600, manufactured by Hitachi, Ltd.) at 200 k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

AA: The number of defects was equal to or smaller than 10 (number/visual field).

A: The number of defects was greater than 10 (number/visual field) and equal to or smaller than 30 (number/visual field).

B: The number of defects was greater than 30 (number/visual field) and equal to or smaller than 100 (number/visual field).

C: The number of defects was greater than 100 (number/visual field) and equal to or smaller than 300 (number/visual field).

D: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

AA: The number of defects was equal to or smaller than 200/wafer.

A: The number of defects was greater than 200/wafer and equal to or smaller than 500/wafer.

B: The number of defects was greater than 500/wafer and equal to or smaller than 1,000/wafer.

C: The number of defects was greater than 1,000/wafer and equal to or smaller than 1,500/wafer.

D: The number of defects was greater than 1,500/wafer.

[Evaluation 3: Evaluation of Pot Life of Filter]

The liquid to be purified was continuously purified using each of the filtering devices described in Table 3. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the bridge defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life obtained in a case where the chemical liquid 301 was purified as a liquid to be purified using the filtering device described in FIG. 24 was regarded as 1, and the pot life of the filter of each device was evaluated based on a ratio to 1. The results were evaluated based on the following standard. The evaluation results are shown in Table 3. The evaluation result obtained using the chemical liquid 301 is described as "Reference".

AA The pot life was equal to or longer than 10.

A The pot life was equal to or longer than 5 and less than 10.

B The pot life was equal to or longer than 2 and less than 5.

C The pot life was longer than 1 and less than 2.

D The pot life was equal to or shorter than 1.

TABLE 1 (1-1)

Figure 21:
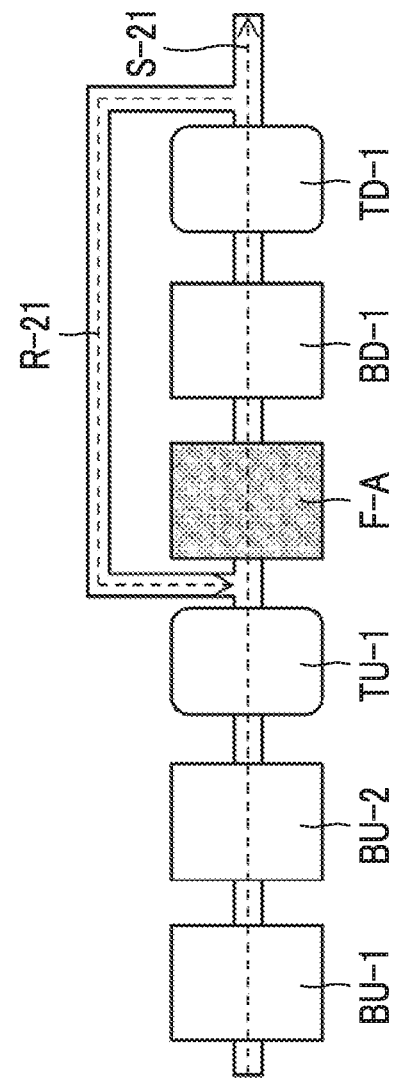
FIG. 21 shows a filtering device according to an embodiment of the present invention.
Figure 22:
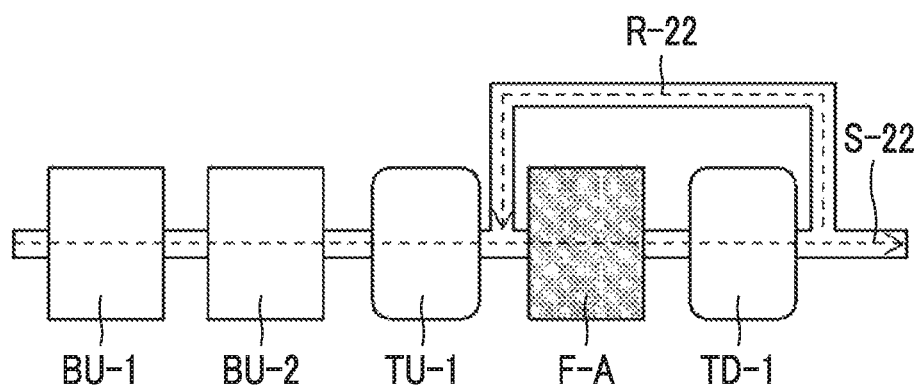
FIG. 22 shows a filtering device according to an embodiment of the present invention.
Figure 23:
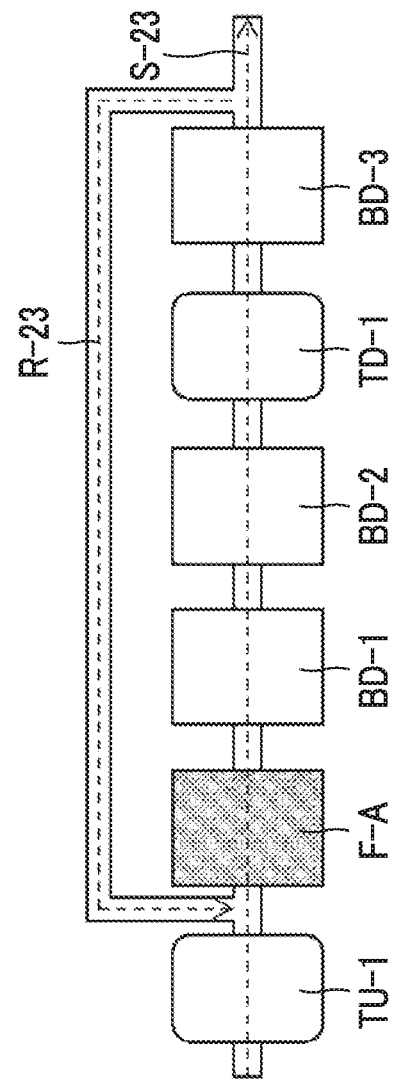
FIG. 23 shows a filtering device according to an embodiment of the present invention.
Figure 41:
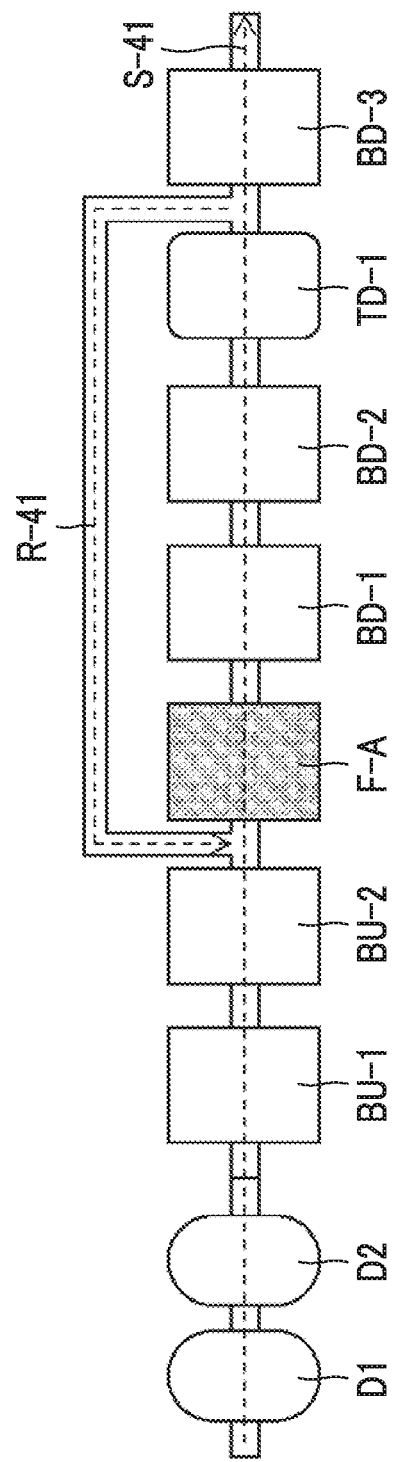
FIG. 41 shows a purification device according to an embodiment of the present invention.

|  | Filtering device (Purification device) | Liquid to be purified | | |
|---|---|---|---|---|
|  |  | Solvent | HSP ($\delta h$) $(MPa)^{1/2}$ | ClogP |
| Chemical liquid 1 | FIG. 11 | CHN | 5.1 | 0.9 |
| Chemical liquid 2 | FIG. 11 | CHN | 5.1 | 0.9 |
| Chemical liquid 3 | FIG. 11 | CHN | 5.1 | 0.9 |
| Chemical liquid 4 | FIG. 12 | CHN | 5.1 | 0.9 |
| Chemical liquid 5 | FIG. 12 | CHN | 5.1 | 0.9 |
| Chemical liquid 6 | FIG. 13 | CHN | 5.1 | 0.9 |
| Chemical liquid 7 | FIG. 14 | CHN | 5.1 | 0.9 |
| Chemical liquid 8 | FIG. 15 | CHN | 5.1 | 0.9 |
| Chemical liquid 9 | FIG. 16 | CHN | 5.1 | 0.9 |
| Chemical liquid 10 | FIG. 17 | CHN | 5.1 | 0.9 |
| Chemical liquid 11 | FIG. 17 | CHN | 5.1 | 0.9 |
| Chemical liquid 12 | FIG. 18 | CHN | 5.1 | 0.9 |
| Chemical liquid 13 | FIG. 41 | CHN | 5.1 | 0.9 |
| Chemical liquid 14 | FIG. 11 | CHN | 5.1 | 0.9 |
| Chemical liquid 15 | FIG. 12 | CHN | 5.1 | 0.9 |
| Chemical liquid 16 | FIG. 12 | CHN | 5.1 | 0.9 |
| Chemical liquid 17 | FIG. 12 | CHN | 5.1 | 0.9 |
| Chemical liquid 18 | FIG. 19 | CHN | 5.1 | 0.9 |
| Chemical liquid 19 | FIG. 20 | CHN | 5.1 | 0.9 |
| Chemical liquid 20 | FIG. 20 | CHN | 5.1 | 0.9 |
| Chemical liquid 21 | FIG. 21 | CHN | 5.1 | 0.9 |
| Chemical liquid 22 | FIG. 22 | CHN | 5.1 | 0.9 |
| Chemical liquid 23 | FIG. 23 | CHN | 5.1 | 0.9 |
| Chemical liquid 24 | FIG. 11 | CHN | 5.1 | 0.9 |
| Chemical liquid 25 | FIG. 11 | CHN | 5.1 | 0.9 |

TABLE 1 (1-2)

|  | Pre-washing of filter | Distiller | BU-1 Material component | BU-1 Pore size (nm) |
|---|---|---|---|---|
| Chemical liquid 1 | CHN 1 day immersion | Duplex | PP | 200 |
| Chemical liquid 2 | CHN 1 day immersion | Duplex | PP | 200 |
| Chemical liquid 3 | CHN 1 day immersion | Duplex | PP | 200 |
| Chemical liquid 4 | CHN 1 day immersion | Duplex | PP | 200 |
| Chemical liquid 5 | CHN 1 day immersion | Duplex | PP | 200 |
| Chemical liquid 6 | CHN 1 day immersion | Duplex | PP | 200 |
| Chemical liquid 7 | CHN 1 day immersion | Duplex | PP | 200 |
| Chemical liquid 8 | CHN 1 day immersion | Duplex | PP | 200 |
| Chemical liquid 9 | CHN 1 day immersion | Duplex | PP | 200 |
| Chemical liquid 10 | CHN 1 day immersion | Duplex | PFSA/PTFE | 20 |
| Chemical liquid 11 | CHN 1 day immersion | Duplex | PP | 200 |
| Chemical liquid 12 | CHN 1 day immersion | Duplex | — | — |
| Chemical liquid 13 | CHN 1 day immersion | Duplex | PP | 200 |
| Chemical liquid 14 | CHN 1 day immersion | Duplex | PTFE | 20 |
| Chemical liquid 15 | CHN 1 day immersion | Duplex | PP | 200 |
| Chemical liquid 16 | CHN 1 day immersion | Duplex | PP | 200 |
| Chemical liquid 17 | CHN 1 day immersion | Duplex | PP | 200 |
| Chemical liquid 18 | CHN 1 day immersion | — | PP | 200 |
| Chemical liquid 19 | CHN 1 day immersion | — | PP | 200 |
| Chemical liquid 20 | CHN 1 day immersion | — | PP | 200 |
| Chemical liquid 21 | CHN 1 day immersion | — | PP | 200 |
| Chemical liquid 22 | CHN 1 day immersion | — | PP | 200 |
| Chemical liquid 23 | CHN 1 day immersion | — | — | — |
| Chemical liquid 24 | — | Duplex | PP | 200 |
| Chemical liquid 25 | CHN 1 day immersion | Duplex | PP | 200 |

TABLE 1 (1-3)

|  | BU-2 Material component | BU-2 Pore size (nm) | Tank TU-1 | F-A Material component | F-A Pore size (nm) |
|---|---|---|---|---|---|
| Chemical liquid 1 | PFSA/PTFE | 20 | Present | Anion exchange group | 10 |
| Chemical liquid 2 | PFSA/PTFE | 20 | Present | Cation exchange group | 10 |
| Chemical liquid 3 | PFSA/PTFE | 20 | Present | Anion exchange group | 10 |
| Chemical liquid 4 | PFSA/PTFE | 20 | Present | Anion exchange group | 10 |
| Chemical liquid 5 | PFSA/PTFE | 20 | Present | Anion exchange group | 10 |
| Chemical liquid 6 | PFSA/PTFE | 20 | Present | Anion exchange group | 10 |
| Chemical liquid 7 | PFSA/PTFE | 20 | Present | Anion exchange group | 10 |
| Chemical liquid 8 | PFSA/PTFE | 20 | Present | Anion exchange group | 10 |

TABLE 1 (1-3)-continued

| | BU-2 | | | F-A | |
|---|---|---|---|---|---|
| | Material component | Pore size (nm) | Tank TU-1 | Material component | Pore size (nm) |
| Chemical liquid 9 | PTFE/PTFE | 20 | Present | Anion exchange group | 10 |
| Chemical liquid 10 | — | — | Present | Anion exchange group | 10 |
| Chemical liquid 11 | — | — | Present | Anion exchange group | 10 |
| Chemical liquid 12 | — | — | Present | Anion exchange group | 10 |
| Chemical liquid 13 | PFSA/PTFE | 20 | — | Anion exchange group | 10 |
| Chemical liquid 14 | PFSA/PTFE | 20 | Present | Anion exchange group | 10 |
| Chemical liquid 15 | PFSA/PTFE | 20 | Present | Anion exchange group | 10 |
| Chemical liquid 16 | PFSA/PTFE | 20 | Present | Anion exchange group | 10 |
| Chemical liquid 17 | PFSA/PTFE | 20 | Present | Anion exchange group | 10 |
| Chemical liquid 18 | PFSA/PTFE | 20 | Present | Anion exchange group | 10 |
| Chemical liquid 19 | PFSA/PTFE | 20 | Present | Anion exchange group | 10 |
| Chemical liquid 20 | PFSA/PTFE | 20 | Present | Anion exchange group | 10 |
| Chemical liquid 21 | PFSA/PTFE | 20 | Present | Anion exchange group | 10 |
| Chemical liquid 22 | PFSA/PTFE | 20 | Present | Anion exchange group | 10 |
| Chemical liquid 23 | — | — | Present | Anion exchange group | 10 |
| Chemical liquid 24 | PFSA/PTFE | 20 | Present | Anion exchange group | 10 |
| Chemical liquid 25 | PFSA/PTFE | 20 | Present | Anion exchange group | 20 |

TABLE 1 (1-4)

| | BD-1 | | BD-2 | | BD-3 | | |
|---|---|---|---|---|---|---|---|
| | Material component | Pore size (nm) | Material component | Pore size (nm) | Material component | Pore size (nm) | Tank TD-1 |
| Chemical liquid 1 | Nylon | 10 | UPE | 3 | PTFE | 10 | Present |
| Chemical liquid 2 | Nylon | 10 | UPE | 3 | PTFE | 10 | Present |
| Chemical liquid 3 | UPE | 3 | Nylon | 10 | PTFE | 10 | Present |
| Chemical liquid 4 | UPE | 3 | PTFE | 10 | — | — | Present |
| Chemical liquid 5 | Nylon | 10 | PTFE | 10 | — | — | Present |
| Chemical liquid 6 | Nylon | 10 | — | — | — | — | Present |
| Chemical liquid 7 | PTFE | 10 | — | — | — | — | Present |
| Chemical liquid 8 | — | — | — | — | — | — | Present |
| Chemical liquid 9 | Nylon | 10 | UPE | 3 | PTFE | 10 | — |
| Chemical liquid 10 | Nylon | 10 | UPE | 3 | PTFE | 10 | Present |
| Chemical liquid 11 | Nylon | 10 | UPE | 3 | PTFE | 10 | Present |
| Chemical liquid 12 | Nylon | 10 | UPE | 3 | PTFE | 10 | Present |
| Chemical liquid 13 | Nylon | 10 | UPE | 3 | PTFE | 10 | Present |
| Chemical liquid 14 | Nylon | 10 | UPE | 3 | PTFE | 10 | Present |
| Chemical liquid 15 | Nylon | 10 | UPE | 1 | — | — | Present |
| Chemical liquid 16 | Nylon | 10 | UPE | 10 | — | — | Present |
| Chemical liquid 17 | UPE | 3 | Nylon | 5 | — | — | Present |
| Chemical liquid 18 | Nylon | 10 | UPE | 3 | PTFE | 10 | Present |
| Chemical liquid 19 | UPE | 3 | PTFE | 10 | — | — | Present |
| Chemical liquid 20 | Nylon | 10 | PTFE | 10 | — | — | Present |
| Chemical liquid 21 | Nylon | 10 | — | — | — | — | Present |
| Chemical liquid 22 | — | — | — | — | — | — | Present |
| Chemical liquid 23 | Nylon | 10 | UPE | 3 | PTFE | 10 | Present |

TABLE 1 (1-4)-continued

|  | BD-1 | | BD-2 | | BD-3 | | |
| --- | --- | --- | --- | --- | --- | --- | --- |
|  | Material component | Pore size (nm) | Material component | Pore size (nm) | Material component | Pore size (nm) | Tank TD-1 |
| Chemical liquid 24 | Nylon | 10 | UPE | 3 | PTFE | 10 | Present |
| Chemical liquid 25 | Nylon | 10 | PTFE | 10 | PTFE | 10 | Present |

TABLE 1 (1-5)

|  |  | Evaluation 1 | | Evaluation 2 | Evaluation 3 | Evaluation 4 |
| --- | --- | --- | --- | --- | --- | --- |
|  | Evaluation method | Residue defect inhibition performance | Stain-like defect inhibition performance | Bridge defect inhibition performance | Pattern width uniformity | Pot life |
| Chemical liquid 1 | Pre-wetting | AA | AA | AA | AA | AA |
| Chemical liquid 2 | Pre-wetting | C | AA | B | AA | AA |
| Chemical liquid 3 | Pre-wetting | AA | AA | AA | AA | AA |
| Chemical liquid 4 | Pre-wetting | A | AA | AA | AA | AA |
| Chemical liquid 5 | Pre-wetting | A | AA | A | AA | AA |
| Chemical liquid 6 | Pre-wetting | B | AA | A | A | AA |
| Chemical liquid 7 | Pre-wetting | B | B | A | A | AA |
| Chemical liquid 8 | Pre-wetting | B | C | B | B | AA |
| Chemical liquid 9 | Pre-wetting | B | AA | B | A | AA |
| Chemical liquid 10 | Pre-wetting | AA | AA | AA | AA | B |
| Chemical liquid 11 | Pre-wetting | AA | AA | AA | A | AA |
| Chemical liquid 12 | Pte-wetting | AA | AA | AA | A | B |
| Chemical liquid 13 | Pre-wetting | A | A | A | A | AA |
| Chemical liquid 14 | Pre-wetting | A | AA | AA | AA | A |
| Chemical liquid 15 | Pre-wetting | AA | A | AA | AA | AA |
| Chemical liquid 16 | Pre-wetting | A | A | A | A | AA |
| Chemical liquid 17 | Pre-wetting | AA | A | AA | AA | AA |
| Chemical liquid 18 | Pre-wetting | B | A | A | B | B |
| Chemical liquid 19 | Pre-wetting | C | A | A | B | B |
| Chemical liquid 20 | Pre-wetting | C | A | B | B | B |
| Chemical liquid 21 | Pre-wetting | D | C | B | C | B |
| Chemical liquid 22 | Pre-wetting | C | D | C | C | B |
| Chemical liquid 23 | Pre-wetting | A | A | A | B | D |
| Chemical liquid 24 | Pre-wetting | B | C | B | B | AA |
| Chemical liquid 25 | Pre-wetting | A | AA | A | AA | AA |

TABLE 1 (2-1)

Figure 24:
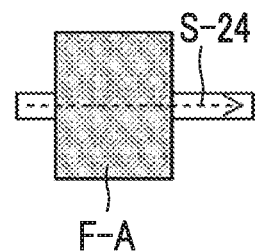
FIG. 24 shows a filtering device according to the related art.

| | Liquid to be purified | | | |
|---|---|---|---|---|
| | Filtering device (Purification device) | Solvent | HSP (δh) $(MPa)^{1/2}$ | ClogP |
| Chemical liquid 26 | FIG. 11 | CHN | 5.1 | 0.9 |
| Chemical liquid 27 | FIG. 11 | nBA | 6.3 | 1.8 |
| Chemical liquid 28 | FIG. 11 | nBA | 6.3 | 1.8 |
| Chemical liquid 29 | FIG. 11 | PGME | 11.6 | 0.7 |
| Chemical liquid 30 | FIG. 11 | PGMEA | 9.8 | 0.6 |
| Chemical liquid 31 | FIG. 11 | PGMEA | 9.8 | 0.6 |
| Chemical liquid 32 | FIG. 11 | PGMEA/PGME (3:7) | 11.1 | 0.7 |
| Chemical liquid 33 | FIG. 11 | PGMEA/PGME (3:7) | 11.1 | 0.7 |
| Chemical liquid 34 | FIG. 11 | EL | 12.5 | 0.3 |
| Chemical liquid 35 | FIG. 11 | nBA | 6.3 | 1.8 |
| Chemical liquid 36 | FIG. 11 | CHN | 5.1 | 0.9 |
| Chemical liquid 37 | FIG. 11 | nBA | 6.3 | 1.8 |
| Chemical liquid 38 | FIG. 11 | PGME | 11.6 | 0.7 |
| Chemical liquid 39 | FIG. 11 | PGMEA | 9.8 | 0.6 |
| Chemical liquid 40 | FIG. 11 | EL | 12.5 | 0.3 |
| Chemical liquid 41 | FIG. 24 | CHN | 5.1 | 0.9 |
| Chemical liquid 42 | FIG. 24 | CHN | 5.1 | 0.9 |
| Chemical liquid 43 | FIG. 24 | nBA | 6.3 | 1.8 |
| Chemical liquid 44 | FIG. 24 | nBA | 6.3 | 1.8 |
| Chemical liquid 45 | FIG. 24 | PGMEA | 9.8 | 0.6 |
| Chemical liquid 46 | FIG. 24 | PGMEA | 9.8 | 0.6 |
| Chemical liquid 47 | FIG. 24 | PGME | 11.6 | 0.7 |
| Chemical liquid 48 | FIG. 24 | PGME | 11.6 | 0.7 |
| Chemical liquid 49 | FIG. 11 | MIBC | 12.3 | 1.5 |

TABLE 1 (2-2)

| | BU-1 | | | |
|---|---|---|---|---|
| | Pre-washing of filter | Distiller | Material component | Pore size (nm) |
| Chemical liquid 26 | CHN 1 day immersion | Duplex | PP | 200 |
| Chemical liquid 27 | nBA 1 day immersion | Duplex | PP | 200 |
| Chemical liquid 28 | nBA 1 day immersion | Duplex | PP | 200 |
| Chemical liquid 29 | PGME 1 day immersion | Duplex | PP | 200 |
| Chemical liquid 30 | PGMEA 1 day immersion | Duplex | PP | 200 |
| Chemical liquid 31 | PGMEA 1 day immersion | Duplex | PP | 200 |
| Chemical liquid 32 | PGMEA/PGME 1 day immersion | Duplex | PP | 200 |
| Chemical liquid 33 | PGMEA/PGME 1 day immersion | Duplex | PP | 200 |
| Chemical liquid 34 | EL 1 day immersion | Duplex | PP | 200 |
| Chemical liquid 35 | nBA 1 day immersion | Duplex | PP | 200 |
| Chemical liquid 36 | CHN 1 day immersion | Duplex | PP | 200 |
| Chemical liquid 37 | nBA 1 day immersion | Duplex | PP | 200 |
| Chemical liquid 38 | PGME 1 day immersion | Duplex | PP | 200 |
| Chemical liquid 39 | PGMEA 1 day immersion | Duplex | PP | 200 |
| Chemical liquid 40 | EL 1 day immersion | Duplex | PP | 200 |
| Chemical liquid 41 | — | — | — | — |
| Chemical liquid 42 | — | — | — | — |
| Chemical liquid 43 | — | — | — | — |
| Chemical liquid 44 | — | — | — | — |
| Chemical liquid 45 | — | — | — | — |
| Chemical liquid 46 | — | — | — | — |
| Chemical liquid 47 | — | — | — | — |
| Chemical liquid 48 | — | — | — | — |
| Chemical liquid 49 | MIBC 1 day immersion | Duplex | PP | 200 |

TABLE 1 (2-3)

| | BL-2 | | | F-A | |
|---|---|---|---|---|---|
| | Material component | Pore size (nm) | Tank TU-1 | Material component | Pore size (nm) |
| Chemical liquid 26 | PFSA/PTFE | 20 | Present | Anion exchange group | 5 |
| Chemical liquid 27 | PFSA/PTFE | 20 | Present | Cation exchange group | 10 |
| Chemical liquid 28 | PFSA/PTFE | 20 | Present | Anion exchange group | 10 |
| Chemical liquid 29 | PFSA/PTFE | 20 | Present | Cation exchange group | 10 |
| Chemical liquid 30 | PFSA/PTFE | 20 | Present | Anion exchange group | 10 |
| Chemical liquid 31 | PFSA/PTFE | 20 | Present | Cation exchange group | 10 |
| Chemical liquid 32 | PFSA/PTFE | 20 | Present | Cation exchange group | 10 |
| Chemical liquid 33 | PFSA/PTFE | 20 | Present | Anion exchange group | 10 |
| Chemical liquid 34 | PFSA/PTFE | 20 | Present | Cation exchange group | 10 |
| Chemical liquid 35 | PFSA/PTFE | 20 | Present | Cation exchange group | 10 |
| Chemical liquid 36 | PFSA/PTFE | 20 | Present | Anion exchange group | 10 |
| Chemical liquid 37 | PFSA/PTFE | 20 | Present | Cation exchange group | 10 |
| Chemical liquid 38 | PFSA/PTFE | 20 | Present | Cation exchange group | 10 |
| Chemical liquid 39 | PFSA/PTFE | 20 | Present | Anion exchange group | 10 |

TABLE 1 (2-3)-continued

| | BL-2 | | | F-A | |
|---|---|---|---|---|---|
| | Material component | Pore size (nm) | Tank TU-1 | Material component | Pore size (nm) |
| Chemical liquid 40 | PFSA/PTFE | 20 | Present | Cation exchange group | 10 |
| Chemical liquid 41 | — | — | — | Anion exchange group | 10 |
| Chemical liquid 42 | — | — | — | Cation exchange group | 10 |
| Chemical liquid 43 | — | — | — | Cation exchange group | 10 |
| Chemical liquid 44 | — | — | — | Anion exchange group | 10 |
| Chemical liquid 45 | — | — | — | Anion exchange group | 10 |
| Chemical liquid 46 | — | — | — | Anion exchange group | 10 |
| Chemical liquid 47 | — | — | — | Cation exchange group | 10 |
| Chemical liquid 48 | — | — | — | Cation exchange group | 10 |
| Chemical liquid 49 | PFSA'PTFE | 20 | Present | Cation exchange group | 10 |

TABLE 1 (2-4)

| | BD-1 | | BD-2 | | BD-3 | | |
|---|---|---|---|---|---|---|---|
| | Material component | Pore size (nm) | Material component | Pore size (nm) | Material component | Pore size (nm) | Tank TD-1 |
| Chemical liquid 26 | Nylon | 10 | PTFE | 10 | PTFE | 10 | Present |
| Chemical liquid 27 | Nylon | 10 | UPE | 3 | PTFE | 10 | Present |
| Chemical liquid 28 | Nylon | 10 | UPE | 3 | PTFE | 10 | Present |
| Chemical liquid 29 | Nylon | 10 | UPE | 3 | PTFE | 10 | Present |
| Chemical liquid 30 | Nylon | 10 | UPE | 3 | PTFE | 10 | Present |
| Chemical liquid 31 | Nylon | 10 | UPE | 3 | PTFE | 10 | Present |
| Chemical liquid 32 | Nylon | 10 | UPE | 3 | PTFE | 10 | Present |
| Chemical liquid 33 | Nylon | 10 | UPE | 3 | PTFE | 10 | Present |
| Chemical liquid 34 | Nylon | 10 | UPE | 3 | PTFE | 10 | Present |
| Chemical liquid 35 | Nylon | 10 | UPE | 3 | PTFE | 10 | Present |
| Chemical liquid 36 | Nylon | 10 | UPE | 3 | PTFE | 10 | Present |
| Chemical liquid 37 | Nylon | 10 | UPE | 3 | PTFE | 10 | Present |
| Chemical liquid 38 | Nylon | 10 | UPE | 3 | PTFE | 10 | Present |
| Chemical liquid 39 | Nylon | 10 | UPE | 3 | PTFE | 10 | Present |
| Chemical liquid 40 | Nylon | 10 | UPE | 3 | PTFE | 10 | Present |
| Chemical liquid 41 | — | — | — | — | — | — | — |
| Chemical liquid 42 | — | — | — | — | — | — | — |
| Chemical liquid 43 | — | — | — | — | — | — | — |
| Chemical liquid 44 | — | — | — | — | — | — | — |
| Chemical liquid 45 | — | — | — | — | — | — | — |
| Chemical liquid 46 | — | — | — | — | — | — | — |
| Chemical liquid 47 | — | — | — | — | — | — | — |
| Chemical liquid 48 | — | — | — | — | — | — | — |
| Chemical liquid 49 | Nylon | 10 | UPE | 3 | PTFE | 10 | Present |

TABLE 1 (2-5)

|  | Evaluation method | Evaluation 1 Residue defect inhibition performance | Stain-like defect inhibition performance | Evaluation 2 Bridge defect inhibition performance | Evaluation 3 Pattern width uniformity | Evaluation 4 Pot life |
|---|---|---|---|---|---|---|
| Chemical liquid 26 | Pre-wetting | A | AA | AA | AA | AA |
| Chemical liquid 27 | Developer | AA | AA | AA | AA | AA |
| Chemical liquid 28 | Developer | C | AA | B | AA | AA |
| Chemical liquid 29 | Pre-wetting | AA | AA | AA | AA | AA |
| Chemical liquid 30 | Pre-wetting | AA | AA | AA | AA | AA |
| Chemical liquid 31 | Pre-wetting | C | AA | B | AA | AA |
| Chemical liquid 32 | Pre-wetting | AA | AA | AA | AA | AA |
| Chemical liquid 33 | Pre-wetting | C | AA | B | AA | AA |
| Chemical liquid 34 | Pre-wetting | AA | AA | AA | AA | AA |
| Chemical liquid 35 | Developer | AA | AA | AA | AA | AA |
| Chemical liquid 36 | Pre-wetting | A | AA | AA | B | AA |
| Chemical liquid 37 | Developer | A | AA | AA | B | AA |
| Chemical liquid 38 | Pre-wetting | A | AA | AA | B | AA |
| Chemical liquid 39 | Pre-wetting | A | AA | AA | B | AA |
| Chemical liquid 40 | Pre-wetting | A | AA | AA | B | AA |
| Chemical liquid 41 | Pre-wetting | E | F | E | E | Standard |
| Chemical liquid 42 | Pre-wetting | F | F | E | E | D |
| Chemical liquid 43 | Developer | E | F | E | E | D |
| Chemical liquid 44 | Developer | F | F | E | E | D |
| Chemical liquid 45 | Pre-wetting | E | F | E | E | D |
| Chemical liquid 46 | Pre-wetting | F | F | E | E | D |
| Chemical liquid 47 | Pre-wetting | E | F | E | E | D |
| Chemical liquid 48 | Pre-wetting | F | F | E | E | D |
| Chemical liquid 49 | Rinsing | AA | AA | AA | AA | AA |

Table 1 is divided into a first group: Table 1 (1-1) to Table 1 (1-5) and a second group: Table 1 (2-1) to Table 1 (2-5), and Table 2 is divided into a first group: Table 2 (1-1) to Table 2 (1-5) and a second group: Table 2 (3-1) to Table 2 (3-5).

In the corresponding lines of five tables of each group subdivided from Tables 1 and 2, the filters included in the filtering device (or the purification device) used for the purifying each chemical liquid and the evaluation results of the obtained chemical liquid are described.

For example, in the first line in Table 1 (1-1) to Table 1 (1-5) as a first group of Table 1, the chemical liquid 1 is described.

The first line shows that the chemical liquid 1 was manufactured by the purification device described in FIG. 11, the liquid to be purified used for manufacturing the chemical liquid 1 contained cyclohexanone (CHN), a hydrogen bond element as a Hansen parameter (described as "HSP (δh)" in the table) of the chemical liquid 1 was 5.1 (MPa)$^{1/2}$, and a C log P value of the chemical liquid 1 was 0.9. In addition, the first line shows that the filter of the purification device used for manufacturing the chemical liquid 1 was washed in advance under the condition of "CHN 1 day immersion". Furthermore, the first line shows that the purification device has a duplex distiller, BU-1 (PP-containing filter having a pore size of 200 nm disposed on the uppermost stream side of the flow path), BU-2 (PFSA/PTFE filter having a pore size of 20 nm disposed on the downstream side of BU-1), a tank TU-1 disposed on the upstream side of the filter A (F-A), and a grafted ultra-high-molecular-weight polyethylene membrane having a pore size of 10 nm described in paragraph "0099" of JP2017-536232A as F-A (filter A), has BD-1 (nylon-containing filter having a pore size of 10 nm), BD-2 (UPE-containing filter having a pore size of 3 nm), and BD-3 (PTFE-containing filter having a pore size of 10 nm) on the downstream side of the filter F-A, and has a tank TD-1 on the downstream side of the filter F-A.

The first line also shows that the chemical liquid 1 was evaluated by the "Pre-wetting" method, the residue defect inhibition performance was AA, the stain-like defect inhibition performance was AA, the bridge defect inhibition performance was AA, the pattern width uniformity was AA, and the pot life of the filter of the purification device was AA.

Likewise, for the chemical liquids 2 to 25, the results are described in the tables of the first group, and for the chemical liquids 26 to 49, the results are described in the tables of the second group.

Furthermore, for the chemical liquids 200 to 227, the results are described in the tables of the first group of Table 2, and for the chemical liquids 255 to 282, the results are described in the tables of the second group of Table 2.

TABLE 2 (1-1)

Figure 25:
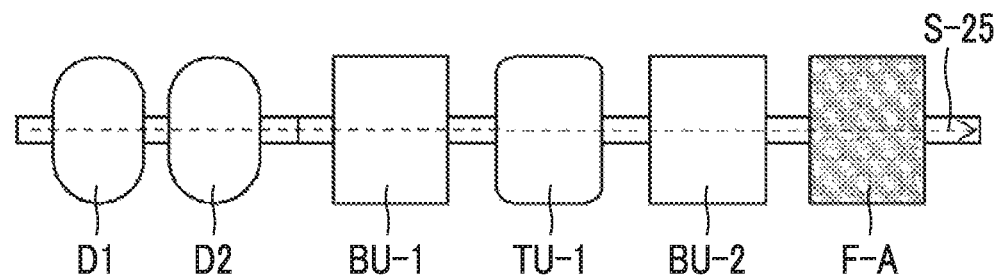
FIG. 25 shows a purification device according to an embodiment of the present invention.
Figure 26:
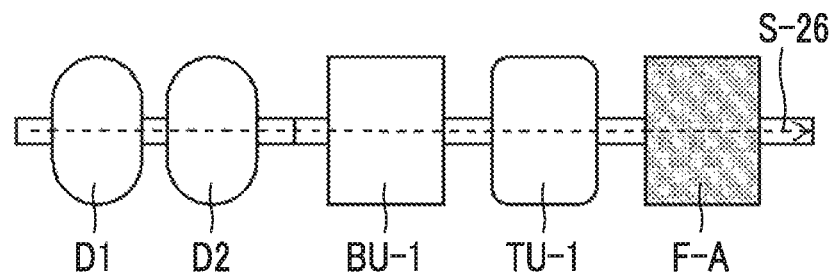
FIG. 26 shows a purification device according to an embodiment of the present invention.
Figure 27:
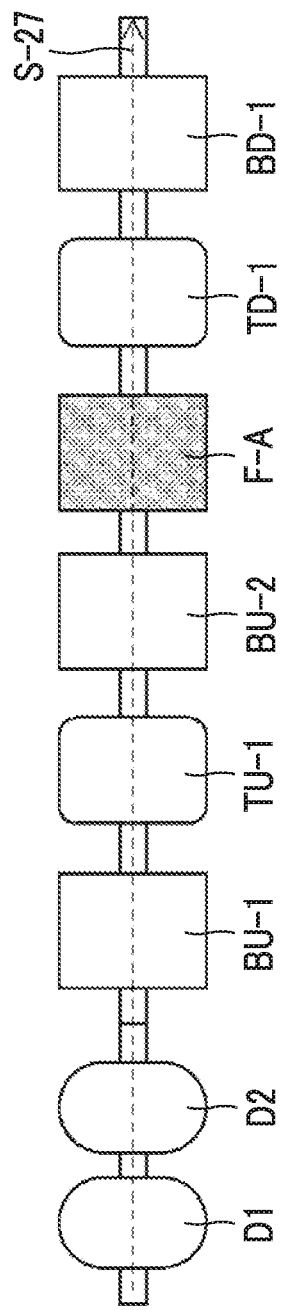
FIG. 27 shows a purification device according to an embodiment of the present invention.
Figure 28:
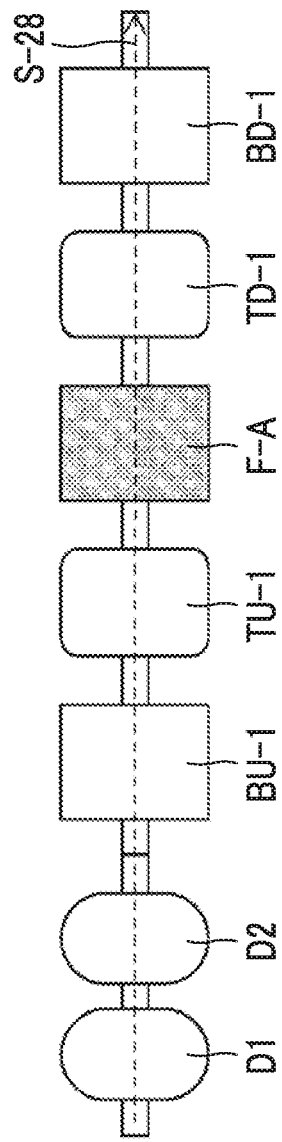
FIG. 28 shows a purification device according to an embodiment of the present invention.
Figure 29:
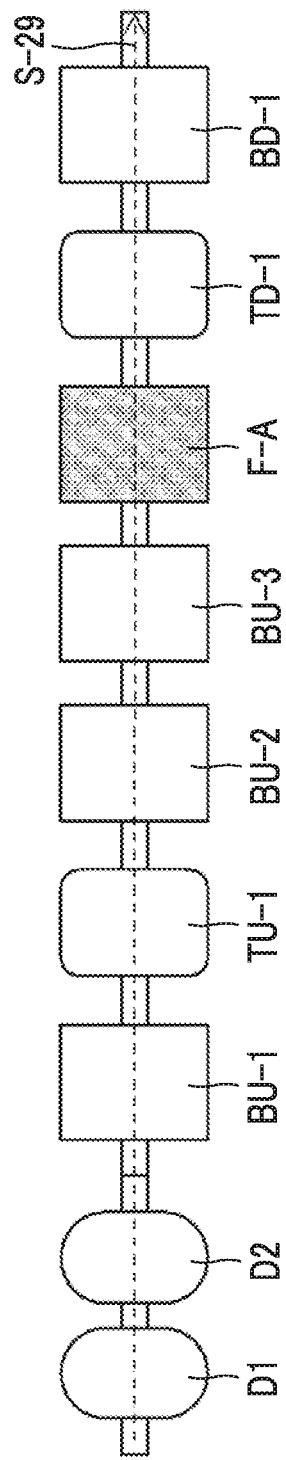
FIG. 29 shows a purification device according to an embodiment of the present invention.
Figure 30:
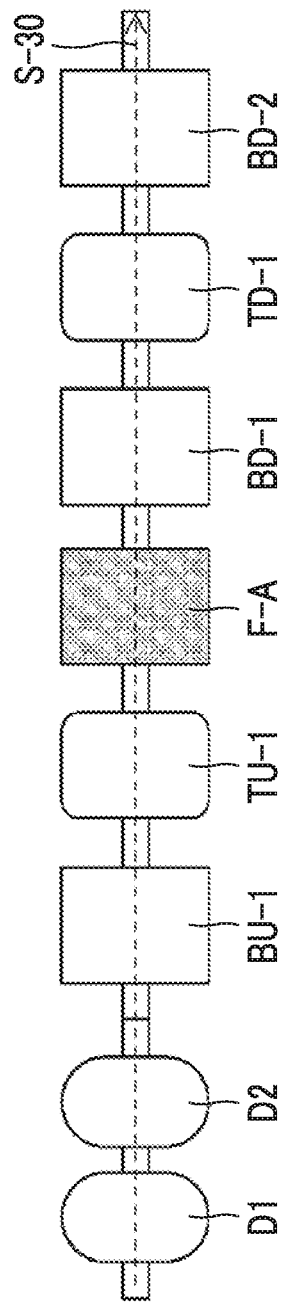
FIG. 30 shows a purification device according to an embodiment of the present invention.
Figure 36:
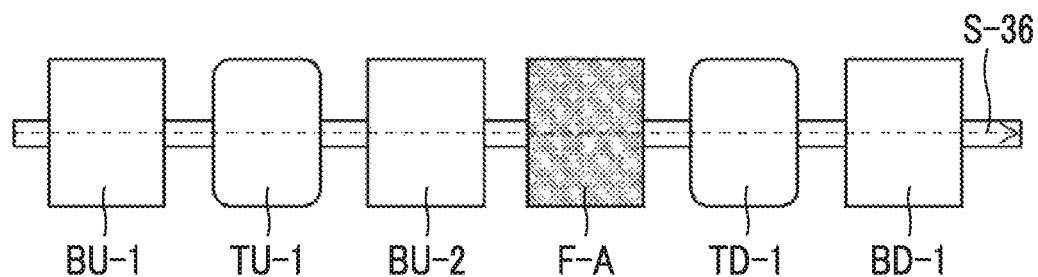
FIG. 36 shows a filtering device according to an embodiment of the present invention.
Figure 40:
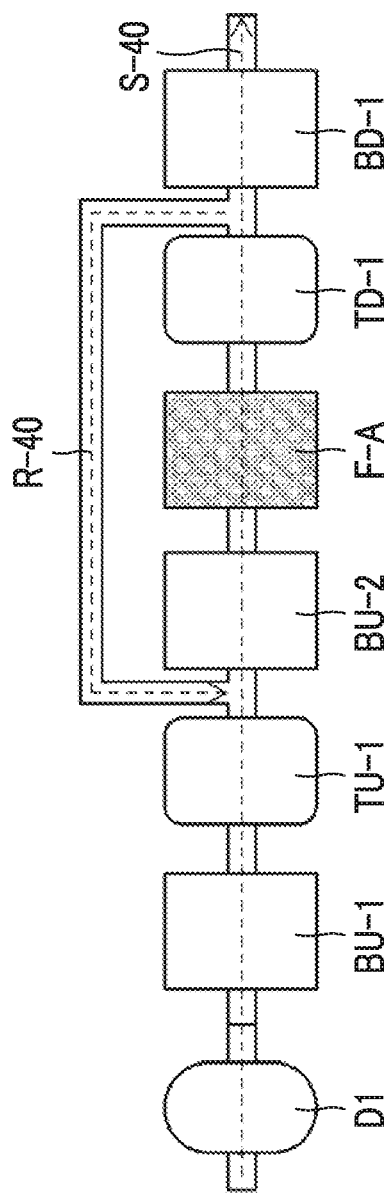
FIG. 40 shows a purification device according to an embodiment of the present invention.

| | Filtering device (Purification device) | Solvent | ΔPs | ΔPe | \|ΔPs − ΔPe\| |
|---|---|---|---|---|---|
| Chemical liquid 200 | FIG. 25 | PGMEA | 18.1 | 22.2 | 4.1 |
| Chemical liquid 201 | FIG. 25 | PGMEA | 18.1 | 22.2 | 4.1 |
| Chemical liquid 202 | FIG. 25 | PGMEA | 18.1 | 22.2 | 4.1 |
| Chemical liquid 203 | FIG. 25 | PGMEA | 18.1 | 22.2 | 4.1 |
| Chemical liquid 204 | FIG. 26 | PGMEA | 18.1 | 22.2 | 4.1 |
| Chemical liquid 205 | FIG. 27 | PGMEA | 18.1 | 22.2 | 4.1 |
| Chemical liquid 206 | FIG. 27 | PGMEA | 18.1 | 22.2 | 4.1 |
| Chemical liquid 207 | FIG. 29 | PGMEA | 18.1 | 22.2 | 4.1 |
| Chemical liquid 208 | FIG. 29 | PGMEA | 18.1 | 22.2 | 4.1 |
| Chemical liquid 209 | FIG. 27 | PGMEA | 18.1 | 22.2 | 4.1 |
| Chemical liquid 210 | FIG. 27 | PGMEA | 18.1 | 22.2 | 4.1 |
| Chemical liquid 211 | FIG. 27 | PGMEA | 18.1 | 22.2 | 4.1 |
| Chemical liquid 212 | FIG. 27 | PGMEA | 18.1 | 22.2 | 4.1 |
| Chemical liquid 213 | FIG. 28 | PGMEA | 18.1 | 22.2 | 4.1 |
| Chemical liquid 214 | FIG. 28 | PGMEA | 18.1 | 22.2 | 4.1 |
| Chemical liquid 215 | FIG. 30 | PGMEA | 18.1 | 22.2 | 4.1 |
| Chemical liquid 216 | FIG. 31 | PGMEA | 18.1 | 22.2 | 4.1 |
| Chemical liquid 217 | FIG. 27 | PGMEA | 18.1 | 22.2 | 4.1 |
| Chemical liquid 218 | FIG. 27 | PGMEA | 18.1 | 22.2 | 4.1 |
| Chemical liquid 219 | FIG. 32 | PGMEA | 18.1 | 22.2 | 4.1 |
| Chemical liquid 220 | FIG. 33 | PGMEA | 18.1 | 22.2 | 4.1 |
| Chemical liquid 221 | FIG. 27 | PGMEA | 18.1 | 22.2 | 4.1 |
| Chemical liquid 222 | FIG. 34 | PGMEA | 18.1 | 22.2 | 4.1 |
| Chemical liquid 223 | FIG. 35 | PGMEA | 18.1 | 22.2 | 4.1 |
| Chemical liquid 224 | FIG. 40 | PGMEA | 18.1 | 22.2 | 4.1 |
| Chemical liquid 225 | FIG. 40 | PGMEA | 18.1 | 22.2 | 4.1 |
| Chemical liquid 226 | FIG. 40 | PGMEA | 18.1 | 22.2 | 4.1 |
| Chemical liquid 227 | FIG. 40 | PGMEA | 18.1 | 22.2 | 4.1 |

TABLE 2 (1-2)

| | Pre-washing of filter | Distiller | BU-1 Material component | BU-1 Pore size (nm) | BU-2 Material component | BU-2 Pore size (nm) |
|---|---|---|---|---|---|---|
| Chemical liquid 200 | PGMEA 1 day immersion | Duplex | UPE | 50 | Nylon | 10 |
| Chemical liquid 201 | PGMEA 1 day immersion | Duplex | UPE | 50 | Nylon | 10 |
| Chemical liquid 202 | PGMEA 1 day immersion | Duplex | PP | 200 | Nylon | 10 |
| Chemical liquid 203 | PGMEA 1 day immersion | Duplex | PTFE | 20 | Nylon | 10 |
| Chemical liquid 204 | PGMEA 1 day immersion | Duplex | UPE | 50 | — | — |
| Chemical liquid 205 | PGMEA 1 day immersion | Duplex | UPE | 50 | Nylon | 10 |
| Chemical liquid 206 | PGMEA 1 day immersion | Duplex | UPE | 50 | Nylon | 10 |
| Chemical liquid 207 | PGMEA 1 day immersion | Duplex | UPE | 50 | Nylon | 10 |
| Chemical liquid 208 | PGMEA 1 day immersion | Duplex | UPE | 50 | Nylon | 10 |
| Chemical liquid 209 | PGMEA 1 day immersion | Duplex | UPE | 50 | Nylon | 10 |
| Chemical liquid 210 | PGMEA 1 day immersion | Duplex | PTFE | 20 | Nylon | 10 |
| Chemical liquid 211 | PGMEA 1 day immersion | Duplex | PP | 200 | Nylon | 10 |
| Chemical liquid 212 | PGMEA 1 day immersion | Duplex | UPE | 50 | UPE | 10 |

TABLE 2 (1-2)-continued

|  | Pre-washing of filter | Distiller | BU-1 Material component | BU-1 Pore size (nm) | BU-2 Material component | BU-2 Pore size (nm) |
|---|---|---|---|---|---|---|
| Chemical liquid 213 | PGMEA 1 day immersion | Duplex | UPE | 50 | — | — |
| Chemical liquid 214 | PGMEA 1 day immersion | Duplex | UPE | 50 | — | — |
| Chemical liquid 215 | PGMEA 1 day immersion | Duplex | UPE | 50 | — | — |
| Chemical liquid 216 | PGMEA 1 day immersion | Duplex | UPE | 50 | Nylon | 10 |
| Chemical liquid 217 | PGMEA 1 day immersion | Duplex | UPE | 50 | Nylon | 10 |
| Chemical liquid 218 | PGMEA 1 day immersion | Duplex | UPE | 50 | Nylon | 10 |
| Chemical liquid 219 | PGMEA 1 day immersion | Duplex | UPE | 50 | IEX | 20 |
| Chemical liquid 220 | PGMEA 1 day immersion | Duplex | Nylon | 10 | — | — |
| Chemical liquid 221 | — | Duplex | UPE | 50 | Nylon | 10 |
| Chemical liquid 222 | PGMEA 1 day immersion | Duplex | UPE | 50 | Nylon | 10 |
| Chemical liquid 223 | PGMEA 1 day immersion | Simplex | UPE | 50 | Nylon | 10 |
| Chemical liquid 224 | PGMEA 1 day immersion | Simplex | UPE | 50 | Nylon | 10 |
| Chemical liquid 225 | PGMEA 1 day immersion | Simplex | UPE | 50 | Nylon | 10 |
| Chemical liquid 226 | PGMEA 1 day immersion | Simplex | UPE | 50 | Nylon | 10 |
| Chemical liquid 227 | PGMEA 1 day immersion | Simplex | UPE | 50 | Nylon | 10 |

TABLE 2 (1-3)

|  | BU-3 Material component | BU-3 Pore size (nm) | Tank TU-1 | F-A Material component | F-A Pore size (nm) | BD-1 Material component | BD-1 Pore size (nm) |
|---|---|---|---|---|---|---|---|
| Chemical liquid 200 | — | — | Present | Neutral group-grafted UPE1 | 5 | — | — |
| Chemical liquid 201 | — | — | Present | Neutral group-grafted UPE1 | 5 | — | — |
| Chemical liquid 202 | — | — | Present | Neutral group-grafted UPE1 | 5 | — | — |
| Chemical liquid 203 | — | — | Present | Neutral group-grafted UPE1 | 5 | — | — |
| Chemical liquid 204 | — | — | Present | Neutral group-grafted UPE1 | 5 | — | — |
| Chemical liquid 205 | — | — | Present | Neutral group-grafted UPE1 | 5 | PTFE | 7 |
| Chemical liquid 206 | — | — | Present | Neutral group-grafted UPE1 | 5 | PTFE | 7 |
| Chemical liquid 207 | Nylon | 10 | Present | Neutral group-grafted UPE1 | 5 | PIPE | 7 |
| Chemical liquid 208 | UPE | 10 | Present | Neutral group-grafted UPE1 | 5 | PIPE | 7 |
| Chemical liquid 209 | — | — | Present | Neutral group-grafted UPE1 | 5 | PIPE | 20 |
| Chemical liquid 210 | — | — | Present | Neutral group-grafted UPE1 | 5 | PIPE | 7 |
| Chemical liquid 211 | — | — | Present | Neutral group-grafted UPE1 | 5 | PTFE | 7 |
| Chemical liquid 212 | — | — | Present | Neutral group-grafted UPE1 | 5 | PTFE | 7 |
| Chemical liquid 213 | — | — | Present | Neutral group-grafted UPE1 | 5 | PTFE | 7 |
| Chemical liquid 214 | — | — | Present | Neutral group-grafted UPE1 | 20 | PTFE | 7 |
| Chemical liquid 215 | — | — | Present | Neutral group-grafted UPE1 | 5 | Nylon | 5 |
| Chemical liquid 216 | — | — | Present | Neutral group-grafted UPE1 | 5 | UPE | 1 |

TABLE 2 (1-3)-continued

| | BU-3 | | | F-A | | BD-1 | |
|---|---|---|---|---|---|---|---|
| | Material component | Pore size (nm) | Tank TU-1 | Material component | Pore size (nm) | Material component | Pore size (nm) |
| Chemical liquid 217 | — | — | Present | Neutral group-grafted UPE1 | 5 | UPE | 3 |
| Chemical liquid 218 | — | — | Present | Neutral group-grafted UPE1 | 5 | Nylon | 5 |
| Chemical liquid 219 | Nylon | 10 | Present | Neutral group-grafted UPE1 | 5 | PTFE | 7 |
| Chemical liquid 220 | — | — | Present | Neutral group-grafted UPE1 | 5 | PTFE | 7 |
| Chemical liquid 221 | — | — | Present | Neutral group-grafted UPE1 | 5 | PTFE | 7 |
| Chemical liquid 222 | — | — | Present | Neutral group-grafted UPE1 | 5 | PTFE | 7 |
| Chemical liquid 223 | — | — | Present | Neutral group-grafted UPE1 | 5 | PTFE | 7 |
| Chemical liquid 224 | — | — | Present | Neutral group-grafted UPE1 | 5 | PTFE | 7 |
| Chemical liquid 225 | — | — | Present | Neutral group-grafted UPE1 | 5 | PTFE | 7 |
| Chemical liquid 226 | — | — | Present | Neutral group-grafted UPE1 | 5 | PTFE | 7 |
| Chemical liquid 227 | — | — | Present | Neutral group-grafted UPE1 | 5 | PTFE | 7 |

TABLE 2 (1-4)

| | BD-2 | | | | |
|---|---|---|---|---|---|
| | Material component | Pore size (nm) | Circulation | Tank TD-1 | Evaluation method |
| Chemical liquid 200 | — | — | — | — | Pre-wetting |
| Chemical liquid 201 | — | — | — | — | Pre-wetting |
| Chemical liquid 202 | — | — | — | — | Pre-wetting |
| Chemical liquid 203 | — | — | — | — | Pre-wetting |
| Chemical liquid 204 | — | — | — | — | Pre-wetting |
| Chemical liquid 205 | — | — | — | Present | Pre-wetting |
| Chemical liquid 206 | — | — | — | Present | Pre-wetting |
| Chemical liquid 207 | — | — | — | Present | Pre-wetting |
| Chemical liquid 208 | — | — | — | Present | Pre-wetting |
| Chemical liquid 209 | — | — | — | Present | Pre-wetting |
| Chemical liquid 210 | — | — | — | Present | Pre-wetting |
| Chemical liquid 211 | — | — | — | Present | Pre-wetting |
| Chemical liquid 212 | — | — | — | Present | Pre-wetting |
| Chemical liquid 213 | — | — | — | Present | Pre-wetting |
| Chemical liquid 214 | — | — | — | Present | Pre-wetting |
| Chemical liquid 215 | PTFE | 7 | — | Present | Pre-wetting |
| Chemical liquid 216 | PTFE | 7 | — | Present | Pre-wetting |
| Chemical liquid 217 | — | — | — | Present | Pre-wetting |
| Chemical liquid 218 | — | — | — | Present | Pre-wetting |
| Chemical liquid 219 | — | — | — | Present | Pre-wetting |
| Chemical liquid 220 | — | — | — | Present | Pre-wetting |
| Chemical liquid 221 | — | — | — | Present | Pre-wetting |
| Chemical liquid 222 | — | — | — | — | Pre-wetting |
| Chemical liquid 223 | — | — | — | Present | Pre-wetting |
| Chemical liquid 224 | — | — | Once | Present | Pre-wetting |
| Chemical liquid 225 | — | — | Twice | Present | Pre-wetting |
| Chemical liquid 226 | — | — | Four times | Present | Pre-wetting |
| Chemical liquid 227 | — | — | 10 times | Present | Pre-wetting |

TABLE 2 (1-5)

| | Evaluation 1 | Evaluation 2 | Evaluation 3 | | |
|---|---|---|---|---|---|
| | Residue defect inhibition performance | Stain-like defect inhibition performance | Bridge defect inhibition performance | Pattern width uniformity | Evaluation 4 Pot life |
| Chemical liquid 200 | A | B | A | A | A |
| Chemical liquid 201 | AA | AA | AA | AA | AA |
| Chemical liquid 202 | B | A | A | A | B |
| Chemical liquid 203 | B | A | A | A | A |
| Chemical liquid 204 | B | B | B | A | A |
| Chemical liquid 205 | AA | AA | AA | AA | AA |

TABLE 2 (1-5)-continued

| | Evaluation 1 | | | Evaluation 2 | Evaluation 3 | |
|---|---|---|---|---|---|---|
| | Residue defect inhibition performance | Stain-like defect inhibition performance | Bridge defect inhibition performance | Pattern width uni-formity | | Evaluation 4 Pot life |
| Chemical liquid 206 | AA | AA | AA | AA | | AA |
| Chemical liquid 207 | AA | AA | AA | AA | | AA |
| Chemical liquid 208 | AA | AA | AA | AA | | AA |
| Chemical liquid 209 | AA | AA | A | AA | | AA |
| Chemical liquid 210 | AA | AA | AA | AA | | AA |
| Chemical liquid 211 | AA | AA | AA | AA | | AA |
| Chemical liquid 212 | AA | AA | AA | AA | | AA |
| Chemical liquid 213 | A | AA | A | AA | | AA |
| Chemical liquid 214 | B | A | B | A | | AA |
| Chemical liquid 215 | AA | AA | AA | AA | | AA |
| Chemical liquid 216 | AA | AA | AA | AA | | AA |
| Chemical liquid 217 | A | AA | A | AA | | AA |
| Chemical liquid 218 | A | AA | A | AA | | AA |
| Chemical liquid 219 | AA | AA | AA | AA | | AA |
| Chemical liquid 220 | AA | AA | AA | AA | | B |
| Chemical liquid 221 | B | B | B | AA | | AA |
| Chemical liquid 222 | B | AA | B | A | | AA |
| Chemical liquid 223 | B | B | A | B | | B |
| Chemical liquid 224 | B | B | A | A | | B |
| Chemical liquid 225 | A | A | AA | A | | B |
| Chemical liquid 226 | AA | AA | AA | AA | | B |
| Chemical liquid 227 | AA | AA | AA | AA | | B |

TABLE 2 (3-1)

Figure 42:
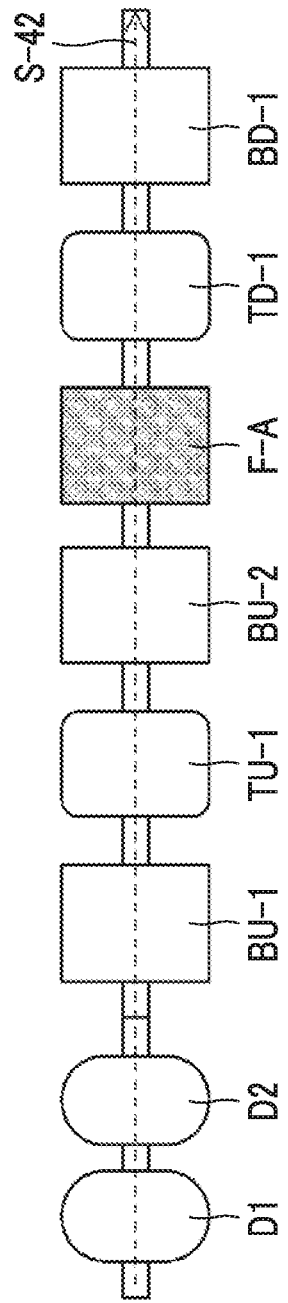
FIG. 42 shows a purification device according to an embodiment of the present invention.
Figure 44:
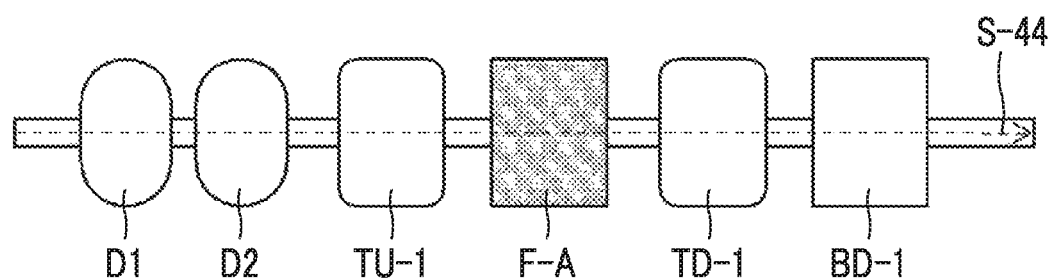
FIG. 44 shows a purification device according to an embodiment of the present invention.

| | Filtering device (Purification device) | Liquid to be purified | | | |
|---|---|---|---|---|---|
| | | Solvent | $\Delta Ps$ | $\Delta Pe$ | $|\Delta Ps - \Delta Pe|$ |
| Chemical liquid 255 | FIG. 27 | nBA | 11.8 | 22.2 | 10.4 |
| Chemical liquid 256 | FIG. 27 | nBA | 11.8 | 22.2 | 10.4 |
| Chemical liquid 257 | FIG. 29 | nBA | 11.8 | 22.2 | 10.4 |
| Chemical liquid 258 | FIG. 29 | nBA | 11.8 | 22.2 | 10.4 |
| Chemical liquid 259 | FIG. 27 | nBA | 11.8 | 22.2 | 10.4 |
| Chemical liquid 260 | FIG. 27 | nBA | 11.8 | 22.2 | 10.4 |
| Chemical liquid 261 | FIG. 27 | nBA | 11.8 | 22.2 | 10.4 |
| Chemical liquid 262 | FIG. 27 | nBA | 11.8 | 22.2 | 10.4 |
| Chemical liquid 263 | FIG. 30 | nBA | 11.8 | 22.2 | 10.4 |
| Chemical liquid 264 | FIG. 31 | nBA | 11.8 | 22.2 | 10.4 |
| Chemical liquid 265 | FIG. 27 | nBA | 11.8 | 22.2 | 10.4 |
| Chemical liquid 266 | FIG. 27 | nBA | 11.8 | 22.2 | 10.4 |
| Chemical liquid 267 | FIG. 32 | nBA | 11.8 | 22.2 | 10.4 |
| Chemical liquid 268 | FIG. 33 | nBA | 11.8 | 22.2 | 10.4 |
| Chemical liquid 269 | FIG. 44 | nBA | 11.8 | 22.2 | 10.4 |
| Chemical liquid 270 | FIG. 27 | nBA | 11.8 | 22.2 | 10.4 |
| Chemical liquid 271 | FIG. 34 | nBA | 11.8 | 22.2 | 10.4 |
| Chemical liquid 274 | FIG. 42 | PGMEA/PC (9:1) | 20.9 | 22.2 | 1.3 |
| Chemical liquid 275 | FIG. 42 | PGMEA/PGME (3:7) | 18.6 | 22.2 | 3.6 |
| Chemical liquid 276 | FIG. 24 | PGMEA | 18.1 | 22.2 | 4.1 |
| Chemical liquid 277 | FIG. 24 | PGMEA | 18.1 | 22.2 | 4.1 |
| Chemical liquid 278 | FIG. 24 | CHN | 26.8 | 22.2 | 4.6 |
| Chemical liquid 279 | FIG. 24 | CHN | 26.8 | 22.2 | 4.6 |
| Chemical liquid 280 | FIG. 24 | nBA | 11.8 | 22.2 | 10.4 |
| Chemical liquid 281 | FIG. 24 | nBA | 11.8 | 22.2 | 10.4 |
| Chemical liquid 282 | FIG. 27 | MIBC | 10.6 | 22.2 | 11.6 |

TABLE 2 (3-2)

| | Pre-washing of filter | Distiller | BU-1 | | BU-2 | |
|---|---|---|---|---|---|---|
| | | | Material component | Pore size (nm) | Material component | Pore size (nm) |
| Chemical liquid 255 | nBA 1 day immersion | Duplex | UPE | 50 | Nylon | 10 |
| Chemical liquid 256 | nBA 1 day immersion | Duplex | UPE | 50 | Nylon | 10 |
| Chemical liquid 257 | nBA 1 day immersion | Duplex | UPE | 50 | Nyr0n | 10 |
| Chemical liquid 258 | nBA 1 day immersion | Duplex | UPE | 50 | Nylon | 10 |
| Chemical liquid 259 | nBA 1 day immersion | Duplex | UPE | 50 | Nydon | 10 |
| Chemical liquid 260 | nBA 1 day immersion | Duplex | PTFE | 20 | Nylon | 10 |

TABLE 2 (3-2)-continued

| | Pre-washing of filter | Distiller | BU-1 Material component | BU-1 Pore size (nm) | BU-2 Material component | BU-2 Pore size (nm) |
|---|---|---|---|---|---|---|
| Chemical liquid 261 | nBA 1 day immersion | Duplex | PP | 200 | Nylon | 10 |
| Chemical liquid 262 | nBA 1 day immersion | Duplex | UPE | 50 | UPE | 10 |
| Chemical liquid 263 | nBA 1 day immersion | Duplex | UPE | 50 | — | — |
| Chemical liquid 264 | nBA 1 day immersion | Duplex | UPE | 50 | Nylon | 10 |
| Chemical liquid 265 | nBA 1 day immersion | Duplex | UPE | 50 | Nylon | 10 |
| Chemical liquid 266 | nBA 1 day immersion | Duplex | UPE | 50 | Nydon | 10 |
| Chemical liquid 267 | nBA 1 day immersion | Duplex | UPE | 50 | IEX | 20 |
| Chemical liquid 268 | nBA 1 day immersion | Duplex | Nylon | 10 | — | — |
| Chemical liquid 269 | nBA 1 day immersion | Duplex | — | — | — | — |
| Chemical liquid 270 | — | Duplex | UPE | 50 | Nylon | 10 |
| Chemical liquid 271 | nBA 1 day immersion | Duplex | UPE | 50 | Nylon | 10 |
| Chemical liquid 274 | PGMEA/PC 7 day immersion | Duplex | UPE | 50 | Nylon | 10 |
| Chemical liquid 275 | PGMEA/PGME 1 day immersion | Duplex | UPE | 50 | Nylon | 10 |
| Chemical liquid 276 | — | — | — | — | — | — |
| Chemical liquid 277 | — | — | — | — | — | — |
| Chemical liquid 278 | — | — | — | — | — | — |
| Chemical liquid 279 | — | — | — | — | — | — |
| Chemical liquid 280 | — | — | — | — | — | — |
| Chemical liquid 281 | — | — | — | — | — | — |
| Chemical liquid 282 | nBA 1 day immersion | Duplex | UPE | 50 | Nylon | 10 |

TABLE 2 (3-3)

| | BU-3 Material component | BU-3 Pore size (nm) | Tank TU-1 | F-A Material component | F-A Pore size (nm) | BD-1 Material component | BD-1 Pore size (nm) |
|---|---|---|---|---|---|---|---|
| Chemical liquid 255 | — | — | Present | Neutral group-grafted UPE1 | 5 | PTFE | 7 |
| Chemical liquid 256 | — | — | Present | Neutral group-grafted UPE2 | 5 | PTFE | 7 |
| Chemical liquid 257 | Nylon | 10 | Present | Neutral group-grafted UPE1 | 5 | PTFE | 7 |
| Chemical liquid 258 | UPE | 10 | Present | Neutral group-grafted UPE1 | 5 | PTFE | 7 |
| Chemical liquid 259 | — | — | Present | Neutral group-grafted UPE1 | 5 | PTFE | 20 |
| Chemical liquid 260 | — | — | Present | Neutral group-grafted UPE1 | 5 | PTFE | 7 |
| Chemical liquid 261 | — | — | Present | Neutral group-grafted UPE1 | 5 | PTFE | 7 |
| Chemical liquid 262 | — | — | Present | Neutral group-grafted UPE1 | 5 | PTFE | 7 |
| Chemical liquid 263 | — | — | Present | Neutral group-grafted UPE1 | 5 | Nylon | 5 |
| Chemical liquid 264 | — | — | Present | Neutral group-grafted UPE1 | 5 | UPE | 1 |
| Chemical liquid 265 | — | — | Present | Neutral group-grafted UPE1 | 5 | UPE | 3 |
| Chemical liquid 266 | — | — | Present | Neutral group-grafted UPE1 | 5 | Nylon | 5 |

TABLE 2 (3-3)-continued

| | BU-3 | | | F-A | | BD-1 | |
|---|---|---|---|---|---|---|---|
| | Material component | Pore size (nm) | Tank TU-1 | Material component | Pore size (nm) | Material component | Pore size (nm) |
| Chemical liquid 267 | Nylon | 10 | Present | Neutral group-grafted UPE1 | 5 | PTFE | 7 |
| Chemical liquid 268 | — | — | Present | Neutral group-grafted UPE1 | 5 | PTFE | 7 |
| Chemical liquid 269 | — | — | Present | Neutral group-grafted UPE1 | 5 | PTFE | 7 |
| Chemical liquid 270 | — | — | Present | Neutral group-grafted UPE1 | 5 | PTFE | 7 |
| Chemical liquid 271 | — | — | Present | Neutral group-grafted UPE1 | 5 | PTFE | 7 |
| Chemical liquid 274 | — | — | Present | Neutral group-grafted UPE1 | 5 | PTFE | 7 |
| Chemical liquid 275 | — | — | Present | Neutral group-grafted UPE1 | 5 | PTFE | 7 |
| Chemical liquid 276 | — | — | — | Neutral group-grafted UPE1 | 5 | — | — |
| Chemical liquid 277 | — | — | — | Neutral group-grafted UPE2 | 5 | — | — |
| Chemical liquid 278 | — | — | — | Neutral group-grafted UPE1 | 5 | — | — |
| Chemical liquid 279 | — | — | — | Neutral group-grafted UPE2 | 5 | — | — |
| Chemical liquid 280 | — | — | — | Neutral group-grafted UPE1 | 5 | — | — |
| Chemical liquid 281 | — | — | — | Neutral group-grafted UPE2 | 5 | — | — |
| Chemical liquid 282 | — | — | Present | Neutral group-grafted UPE2 | 5 | PTFE | 7 |

TABLE 2 (3-4)

| | BD-2 | | | | |
|---|---|---|---|---|---|
| | Material component | Pore size (nm) | Circulation | Tank TD-1 | evaluation method |
| Chemical liquid 255 | — | — | — | Present | Developer |
| Chemical liquid 256 | — | — | — | Present | Developer |
| Chemical liquid 257 | — | — | — | Present | Developer |
| Chemical liquid 258 | — | — | — | Present | Developer |
| Chemical liquid 259 | — | — | — | Present | Developer |
| Chemical liquid 260 | — | — | — | Present | Developer |
| Chemical liquid 261 | — | — | — | Present | Developer |
| Chemical liquid 262 | — | — | — | Present | Developer |
| Chemical liquid 263 | PTFE | 7 | — | Present | Developer |
| Chemical liquid 264 | PTFE | 7 | — | Present | Developer |
| Chemical liquid 265 | — | — | — | Present | Developer |
| Chemical liquid 266 | — | — | — | Present | Developer |
| Chemical liquid 267 | — | — | — | Present | Developer |
| Chemical liquid 268 | — | — | — | Present | Developer |
| Chemical liquid 269 | — | — | — | Present | Developer |
| Chemical liquid 270 | — | — | — | Present | Developer |
| Chemical liquid 271 | — | — | — | — | Developer |
| Chemical liquid 274 | — | — | — | Present | Pre-wetting |
| Chemical liquid 275 | — | — | — | Present | Pre-wetting |
| Chemical liquid 276 | — | — | — | — | Pre-wetting |
| Chemical liquid 277 | — | — | — | — | Pre-wetting |
| Chemical liquid 278 | — | — | — | — | Pre-wetting |
| Chemical liquid 279 | — | — | — | — | Pre-wetting |
| Chemical liquid 280 | — | — | — | — | Developer |
| Chemical liquid 281 | — | — | — | — | Developer |
| Chemical liquid 282 | — | — | — | Present | Rinsing |

TABLE 2 (3-5)

| | Evaluation 1 | | Evaluation 2 | Evaluation 3 | |
|---|---|---|---|---|---|
| | Residue defect inhibition performance | Stain-like defect inhibition performance | Bridge defect inhibition performance | Pattern width uniformity | Evaluation 4 Pot life |
| Chemical liquid 255 | AA | AA | AA | AA | AA |
| Chemical liquid 256 | AA | AA | AA | AA | AA |
| Chemical liquid 257 | AA | AA | AA | AA | AA |

TABLE 2 (3-5)-continued

| | Evaluation 1 | | Evaluation 2 | Evaluation 3 | | |
|---|---|---|---|---|---|---|
| | Residue defect inhibition performance | Stain-like defect inhibition performance | Bridge defect inhibition performance | Pattern width uni- formity | Evaluation 4 Pot life |
| Chemical liquid 258 | AA | AA | AA | AA | AA |
| Chemical liquid 259 | AA | AA | A | AA | AA |
| Chemical liquid 260 | AA | AA | AA | AA | A |
| Chemical liquid 261 | AA | AA | AA | AA | AA |
| Chemical liquid 262 | AA | AA | AA | AA | AA |
| Chemical liquid 263 | AA | AA | AA | AA | AA |
| Chemical liquid 264 | AA | AA | AA | AA | AA |
| Chemical liquid 265 | A | AA | A | AA | AA |
| Chemical liquid 266 | A | AA | A | AA | AA |
| Chemical liquid 267 | AA | AA | AA | AA | AA |
| Chemical liquid 268 | AA | AA | AA | AA | B |
| Chemical liquid 269 | A | AA | AA | AA | C |
| Chemical liquid 270 | B | B | B | AA | AA |
| Chemical liquid 271 | B | AA | B | A | AA |
| Chemical liquid 274 | AA | AA | AA | AA | AA |
| Chemical liquid 275 | AA | AA | AA | AA | AA |
| Chemical liquid 276 | F | F | E | E | Standard |
| Chemical liquid 277 | E | F | D | E | D |
| Chemical liquid 278 | F | F | E | E | D |
| Chemical liquid 279 | E | F | D | E | D |
| Chemical liquid 280 | F | F | E | E | D |
| Chemical liquid 281 | F | F | E | E | D |
| Chemical liquid 282 | AA | AA | AA | AA | AA |

Table 2 is divided into a first group: Table 2 (1-1) to Table 2 (1-5) and a second group: Table 2 (3-1) to Table 2 (3-5).

In the corresponding lines of five tables of each group subdivided from Table 2, the filters included in the filtering device (or the purification device) used for the purifying each chemical liquid and the evaluation results of the obtained chemical liquid are described.

For example, in the first line in Table 2 (1-1) to Table 2 (1-5) as a first group of Table 2, the chemical liquid 200 is described.

The first line shows that the chemical liquid 200 was manufactured by the purification device described in FIG. 25, the liquid to be purified used for manufacturing the chemical liquid 200 contained PGMEA, $\Delta Ps$ was 18.1, $\Delta Pe$ was 22.2, and $|\Delta Ps - \Delta Pe|$ was calculated as 4.1. In addition, the first line shows that the filter of the purification device used for manufacturing the chemical liquid 200 was washed in advance under the condition of "PGMEA 1 day immersion". Furthermore, the first line shows that the purification device has a duplex distiller, BU-1 (UPE-containing filter having a pore size of 50 nm disposed on the uppermost stream side of the flow path), BU-2 (nylon-containing filter having a pore size of 10 nm disposed on the downstream side of BU-1), a tank TU-1 on the upstream side of the filter A (F-A), and a neutral group-grafted UPE1 filter having a pore size of 5 nm as F-A (filter A), and does not have a tank and a filter on the downstream side of the filter F-A. Furthermore, "-" in the first line shows that the circulation filtration was not performed.

The first line also shows that the chemical liquid 200 was evaluated by the "Pre-wetting" method, the residue defect inhibition performance was A, the stain-like defect inhibition performance was B, the bridge defect inhibition performance was A, the pattern width uniformity was A, and the pot life of the filter of the purification device was A.

Likewise, for the chemical liquids 201 to 227, the results are described in the tables of the first group, and for the chemical liquids 228 to 254, the results are described in the tables of the second group. Furthermore, for the chemical liquids 255 to 282, the results are described in each table of the third group.

As is evident from the results shown in Table 2, the chemical liquids 200 to 275, which were purified using the filtering device (purification device) having the filter A and the filter B different from the filter A, had the desired defect inhibition performance. In contrast, the chemical liquids 276 to 281 purified using a filtering device having only the filter A did not have the desired defect inhibition performance.

Furthermore, in a case where a contribution rate of the polarization element in the Hansen solubility parameters of an eluate eluted from the filter A by a predetermined method is $\Delta Pe$, a contribution rate of the polarization element in the Hansen solubility parameters of a substance to be purified is $\Delta Ps$, and the liquid to be purified and the filtering device satisfy the relationship of $|\Delta Ps - \Delta Pe| \leq 10$, specifically, in a case where the filter A is "neutral group-grafted UPE 1", and the liquid to be purified contains PGMEA, compared to the chemical liquid 200, the chemical liquid 205 had higher residue defect inhibition performance, higher stain-like defect inhibition performance, and higher bridge defect inhibition performance. Furthermore, the pot life of the filter was longer.

The above results show that the filtering device (purification device) having the filter A and the filter BD is extremely effective for purifying a liquid to be purified satisfying the relationship of $|\Delta Ps - \Delta Pe| \leq 10$ with the filter A.

In addition, in a case where a contribution rate of the polarization element in the Hansen solubility parameters of an eluate eluted from the filter A by a predetermined method is $\Delta Pe$, a contribution rate of the polarization element in the Hansen solubility parameters of a substance to be purified is $\Delta Ps$, and the liquid to be purified and the filtering device satisfy the relationship of $|\Delta Ps - \Delta Pe| > 10$, specifically, in a case where the filter A is "neutral group-grafted UPE 1", and the liquid to be purified contains nBA, compared to the chemical liquid 269, the chemical liquid 268 had higher residue defect inhibition performance. Furthermore, the pot life of the filter was longer.

The above results show that the filtering device (purification device) having the filter A and the filter BU is extremely effective for purifying a liquid to be purified satisfying the relationship of $|\Delta Ps - \Delta Pe| > 10$ with the filter A.

TABLE 3 (1-1)

Figure 37:
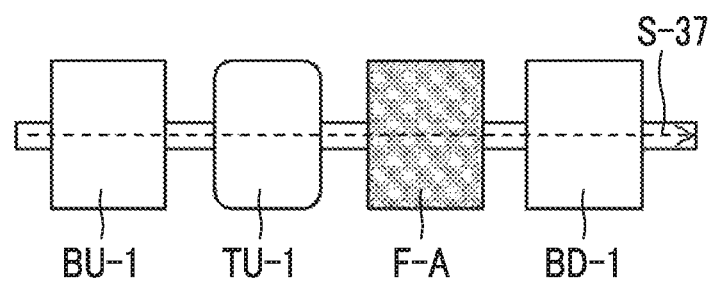
FIG. 37 shows a filtering device according to an embodiment of the present invention.
Figure 39:
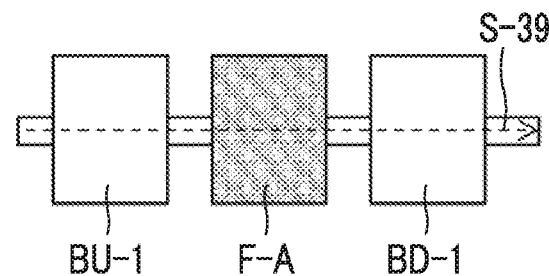
FIG. 39 shows a filtering device according to an embodiment of the present invention.
Figure 43:
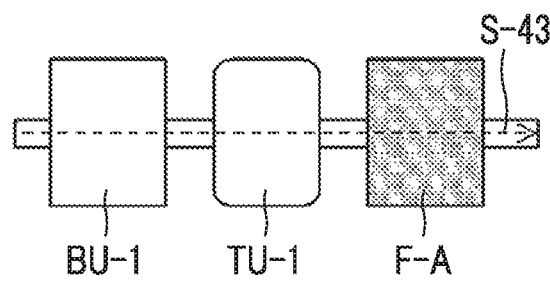
FIG. 43 shows a filtering device according to an embodiment of the present invention.

|  | Filtering device (Purification device) | Liquid to be purified | | | | |
|---|---|---|---|---|---|---|
|  |  | Liquid to be purified | Solvent | $\Delta Ps$ | $\Delta Pe$ | $|\Delta Ps - \Delta Pe|$ |
| Chemical liquid 300 | FIG. 38 | Resist resin composition 2 | PGMEA | 18.1 | 22.2 | 4.1 |
| Chemical liquid 301 | FIG. 24 | Resist resin composition 2 | PGMEA | 18.1 | 22.2 | 4.1 |
| Chemical liquid 302 | FIG. 38 | Resist resin composition 3 | PGMEA | 18.1 | 22.2 | 4.1 |
| Chemical liquid 303 | FIG. 43 | Resist resin composition 3 | PGMEA | 18.1 | 22.2 | 4.1 |
| Chemical liquid 304 | FIG. 37 | Resist resin composition 3 | PGMEA | 18.1 | 22.2 | 4.1 |
| Chemical liquid 305 | FIG. 39 | Resist resin composition 3 | PGMEA | 18.1 | 22.2 | 4.1 |
| Chemical liquid 306 | FIG. 24 | Resist resin composition 3 | PGMEA | 18.1 | 22.2 | 4.1 |
| Chemical liquid 307 | FIG. 38 | Resist resin composition 4 | PGMEA | 18.1 | 22.2 | 4.1 |
| Chemical liquid 308 | FIG. 24 | Resist resin composition 4 | PGMEA | 18.1 | 22.2 | 4.1 |

TABLE 3 (1-2)

|  | Pre-washing of filter | Distiller | BU-1 | | BU-2 | | Tank TU-1 |
|---|---|---|---|---|---|---|---|
|  |  |  | Material component | Pore size (nm) | Material component | Pore size (nm) |  |
| Chemical liquid 300 | PGMEA 1 day immersion | — | UPE | 50 | Nylon | 10 | Present |
| Chemical liquid 301 | PGMEA 1 day immersion | — | — | — | — | — | — |
| Chemical liquid 302 | PGMEA 1 day immersion | — | UPE | 50 | Nylon | 10 | Present |
| Chemical liquid 303 | PGMEA 1 day immersion | — | Nylon | 10 | — | — | Present |
| Chemical liquid 304 | PGMEA 1 day immersion | — | Nylon | 10 | — | — | Present |
| Chemical liquid 305 | PGMEA 1 day immersion | — | UPE | 50 | — | — | — |
| Chemical liquid 306 | PGMEA 1 day immersion | — | — | — | — | — | — |
| Chemical liquid 307 | PGMEA 1 day immersion | — | UPE | 50 | Nylon | 10 | Present |
| Chemical liquid 308 | PGMEA 1 day immersion | — | — | — | — | — | — |

TABLE 3 (1-3)

|  | F-A | | BD-1 | | BD-2 | |
|---|---|---|---|---|---|---|
|  | Material component | Pore size (nm) | Material component | Pore size (nm) | Material component | Pore size (nm) |
| Chemical liquid 300 | Neutral group-grafted UPE1 | 5 | PTFE | 7 | — | — |
| Chemical liquid 301 | Neutral group-grafted UPE1 | 5 | — | — | — | — |
| Chemical liquid 302 | Neutral group-grafted UPE1 | 5 | PTFE | 7 | — | — |
| Chemical liquid 303 | Neutral group-grafted UPE1 | 5 | — | — | — | — |
| Chemical liquid 304 | Neutral group-grafted UPE1 | 5 | PTFE | 7 | — | — |
| Chemical liquid 305 | Neutral group-grafted UPE1 | 5 | PTFE | 7 | — | — |
| Chemical liquid 306 | Neutral group-grafted UPE1 | 5 | — | — | — | — |

TABLE 3 (1-3)-continued

|  | F-A | | BD-1 | | BD-2 | |
| --- | --- | --- | --- | --- | --- | --- |
|  | Material component | Pore size (nm) | Material component | Pore size (nm) | Material component | Pore size (nm) |
| Chemical liquid 307 | Neutral group-grafted UPE1 | 5 | PTFE | 7 | — | — |
| Chemical liquid 308 | Neutral group-grafted UPE1 | 5 | — | — | — | — |

TABLE 3 (1-4)

|  | Tank TU-1 | Circu-lation | Evaluation 1 Bridge defect inhibition performance | Evaluation 2 Post-development defect inhibition performance | Evaluation 3 Pot life |
| --- | --- | --- | --- | --- | --- |
| Chemical liquid 300 | — | — | AA | AA | AA |
| Chemical liquid 301 | — | — | C | C | Standard |
| Chemical liquid 302 | — | — | AA | AA | AA |
| Chemical liquid 303 | — | — | A | AA | A |
| Chemical liquid 304 | — | — | AA | AA | A |
| Chemical liquid 305 | — | — | B | AA | AA |
| Chemical liquid 306 | — | — | C | C | D |
| Chemical liquid 307 | — | — | AA | AA | AA |
| Chemical liquid 308 | — | — | C | C | D |

Table 3 is divided into Table 3(1-1) to Table 3(1-4). In the corresponding lines of the tables subdivided from Table 3, the filtering devices used for purifying the chemical liquids and the obtained evaluation results of chemical liquids are described.

For example, in the first line of each of the subdivision tables, the chemical liquid 300 is described.

The first line shows that the chemical liquid 300 was manufactured by the filtering device illustrated in FIG. 38, and the liquid to be purified used for manufacturing the chemical liquid 300 was the resist resin composition 2. In addition, the first line shows that the filter of the filtering device used for manufacturing the chemical liquid 300 was washed in advance under the condition of "PGMEA 1 day immersion". Furthermore, the first line shows that the filtering device has BU-1 (UPE-containing filter having apore size of 50 nm) and BU-2 (nylon-containing filter having apore size of 10 nm), has a tank TU-1 on the upstream side of the filter F-A and neutral group-grafted UPE 1 having a pore size of 5 nm as F-A (filter A), and has BD-1 (PTFE-containing filter having a pore size of 7 nm) on the downstream side of F-A. Furthermore, "-" in the first line shows that the circulation filtration was not performed.

As is evident from the first line, the chemical liquid 300 was evaluated as AA for the bridge defect inhibition performance, AA for the post-development defect inhibition performance, and AA for the pot life of the filter of the filtering device.

Likewise, for the chemical liquids 301 to 308, the results are described in the above tables.

The chemical liquids 301 to 308 were prepared using the filtering device (purification device) described in the table.

In this case, circulation filtration was not performed. The obtained chemical liquids were evaluated in terms of the items described in the tables. As a result, the chemical liquids 302 to 305 and 307 were found to have excellent defect inhibition performance. Furthermore, it has been confirmed that the chemical liquids 302 to 305 and 307 result in excellent pot life of the filter.

[Manufacturing of Chemical Liquids 283 to 306]

Each of the liquids to be purified described in Table 4 was purified using a purification device (or a filtering device) described in Table 4, thereby obtaining chemical liquids. The purification devices (or filtering devices) are shown in FIGS. 45 to 47. The material components contained in the filters F-A1 and F-A2, the filters BU-1 and BU-2, and the filters BD-1 and BD-2, and the pore sizes of the filters are as shown in Table 4.

The obtained chemical liquids shown in Table 4 were evaluated just as the chemical liquids in Table 2.

Examples of the used filters shown in Table 4 include the filters described above and the following filters.

"Octolex 5 nm", "Octolex 3 nm"

This is a product from Entegris. having a base material constituted with UPE. On the surface of the base material, a resin layer is disposed which contains a resin having a group interacting with ions that do not generate protons. The resin having a group interacting with ions that do not generate protons is based on a nylon (amide or imide) skeleton.

"Purasol SN"

This is a product from Entegris. having a base material constituted with UPE. On the surface of the base material, a resin layer is disposed, and the resin layer contains a resin having an ion exchange group.

"Purasol SP"

This is a product from Entegris. having a base material constituted with UPE. On the surface of the base material, a resin layer is disposed, and the resin layer contains a resin having an ion exchange group.

In the tables which will be described later, the pore sizes of "Purasol SN" and "Purasol SP" are nominal values described in the product catalog.

TABLE 4 (1-1)

|  |  | Liquid to be purified | | | |
| --- | --- | --- | --- | --- | --- |
|  | Filtering device (Purification device) | Solvent | ΔPs | ΔPe | \|ΔPs − ΔPe\| |
| Chemical liquid 283 | FIG. 45 | PGMEA | 18.1 | 22.2 | 4.1 |
| Chemical liquid 284 | FIG. 45 | CHN | 26.8 | 22.2 | 4.6 |
| Chemical liquid 285 | FIG. 45 | nBA | 11.8 | 22.2 | 10.4 |
| Chemical liquid 286 | FIG. 45 | PGMEA/ PC (9:1) | 20.5 | 22.2 | 1.6 |

TABLE 4 (1-1)-continued

| | Liquid to be purified | | | |
|---|---|---|---|---|
| Filtering device (Purification device) | Solvent | ΔPs | ΔPe | \|ΔPs − ΔPe\| |
| Chemical liquid 287 | FIG. 45 | PGMEA/PC (9:1) | 20.5 | 22.2 | 1.6 |
| Chemical liquid 288 | FIG. 45 | PGMEA/PGME (3:7) | 18.6 | 22.2 | 3.6 |
| Chemical liquid 289 | FIG. 45 | PGMEA | 18.1 | 22.2 | 4.1 |
| Chemical liquid 290 | FIG. 45 | CTIN | 26.8 | 22.2 | 4.6 |
| Chemical liquid 291 | FIG. 45 | nBA | 11.8 | 22.2 | 10.4 |
| Chemical liquid 292 | FIG. 45 | PGMEA/PC (9:1) | 20.5 | 22.2 | 1.6 |
| Chemical liquid 293 | FIG. 45 | PGMEA/PC (9:1) | 20.5 | 22.2 | 1.6 |
| Chemical liquid 294 | FIG. 45 | PGMEA/PGME (3:7) | 18.6 | 22.2 | 3.6 |
| Chemical liquid 295 | FIG. 46 | PGMEA | 18.1 | 22.2 | 4.1 |
| Chemical liquid 296 | FIG. 46 | CHN | 26.8 | 22.2 | 4.6 |
| Chemical liquid 297 | FIG. 46 | nBA | 11.8 | 22.2 | 10.4 |
| Chemical liquid 298 | FIG. 46 | PGMEA/PC (9:1) | 20.5 | 22.2 | 1.6 |
| Chemical liquid 299 | FIG. 46 | PGMEA/PC (9:1) | 20.5 | 22.2 | 1.6 |
| Chemical liquid 300 | FIG. 46 | PGMBA/PGME (3:7) | 18.6 | 22.2 | 3.6 |
| Chemical liquid 301 | FIG. 46 | PGMEA | 18.1 | 22.2 | 4.1 |
| Chemical liquid 302 | FIG. 46 | CHN | 26.8 | 22.2 | 4.6 |
| Chemical liquid 303 | FIG. 47 | nBA | 11.8 | 22.2 | 10.4 |
| Chemical liquid 304 | FIG. 47 | PGMEA/PC (9:1) | 20.5 | 22.2 | 1.6 |
| Chemical liquid 305 | FIG. 47 | PGMEA/PC (9:1) | 20.5 | 22.2 | 1.6 |
| Chemical liquid 306 | FIG. 47 | PGMEA/PGME (3:7) | 18.6 | 22.2 | 3.6 |

TABLE 4 (1-2)

| | Pre-washing of filter | Distiller | BU-1 | | BU-2 | |
|---|---|---|---|---|---|---|
| | | | Material component | Pore size (nm) | Material component | Pore size (nm) |
| Chemical liquid 283 | PGMEA 2 weeks immersion | Duplex | UPE | 50 | Nylon | 10 |
| Chemical liquid 284 | CUN 2 weeks immersion | Duplex | UPE | 50 | Nylon | 10 |
| Chemical liquid 285 | nBA 2 weeks immersion | Duplex | UPE | 50 | Nylon | 10 |
| Chemical liquid 286 | PGMEA/PC 2 weeks immersion | Duplex | UPE | 50 | Nylon | 10 |
| Chemical liquid 287 | PGMEA/PC 2 weeks immersion | Duplex | UPE | 50 | Nylon | 10 |
| Chemical liquid 288 | PGMEA/PGME 2 weeks immersion | Duplex | UPE | 50 | Nylon | 10 |
| Chemical liquid 289 | PGMEA 2 weeks immersion | Duplex | UPE | 50 | Nylon | 10 |
| Chemical liquid 290 | CHN 2 weeks immersion | Duplex | UPE | 50 | Nylon | 10 |
| Chemical liquid 291 | nBA 2 weeks immersion | Duplex | UPE | 50 | Nylon | 10 |
| Chemical liquid 292 | PGMEA/PC 2 weeks immersion | Duplex | UPE | 50 | Nylon | 10 |
| Chemical liquid 293 | PGMEA/PC 2 weeks immersion | Duplex | UPE | 50 | Nylon | 10 |
| Chemical liquid 294 | PGMEA/PGME 2 weeks immersion | Duplex | UPE | 50 | Nylon | 10 |
| Chemical liquid 295 | PGMEA 2 weeks immersion | Duplex | UPE | 50 | Nylon | 10 |
| Chemical liquid 296 | CHN 2 weeks immersion | Duplex | UPE | 50 | Nylon | 10 |
| Chemical liquid 297 | nBA 2 weeks immersion | Duplex | UPE | 50 | Nylon | 10 |
| Chemical liquid 298 | PGMEA/PC 2 weeks immersion | Duplex | UPE | 50 | Nylon | 10 |
| Chemical liquid 299 | PGMEA/PC 2 weeks immersion | Duplex | UPE | 50 | Nylon | 10 |
| Chemical liquid 300 | PGMEA/PGME 2 weeks immersion | Duplex | UPE | 50 | Nylon | 10 |
| Chemical liquid 301 | PGMEA 2 weeks immersion | Duplex | UPE | 50 | Nylon | 10 |
| Chemical liquid 302 | CHN 2 weeks immersion | Duplex | UPE | 50 | Nylon | 10 |

TABLE 4 (1-2)-continued

|  | Pre-washing of filter | Distiller | BU-1 Material component | BU-1 Pore size (nm) | BU-2 Material component | BU-2 Pore size (nm) |
|---|---|---|---|---|---|---|
| Chemical liquid 303 | nBA 2 weeks immersion | Duplex | UPE | 50 | Nylon | 10 |
| Chemical liquid 304 | PGMEA/PC 2 weeks immersion | Duplex | UPE | 50 | Nylon | 10 |
| Chemical liquid 305 | PGMEA/PC 2 weeks immersion | Duplex | UPE | 50 | Nylon | 10 |
| Chemical liquid 306 | PGMEA/PGME 2 weeks immersion | Duplex | UPE | 50 | Nylon | 10 |

TABLE 4 (1-3)

|  | F-A1 Material component | F-A1 Pore size (nm) | F-A2 Material component | F-A2 Pore size (nm) |
|---|---|---|---|---|
| Chemical liquid 283 | Octolex 5 nm | 5 | — | — |
| Chemical liquid 284 | Octol x 5 nm | 5 | — | — |
| Chemical liquid 285 | Octolex 5 nm | 5 | — | — |
| Chemical liquid 286 | Octolex 5 nm | 5 | — | — |
| Chemical liquid 287 | Octolex 5 nm | 5 | — | — |
| Chemical liquid 288 | Octolex 5 nm | 5 | — | — |
| Chemical liquid 289 | Octolex 3 nm | 3 | — | — |
| Chemical liquid 290 | Octolex 3 nm | 3 | — | — |
| Chemical liquid 291 | Octolex 3 nm | 3 | — | — |
| Chemical liquid 292 | Octolex 3 nm | 3 | — | — |
| Chemical liquid 293 | Octolex 3 nm | 3 | — | — |
| Chemical liquid 294 | Octolex 3 nm | 3 | — | — |
| Chemical liquid 295 | Purasol SN | 200 (nominal value) | Octolex 3 nm | 3 |
| Chemical liquid 296 | Purasol SN | 200 (nominal value) | Octolex 3 nm | 3 |
| Chemical liquid 297 | Purasol SN | 200 (nominal value) | Octolex 3 nm | 3 |
| Chemical liquid 298 | Purasol SN | 200 (nominal value) | Octolex 3 nm | 3 |
| Chemical liquid 299 | Purasol SN | 200 (nominal value) | Octolex 3 nm | 3 |
| Chemical liquid 300 | Purasol SP | 200 (nominal value) | Octolex 3 nm | 3 |
| Chemical liquid 301 | Purasol SP | 200 (nominal value) | Octolex 3 nm | 3 |
| Chemical liquid 302 | Purasol SP | 200 (nominal value) | Octolex 3 nm | 3 |
| Chemical liquid 303 | Purasol SP | 200 (nominal value) | Octolex 3 nm | 3 |
| Chemical liquid 304 | Purasol SP | 200 (nominal value) | Octolex 3 nm | 3 |
| Chemical liquid 305 | Purasol SP | 200 (nominal value) | Octolex 3 nm | 3 |
| Chemical liquid 306 | Purasol SN | 200 (nominal value) | Octolex 3 nm | 3 |

TABLE 4 (1-4)

|  | BD-1 Material component | BD-1 Pore size (nm) | BD-2 Material component | BD-2 Pore size (nm) |
|---|---|---|---|---|
| Chemical liquid 283 | PTFE | 5 | — | — |
| Chemical liquid 284 | PTFE | 5 | — | — |
| Chemical liquid 285 | PTFE | 5 | — | — |
| Chemical liquid 286 | PTFE | 5 | — | — |
| Chemical liquid 287 | PTFE | 5 | — | — |
| Chemical liquid 288 | PTFE | 5 | — | — |
| Chemical liquid 289 | PTFE | 5 | — | — |
| Chemical liquid 290 | PTFE | 5 | — | — |
| Chemical liquid 291 | PTFE | 5 | — | — |
| Chemical liquid 292 | PTFE | 5 | — | — |
| Chemical liquid 293 | PTFE | 5 | — | — |
| Chemical liquid 294 | PTFE | 5 | — | — |
| Chemical liquid 295 | PTFE | 5 | — | — |
| Chemical liquid 296 | PTFE | 5 | — | — |
| Chemical liquid 297 | PTFE | 5 | — | — |
| Chemical liquid 298 | PTFE | 5 | — | — |
| Chemical liquid 299 | PTFE | 5 | — | — |
| Chemical liquid 300 | PTFE | 5 | — | — |
| Chemical liquid 301 | PTFE | 5 | — | — |
| Chemical liquid 302 | PTFE | 5 | — | — |
| Chemical liquid 303 | PTFE | 5 | PTFE | 5 |
| Chemical liquid 304 | PTFE | 5 | PTFE | 5 |
| Chemical liquid 305 | PTFE | 5 | PTFE | 5 |
| Chemical liquid 306 | PTFE | 5 | PTFE | 5 |

TABLE 4 (1-5)

| | Evaluation method | Evaluation 1 Residue defect inhibition performance | Stain-like defect inhibition performance | Evaluation 2 Bridge defect inhibition performance | Evaluation 3 Pattern width uniformity | Evaluation 4 Pot life |
|---|---|---|---|---|---|---|
| Chemical liquid 283 | Piping washing solution | AA | A | A | AA | AA |
| Chemical liquid 284 | Pre-wetting | AA | A | A | AA | AA |
| Chemical liquid 285 | Developer | AA | A | A | AA | AA |
| Chemical liquid 286 | Pre-wetting | AA | A | A | AA | AA |
| Chemical liquid 287 | Pre-wetting | AA | A | A | AA | AA |
| Chemical liquid 288 | Pre-wetting | AA | A | A | AA | AA |
| Chemical liquid 289 | Piping washing solution | AA | A | A | AA | AA |
| Chemical liquid 290 | Pre-wetting | AA | A | A | AA | AA |
| Chemical liquid 291 | Developer | AA | A | A | AA | AA |
| Chemical liquid 292 | Pre-wetting | AA | A | A | AA | AA |
| Chemical liquid 293 | Pre-wetting | AA | A | A | AA | AA |
| Chemical liquid 294 | Pre-wetting | AA | A | A | AA | AA |
| Chemical liquid 295 | Piping washing solution | AA | AA | A | AA | AA |
| Chemical liquid 296 | Pre-wetting | AA | AA | A | AA | AA |
| Chemical liquid 297 | Developer | AA | AA | A | AA | AA |
| Chemical liquid 298 | Pre-wetting | AA | AA | A | AA | AA |
| Chemical liquid 299 | Pre-wetting | AA | AA | A | AA | AA |
| Chemical liquid 300 | Pre-wetting | AA | AA | A | AA | AA |
| Chemical liquid 301 | Piping washing solution | AA | AA | A | AA | AA |
| Chemical liquid 302 | Pre-wetting | AA | AA | A | AA | AA |
| Chemical liquid 303 | Developer | AA | AA | AA | AA | AA |
| Chemical liquid 304 | Pre-wetting | AA | AA | AA | AA | AA |
| Chemical liquid 305 | Pre-wetting | AA | AA | AA | AA | AA |
| Chemical liquid 306 | Pre-wetting | AA | AA | AA | AA | AA |

Table 4 is divided into Table 4 (1-1) to Table 4 (1-5). In the corresponding lines of the tables subdivided from Table 4, the filtering devices used for purifying the chemical liquids and the obtained evaluation results of chemical liquids are described.

EXPLANATION OF REFERENCES

100, 200, 300, 400, 500, 600, 700: filtering device
101: inlet portion
102: outlet portion
103, 104, 501, 701: filter
105, 402, 403, 502, 503, 602, 603, 702, 703, 704, 805, 806, 201, 301, 401, 1005: piping
601, 802: Tank
803, 903, 1003, 1004: distiller
804: portable tank
807: transporting unit
901, 1001: second inlet portion
902, 1002: second outlet portion

What is claimed is:

1. A filtering device for obtaining a chemical liquid by purifying a liquid to be purified, the filtering device comprising:
  an inlet portion;
  an outlet portion;
  a filter A;
  at least one filter B different from the filter A;
  a flow path which includes the filter A and the filter B arranged in series and extends from the inlet portion to the outlet portion;
  a tank arranged in series with the filter A on the flow path; and
  a return flow path capable of returning the liquid to be purified to an upstream side of the filter A from a downstream side of the filter A on the flow path, wherein the filter A has a porous membrane made of ultra-high-molecular-weight polyethylene and a resin layer disposed to cover at least a portion of a surface of the porous membrane, the resin layer includes a resin having a neutral group or an ion exchange group, the filter B includes at least one filter BU disposed on an upstream side of the filter A on the flow path, and the return flow path is connected to the flow path from the downstream side of the filter A to the downstream side of the tank.

2. The filtering device according to claim 1, wherein the at least one filter BU contains a resin having a second ion exchange group.

3. The filtering device according to claim 1, wherein the resin having a neutral group or an ion exchange group has a group selected from the group consisting of an amide group, an imide group, a carboxamide group, a sulfonamide group, a sulfenamide group, a thioamide group, an amidine group, a carboxamidine group, and a sulfinamidine group.

4. The filtering device according to claim 1, further comprising:
a return flow path capable of returning the liquid to be purified to an upstream side of the filter A from a downstream side of the filter A on the flow path.

5. The filtering device according to claim 1, wherein the filter BD contains at least one selected from the group consisting of polyolefin, polyamide, polyfluorocarbon, polystyrene, polysulfone, and polyethersulfone.

6. The filtering device according to claim 1, further comprising:
a return flow path capable of returning the liquid to be purified to an upstream side of a reference filter from a downstream side of the reference filter,
wherein the reference filter consists of any of the at least one of the filters BD.

7. The filtering device according to claim 1, wherein the at least one filter BD has a pore size less than 10 nm.

8. The filtering device according to claim 1, which is for purifying the liquid to be purified having a Hansen solubility parameter equal to or higher than 10 $(MPa)^{1/2}$ for a hydrogen bond element or for purifying the liquid to be purified having a Hansen solubility parameter less than 10 $(MPa)^{1/2}$ for a hydrogen bond element and having a C log P value equal to or greater than 1.0,
wherein the ion exchange group is a cation exchange group.

9. The filtering device according to claim 1, which is for purifying the liquid to be purified having a Hansen solubility parameter less than 10 $(MPa)^{1/2}$ for a hydrogen bond element and having a C log P value less than 1.0,
wherein the ion exchange group is an anion exchange group.

10. The filtering device according to claim 1, further comprising:
a filter C which is arranged in series with the tank on an upstream side of the tank in the flow path and has a pore size equal to or greater than 20 nm.

11. The filtering device according to claim 1, wherein the chemical liquid is at least one selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat.

12. A purification device comprising:
the filtering device according to claim 1; and
at least one distiller connected to the inlet portion of the filtering device.

13. The purification device according to claim 12, wherein the at least one distiller includes a plurality of distillers connected in series.

14. A method for manufacturing a chemical liquid that is for obtaining a chemical liquid by purifying a liquid to be purified, the method comprising:
a filtration step of purifying the liquid to be purified by using the filtering device according to claim 1 so as to obtain a chemical liquid.

15. The method for manufacturing a chemical liquid according to claim 14, further comprising:
a filter washing step of washing the filter A and the filter B before the filtration step.

16. The method for manufacturing a chemical liquid according to claim 14, further comprising:
a device washing step of washing a liquid contact portion of the filtering device before the filtration step.

17. The filtering device according to claim 1, wherein the pore size of the filter A is less than or equal to 300 nm.

18. A filtering device for manufacturing a chemical liquid for manufacturing a semiconductor substrate by purifying a liquid to be purified, the filtering device comprising:
an inlet portion;
an outlet portion;
a filter A;
at least one filter B different from the filter A;
a tank arranged in series with the filter A;
a return flow path; and
a flow path which includes the filter A and the filter B arranged in series and extends from the inlet portion to the outlet portion,
wherein the filter A has a porous membrane made of ultra-high-molecular-weight polyethylene and a resin layer disposed to cover at least a portion of a surface of the porous membrane,
the resin layer includes a resin having a neutral group or an ion exchange group,
the filter B includes at least one filter BU disposed on an upstream side of the filter A on the flow path, and
the return flow path is connected to the flow path from the downstream side of the filter A to the downstream side of the tank.

19. The filtering device according to claim 18, wherein the pore size of the filter A is less than or equal to 300 nm.

* * * * *